United States Patent
Krishnamohan et al.

(10) Patent No.: US 7,728,387 B1
(45) Date of Patent: Jun. 1, 2010

(54) SEMICONDUCTOR DEVICE WITH HIGH ON CURRENT AND LOW LEAKAGE

(75) Inventors: Tejas Krishnamohan, Palo Alto, CA (US); Krishna Chandra Saraswat, Saratoga, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 92 days.

(21) Appl. No.: 11/761,830

(22) Filed: Jun. 12, 2007

Related U.S. Application Data

(60) Provisional application No. 60/813,221, filed on Jun. 13, 2006.

(51) Int. Cl.
*H01L 31/119* (2006.01)
(52) U.S. Cl. .............. 257/369; 257/217; 257/260; 257/271; 257/E21.632
(58) Field of Classification Search ......... 257/192–195, 257/349, 369, 616
See application file for complete search history.

(56) References Cited

U.S. PATENT DOCUMENTS

| | | | |
|---|---|---|---|
| 2005/0287759 A1* | 12/2005 | Wang et al. | 438/400 |
| 2007/0138565 A1* | 6/2007 | Datta et al. | 257/369 |

* cited by examiner

*Primary Examiner*—Dung A. Le
(74) *Attorney, Agent, or Firm*—Crawford Maunu PLLC

(57) ABSTRACT

Various semiconductor devices and methods of manufacture are employed. According to an example embodiment of the present invention, a MOS-compatible semiconductor device exhibits high channel mobility and low leakage. The device includes a channel region having a high-mobility strained material layer and a tunneling mitigation layer on the strained material layer to mitigate tunnel leakage. The strained material has a lattice structure that is strained to match the lattice structure of the tunneling mitigation layer. An insulator layer is on the tunneling mitigation layer, and an electrode is over the insulator and adapted to apply a voltage bias to the channel region to switch the device between conductive and nonconductive states. Current is transported in the conductive state as predominantly facilitated via the mobility of the strained material layer, and wherein tunneling current in the nonconductive state is mitigated by the tunneling mitigation layer.

14 Claims, 54 Drawing Sheets

SEMICONDUCTOR DEVICE WITH HIGH ON CURRENT AND LOW LEAKAGE

RELATED PATENT DOCUMENTS

This patent document claims the benefit, under 35 U.S.C. §119(e), of U.S. Provisional Patent Application No. 60/813,221, filed Jun. 13, 2006 and entitled: "Semiconductor Device with High On Current and Low Leakage," which is fully incorporated herein by reference.

FIELD OF THE INVENTION

The present invention relates generally to semiconductor devices, and more particularly to arrangements and approaches for facilitating channel mobility with limited current leakage.

BACKGROUND

Semiconductor device applications have experienced significant scaling (reduction in size) over recent years, with continued scaling desirable for a multitude of applications. Often, a reduction in size of semiconductor devices has presented challenges to the performance of such devices. For instance, the drive current is often lower than that required at power-supply voltages for small (e.g., sub-45 nm) nodes. Addressing issues such as the short-channel effect and sub-threshold leakage current often requires tight control of intricate vertical and lateral channel doping profiles, often involving heavy doping, shallow source/drain junctions and ultrathin gate dielectrics. Such approaches to addressing such issues can adversely affect carrier mobility, subthreshold swing and series resistance.

Many semiconductor devices generally exhibit channel regions that are switched by an electrode to facilitate the flow of current. Generally, high mobility in the channel region is desirable for such current flow. In addition, low power consumption and small size have also been desirable for a variety of applications.

High-mobility materials like Germanium, Germanium-rich (Ge-rich) materials, InSb (Indium Antimonide), InAs (Indium Arsenide), strained Germanium and strained Silicon-Germanium materials (e.g., $Si_xGe_{1-x}$) have been considered as desirable for their mobility. However, most higher mobility materials have a significantly small bandgap relative, for example, to Silicon and correspondingly suffer from relatively high tunnel current leakage (e.g., via band-to-band-tunneling, or BTBT) and short-channel effects. Such tunneling current tends to limit the scalability of semiconductor devices.

These and other characteristics have been challenging to the design, manufacture and use of semiconductor devices.

SUMMARY

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

Various embodiments of the present invention are applicable to hetero structure semiconductor devices exhibiting a relatively high mobility channel region and relatively low susceptibility to tunneling, and in some applications, scaled to the sub-15 nm regime.

According to an example embodiment of the present invention, a semiconductor device includes two-layer channel region that facilitates compatibility with an insulator and high mobility. The channel region includes a high-mobility layer and a buffer layer on the high-mobility layer, with the high-mobility layer and the buffer layer having different compositions. The lattice structures of the high-mobility layer and the buffer layer are matched (e.g., with one or both of the high-mobility layer and the buffer layer strained). An insulator layer is formed on the buffer layer, and an electrode is arranged over the insulator and adapted to apply a voltage bias to the channel region to switch the device between ON and OFF states. Generally, the buffer layer facilitates compatibility between the high-mobility layer and the insulator layer by separating the two, while maintaining compatibility between the buffer layer itself and the high-mobility layer via matched lattice structure.

In one implementation, the buffer layer is a thin Silicon layer exhibiting a lattice structure that matches the high-mobility layer. The Silicon layer facilitates integration of the high-mobility layer with MOS-type devices and processes (e.g., as often implemented with silicon-based channel regions). For instance, where the insulator layer is a high-K dielectric (i.e., exhibits a dielectric constant K higher than 3.9), the thin Silicon layer facilitates a compatibility with the high-K dielectric that is generally not present with a high-mobility layer such as Germanium. In this regard, such a device exhibits desirable mobility characteristics associated with high-mobility materials such as Germanium, while being amenable to integration with other arrangements and processes often implemented with a Silicon channel region, such as those involving high-K dielectrics.

According to another example embodiment of the present invention, a MOS-compatible semiconductor device exhibits high channel mobility and low leakage. The device includes a channel region having a high-mobility strained material layer and a tunneling mitigation layer on the strained material layer to mitigate tunnel leakage. The strained material has a lattice structure that is strained to match the lattice structure of the tunneling mitigation layer. An insulator layer is on the tunneling mitigation layer, and an electrode is over the insulator and adapted to apply a voltage bias to the channel region to switch the device between ON and OFF states. Current is transported in the ON state as predominantly facilitated via the mobility of the strained material layer, and wherein tunneling current in the OFF state is mitigated by the tunneling mitigation layer.

According to another example embodiment of the present invention, a CMOS-compatible MOSFET exhibits high channel mobility and low leakage. The MOSFET includes an active channel region having strained Germanium with a lattice structure that matches the lattice structure of Silicon and a thin Silicon layer on the strained semiconductor active region to mitigate leakage current. Source/drain electrodes are coupled via the channel regions. An insulator layer is located on the thin Silicon substrate layer, and gate electrode is located on the insulator. The gate electrode applies a voltage bias to the active region to switch the device between ON and OFF states to flow current between the source/drain electrodes.

According to another example embodiment of the present invention, a CMOS-compatible semiconductor device exhibiting high channel mobility and low leakage is manufactured. An active region is formed having a high-mobility strained material with a lattice structure that is strained to match the lattice structure of Silicon and a high electron mobility relative to Silicon. A thin Silicon layer is formed on the strained semiconductor active region, and an insulator layer is formed on the thin Silicon substrate layer. An electrode is formed over the insulator and adapted to apply a voltage bias to the active region to switch the device between on and off states.

The above overview is not intended to describe each illustrated embodiment or every implementation of the present invention.

BRIEF DESCRIPTION OF THE DRAWINGS

The invention may be more completely understood in consideration of the detailed description of various embodiments of the invention that follows.

Figure 1A:
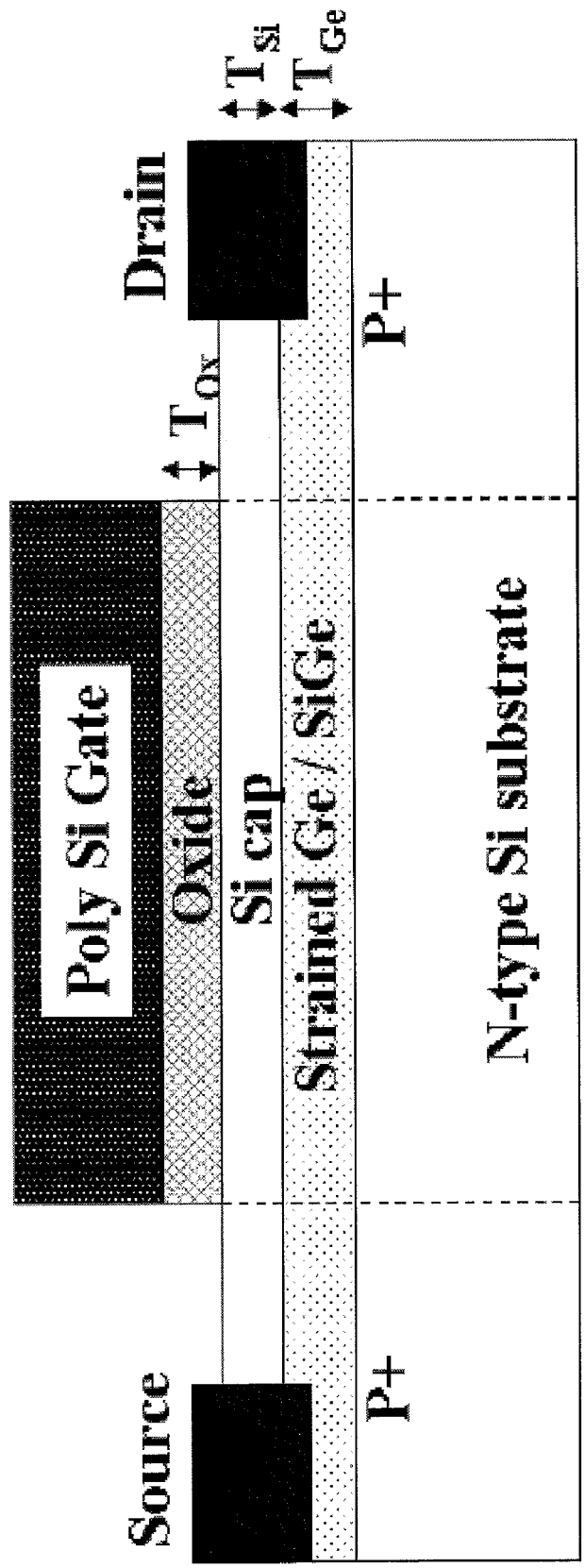
FIGS. 1(a) and (b) respectively show the schematic of a semiconductor device structure and a band diagram for the semiconductor device, according to an example embodiment of the present invention.
Figure 1B:
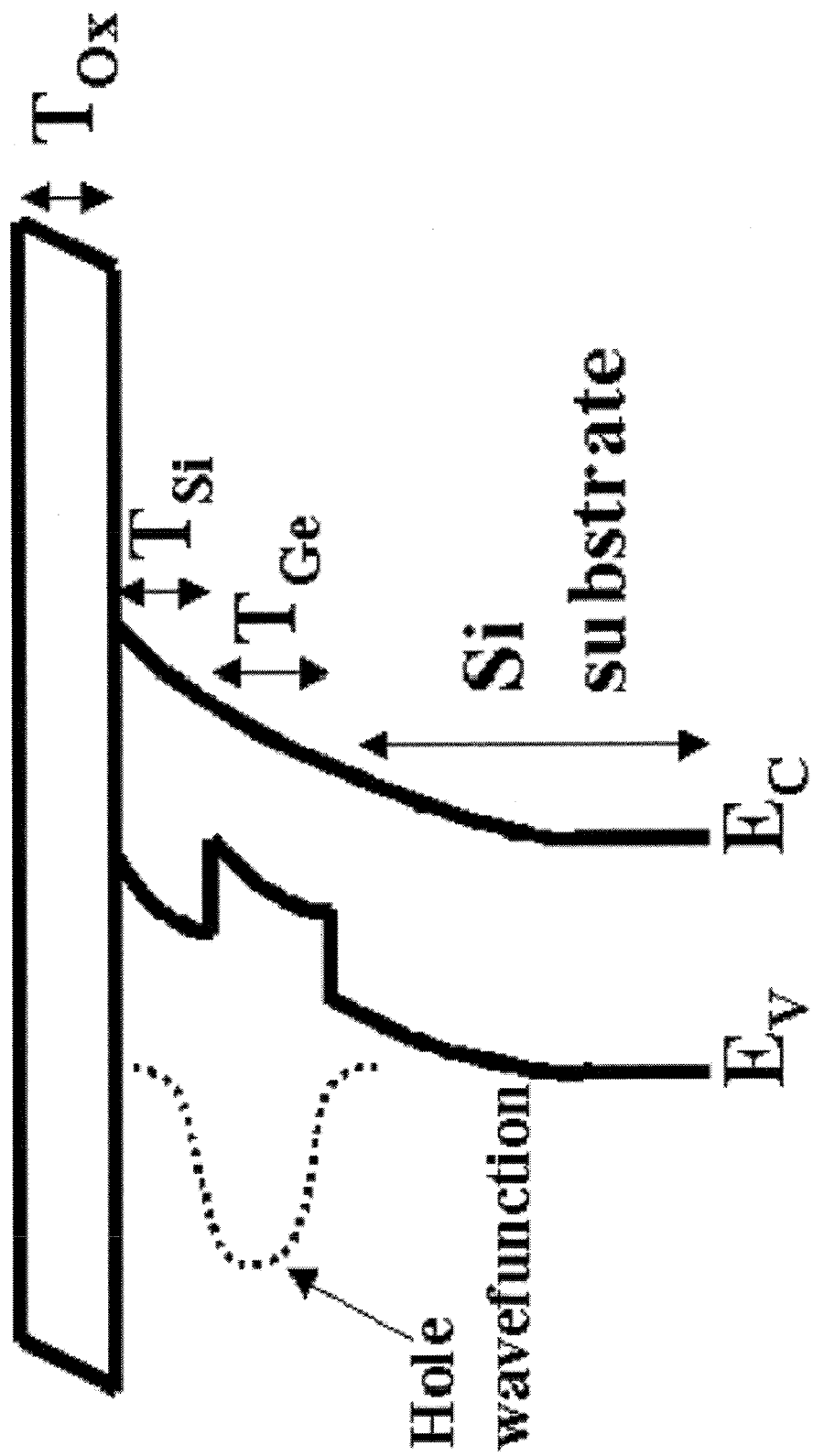

While the invention is amenable to various modifications and alternative forms, examples thereof have been shown by way of example in the drawings and will be described in detail. It should be understood, however, that the intention is not to limit the invention to the particular embodiments shown and/or described. On the contrary, the intention is to cover all modifications, equivalents, and alternatives falling within the spirit and scope of the invention.

DETAILED DESCRIPTION

The present invention is believed to be applicable to a variety of different types of processes, devices and arrangements for passing current in a semiconductor device, and certain aspects have been found to be particularly suited for facilitating relatively high mobility with low leakage current associated with an active channel region of a semiconductor device. While the present invention is not necessarily so limited, various aspects of the invention may be appreciated through a discussion of examples using this context.

In one example embodiment of the present invention, a semiconductor device includes a channel region with a first (lower) layer, a thin buffer layer thereon, and an insulator layer on the thin buffer layer. The lattice structures of the first layer and the buffer layer are matched. In some instances, one or both of the first layer and the buffer layer are strained to facilitate the lattice matching. The buffer layer separates the first layer and the insulator, generally lessening or otherwise mitigating effects associated with an interface of material in the first layer with material in the insulator layer.

According to another example embodiment of the present invention, a semiconductor electronic device includes a channel region having a tunneling mitigation layer on a strained layer, the strained layer exhibiting a lattice structure strained to match that of the tunneling mitigation layer. An electrode is separated from the tunneling mitigation layer by an insulator layer on the tunneling mitigation layer. The tunneling mitigation layer facilitates a reduction in scattering of channel carriers in the strained layer by decoupling carriers from the insulator layer.

In one application, the relative thicknesses of the strained layer and the tunneling mitigation layer are selected to facilitate a desirable channel mobility with desirable mitigation of tunneling current therefrom.

The strained and tunneling mitigation layers include one or more materials selected to facilitate desirable mobility and the mitigation of tunnel leakage. In some applications, the strained layer includes a strained Germanium material, or a III-V semiconductor material such as InAs or InSb in GaAs (Gallium Arsenide).

In connection with another example embodiment of the present invention, it has been discovered that a strained layer having a thickness that is sufficiently small to mitigate defect formation in the strained layer, yet sufficiently large to promote the population of carriers therein desirably facilitates the mobility of carriers therein. In connection with this and/or another example embodiment, it has been discovered that a tunneling mitigation layer having a thickness that is sufficiently large promotes the lowering of the E-field in the strained layer and mitigates tunnel leakage in the strained layer, and if yet sufficiently small, promotes the population of carriers in the strained layer.

In connection with another example embodiment of the present invention, a MOS-type device has a channel region with an ultra-thin, low defect, fully strained Germanium epitaxial layer of about 2 nm in thickness formed on a relaxed Silicon substrate. A Silicon cap layer (e.g., a tunneling mitigation layer) having a thickness of about 4 nm is formed on the Germanium epitaxial layer, and mitigates tunneling current via the Germanium epitaxial layer. In some applications, the MOS-type device exhibits a relatively high mobility of about 3.5× (three and one-half times) the mobility of bulk Silicon devices.

FIGS. 1(a) and (b) respectively show the schematic of a semiconductor device structure and a band diagram for the semiconductor device, according to another example embodiment of the present invention. Strained Germanium (Ge) is epitaxially grown on lightly doped n-type bulk Silicon (Si) substrate and capped with a thin Si layer. The Si cap is then oxidized at a relatively low temperature (e.g., about 800° C.) to mitigate and/or prevent relaxation of the strained Ge film. In this context, the thin Si layer may be implemented as the tunneling mitigation layer in the above examples, with the epitaxially-grown strained Ge as the strained layer. Moreover, the thickness of each of the Strained Ge and Si cap layers are selected for each particular application, and in many embodiments, exhibit relative thicknesses that are different than that shown in FIG. 1(a).

An insulator layer, shown in FIG. 1(a) as an oxide, is formed on the Si cap. In some applications, the insulator layer is a high-K dielectric, with the Si cap acting as a buffer to facilitate compatibility of the dielectric with the strained layer.

Figure 2:
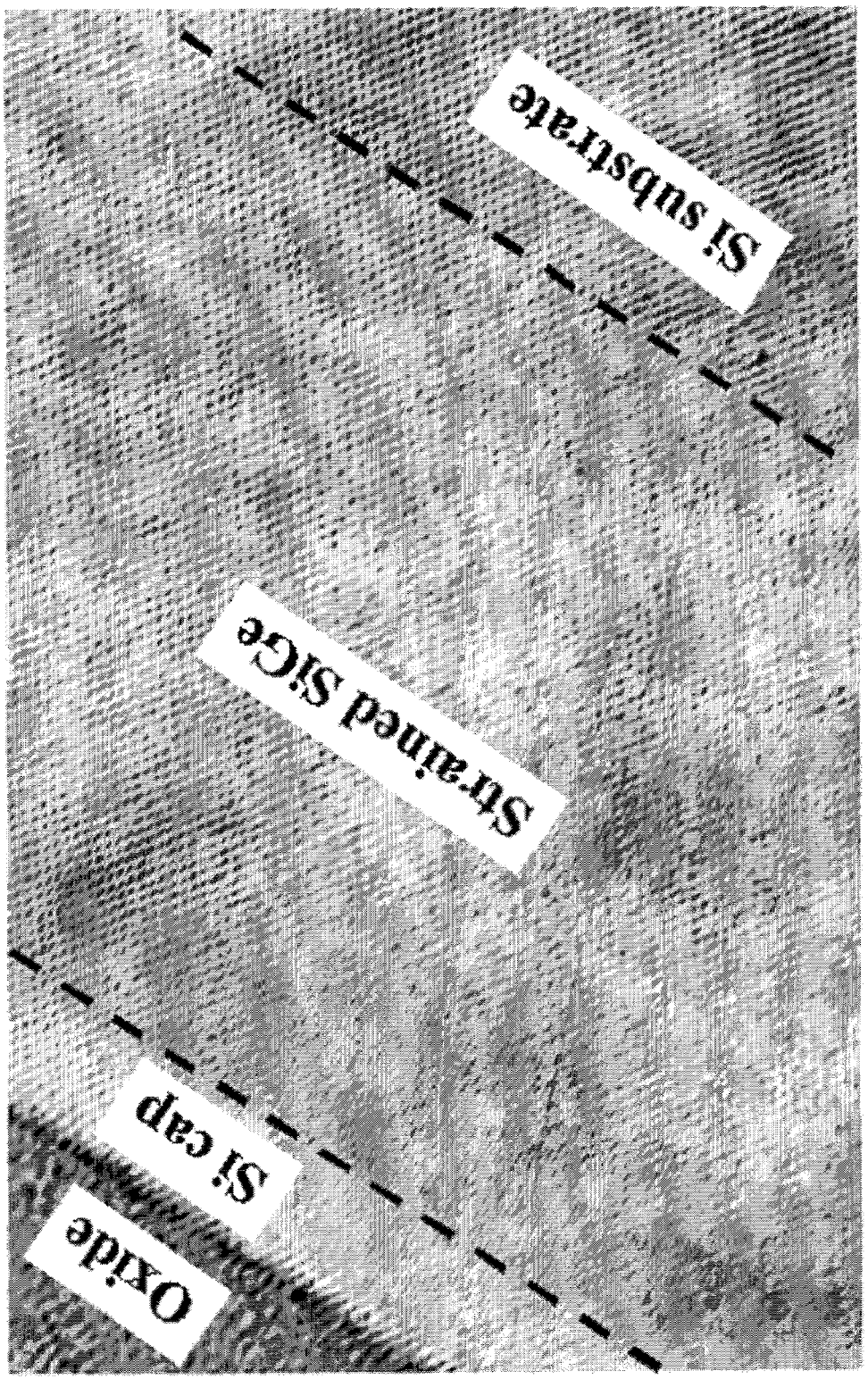
FIG. 2 shows a cross-sectional Transmission electron microscopy (TEM) of different defect-free layers for an example semiconductor structure, similar to that shown in FIG. 1(a), in connection with another example embodiment of the present invention.

FIG. 2 shows a cross-sectional Transmission electron microscopy (TEM) of different defect-free layers for an example semiconductor structure, similar to that shown in FIG. 1(a), in connection with another example embodiment of the present invention.

In various applications, several splits are evaluated in the design and manufacture of a semiconductor device as described herein. For instance, one application is directed to the variation of the Si capping layer thickness, Ge percentage in the channel region and the strained Ge thickness to observe performance effects such as those related to tunneling current and carrier mobility. Table 1 shows different design splits in accordance with one such embodiment. The Si capping layer thickness ($T_{Si}$ cap) is varied from 0 nm-8 nm, the Ge thickness ($T_{Ge}$) is varied from 6 nm-2 nm and two types of devices with different Ge fractions, 50% and 100%, are fabricated.

TABLE 1

| Device | $T_{Ge\ Channel}$ | Ge % | $T_{Si\ Cap}$ |
|---|---|---|---|
| 1 | 6 nm | 50% | 0 nm |
| 2 | 6 nm | 50% | 4 nm |
| 3 | 6 nm | 50% | 6 nm |
| 4 | 6 nm | 50% | 8 nm |
| 5 | 4 nm | 100% | 4 nm |
| 6 | 2 nm | 100% | 4 nm |
| 7 | | Silicon Control | |

Figure 3:
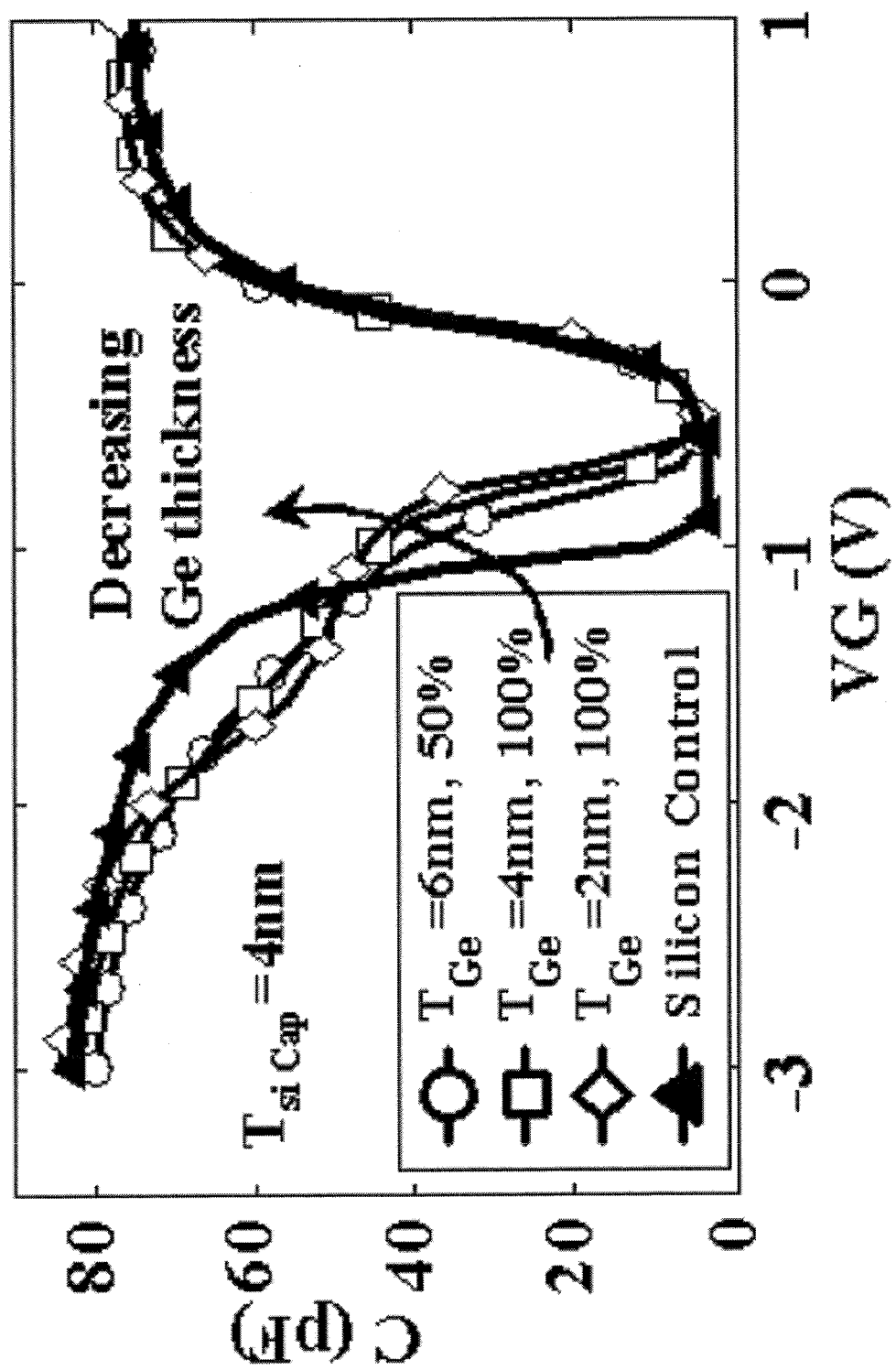
FIG. 3 shows C-Vs for strained Ge-channel, according to an example embodiment of the present invention.

FIG. 3 shows C-Vs for strained Ge-channel devices such as those characterized in Table 1. The threshold voltage ($V_{th}$) decreases due to the band offset between control Si and strained-Ge. Further, a characteristic hump in the C-V curve shows the onset of inversion in the Si cap (4 nm). In the embodiment shown with a 4 nm strained Ge layer, the layer is close to the critical thickness and partially relaxes during gate oxidation, leading to defect formation in the Ge channel and Si cap.

Figure 4:
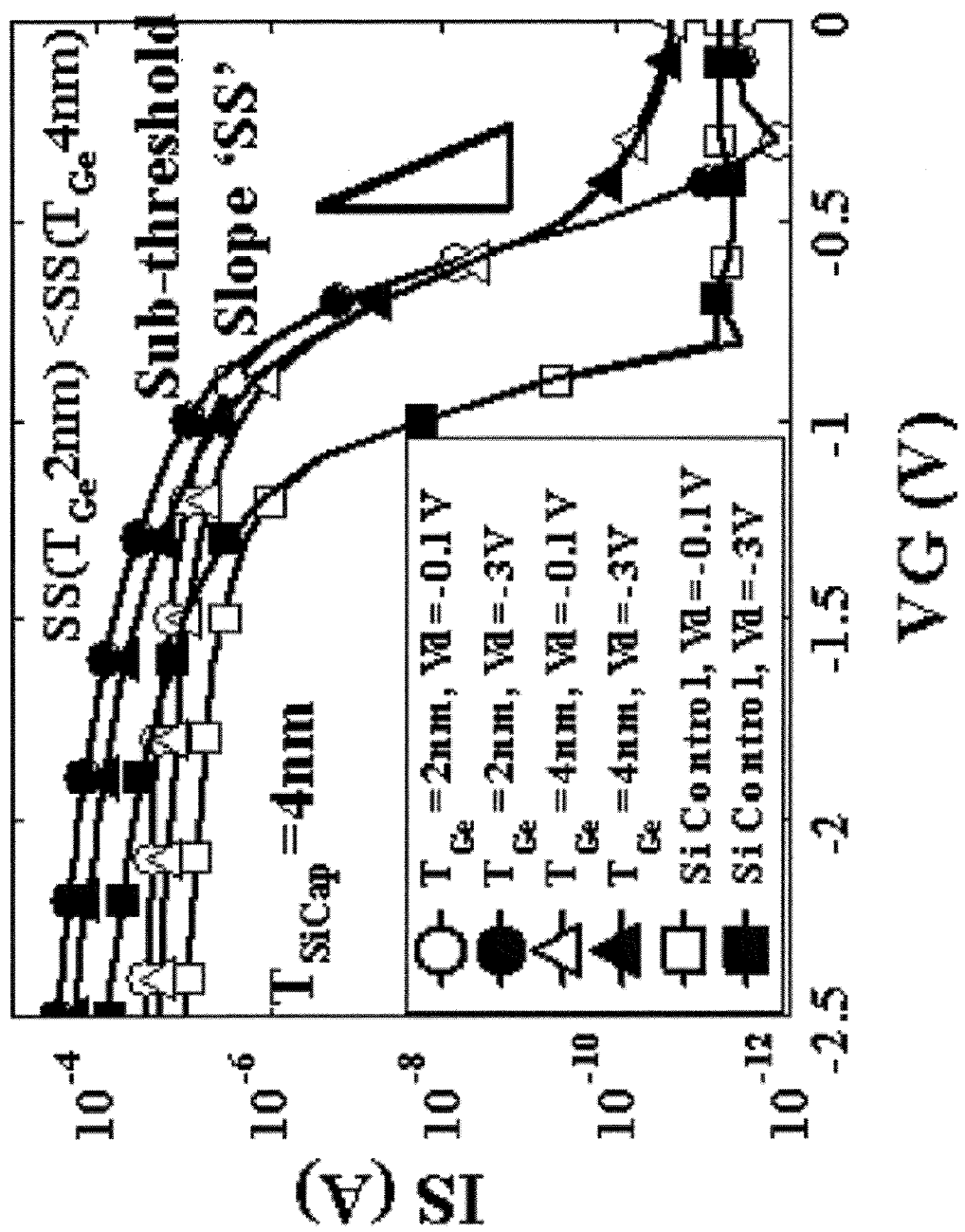
FIG. 4 shows Id-Vg (drain current and gate voltage) for strained Ge-channel devices, according to an example embodiment of the present invention.

FIG. 4 shows Id-Vg (drain current and gate voltage) for strained Ge-channel devices such as those characterized in Table 1. The sub-threshold slope for 4 nm strained Ge device is slightly higher (e.g., about 90 mV/dec) compared to 2 nm strained Ge (e.g., about 68 mV/dec) and the Si control (65 mV/dec). The 2 nm strained Ge device shows excellent sub-threshold slope facilitated by the ultra-thin channel, which is fully strained and defect-free.

Figure 5:
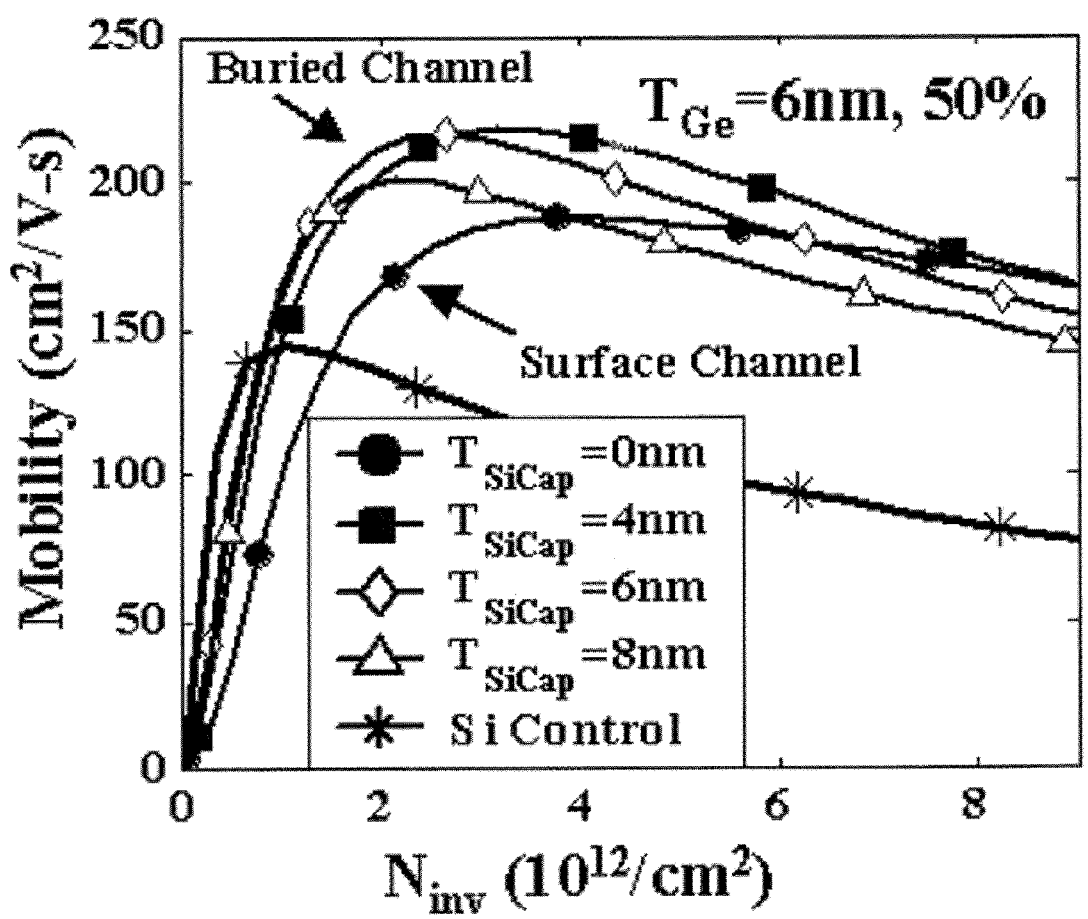
FIG. 5 shows mobility enhancement for devices as compared to a control Si, according to an example embodiment of the present invention.
Figure 6:
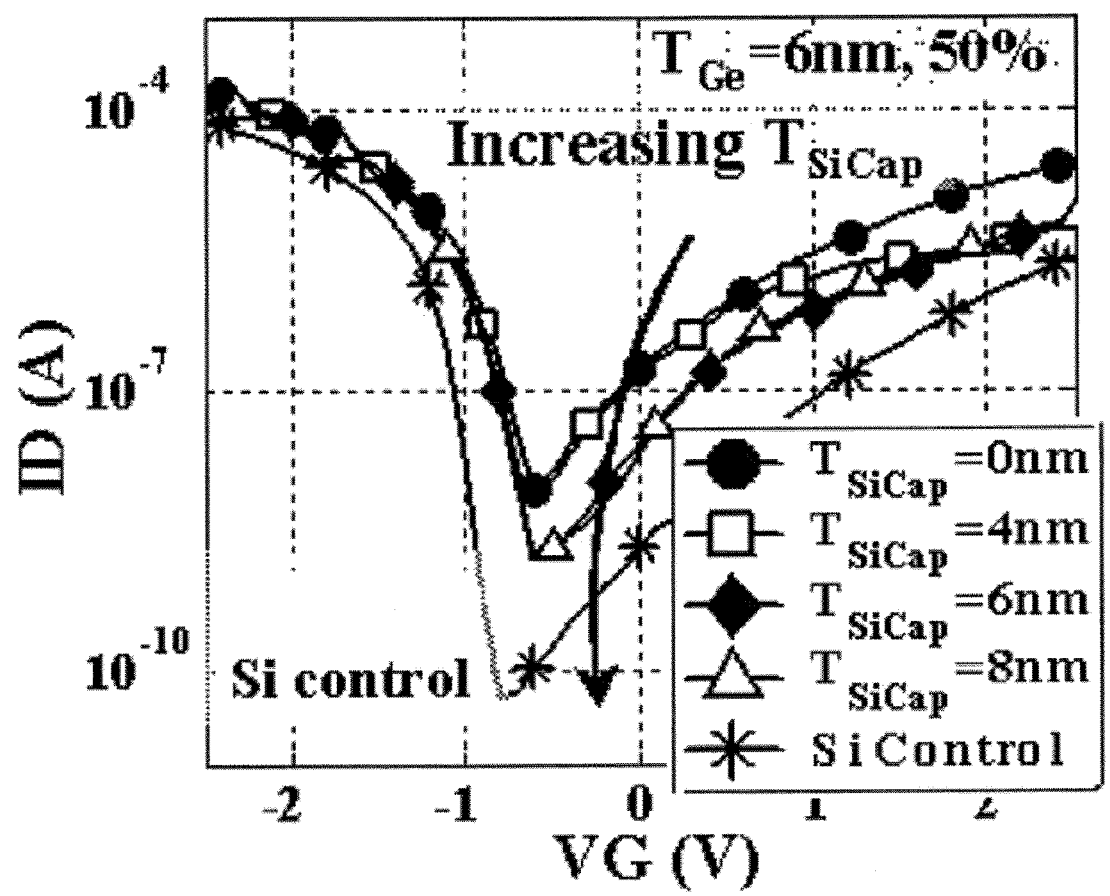
FIG. 6 shows BTBT for devices in relation to the $T_{Si}$ cap, according to an example embodiment of the present invention.
Figure 7:
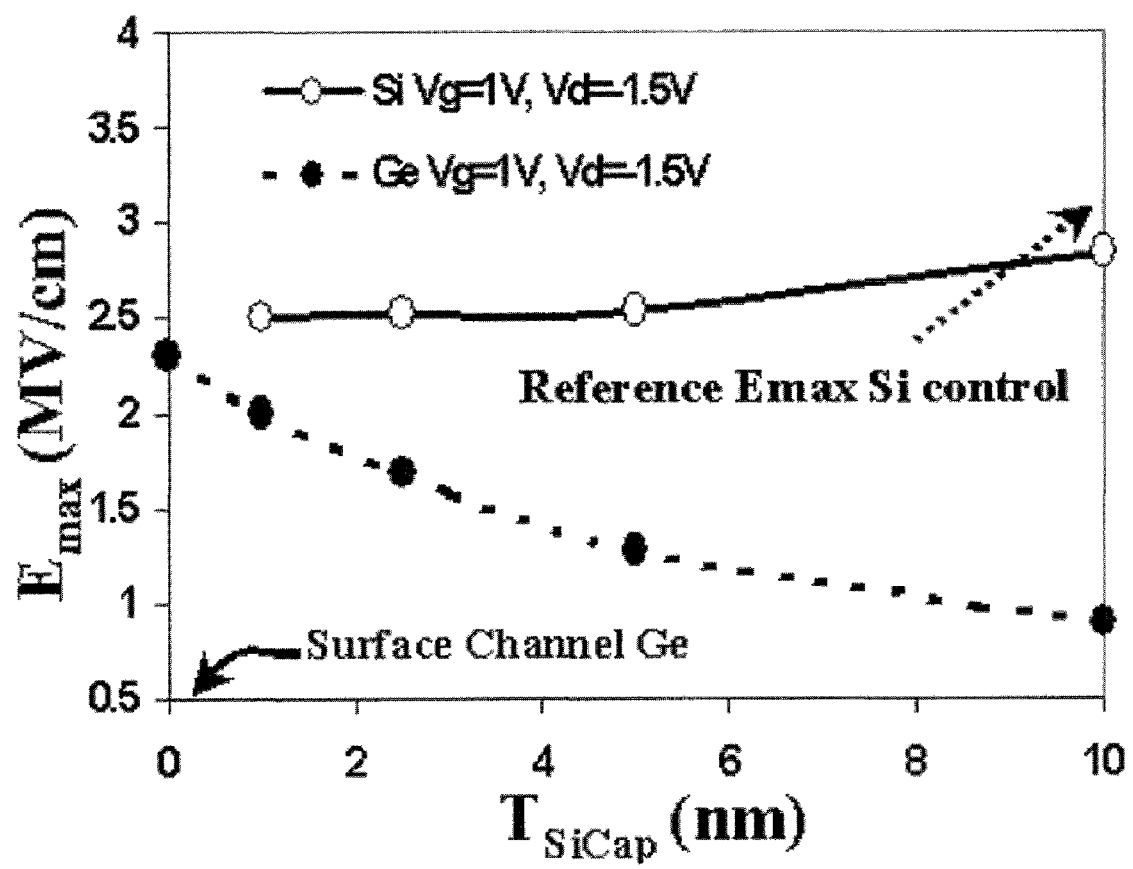
FIG. 7 shows the E-field in the Si cap and GE channel, according to an example embodiment of the present invention.
Figure 8:
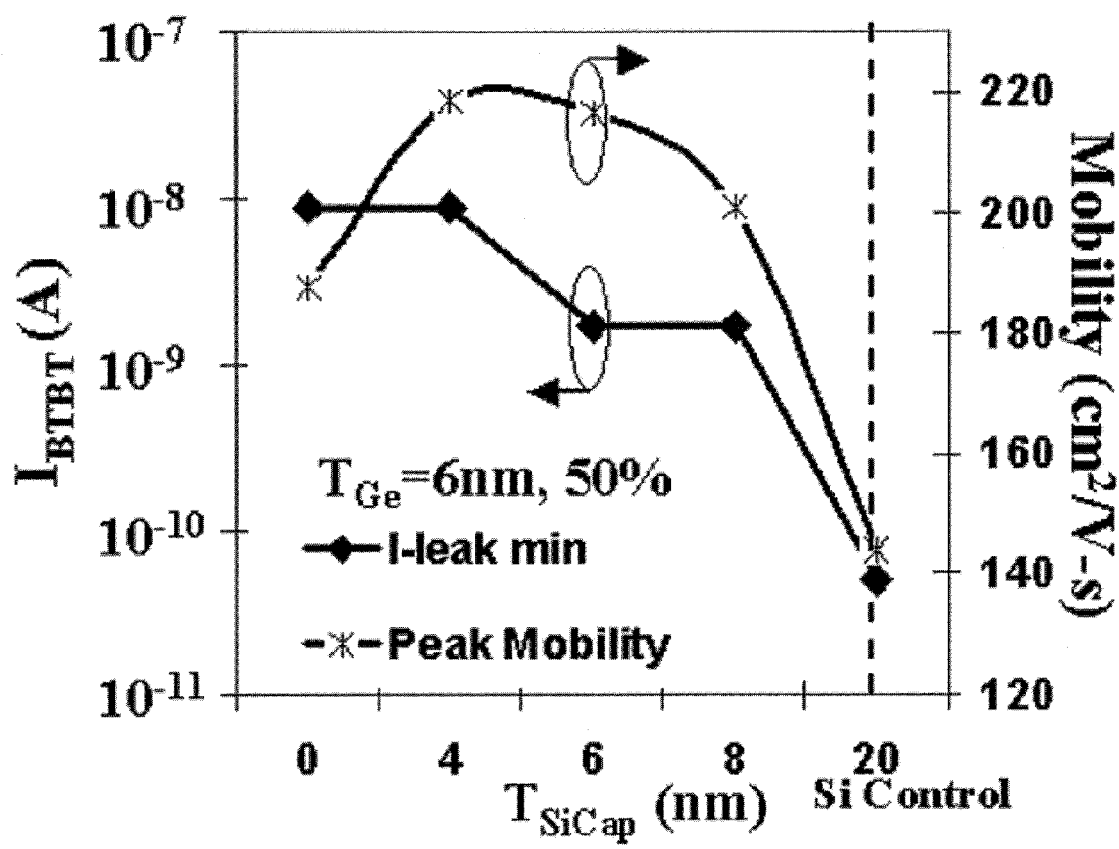
FIG. 8 shows the BTBT and mobility in relation to the $T_{Si}$ cap, according to an example embodiment of the present invention.

In some applications, the effect of the $T_{Si}$, cap (or any appropriate tunneling mitigation layer) on the mobility of the strained Ge layer is analyzed in connection with another example embodiment. For instance, such analysis may include a comparison of the devices #1, #2, #3 and #4 in Table 1, where $T_{Si}$, cap is varied from 0 nm (i.e., a surface channel) to 8 nm on a 6 nm, 50%, strained-SiGe epitaxial layer. The mobility enhancement for these devices is, for example, about 65% as compared to the control Si (referring, e.g., to FIG. 5). Decreasing the thickness of the $T_{Si}$ cap leads to lower mobility at low because of Coulombic scattering by increased interface states. As the $T_{Si}$ cap is made thicker, the overall mobility reduces due to a greater fraction of the hole populating the Si surface compared to the Ge buried in the channel. In regard to the BTBT (band-to-band-tunneling) in these devices, increasing the $T_{Si}$, cap beyond 4 nm may reduce the BTBT by greater than about ten times (as shown, e.g., in FIG. 6). BTBT, as facilitated by the E-field in the smaller bandgap, strained-Ge, is decreased by over 50% compared to the surface channel device. The E-field in the Si cap is also slightly lower than the bulk Si control as shown, for example, in FIG. 7. Using these approaches, and in connection with an example embodiment as shown in FIG. 8, one particular semiconductor device is formed having a $T_{Si}$ cap of around 4-6 nm, which balances with a desirable mobility for BTBT.

Figure 9:
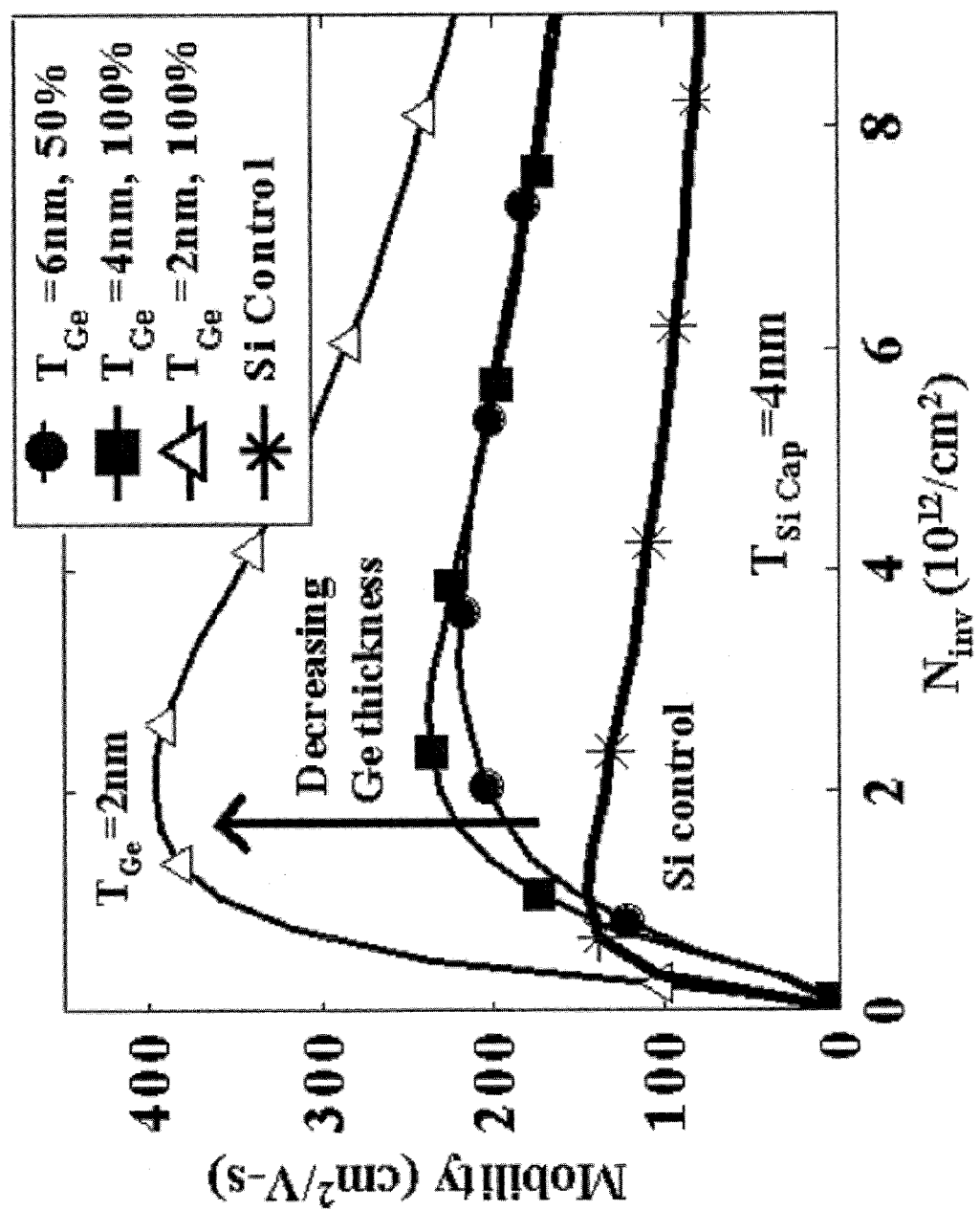
FIG. 9 shows mobility and inversion carrier density ($N_{inv}$) in relation to $T_{Ge}$, according to an example embodiment of the present invention.
Figure 10:
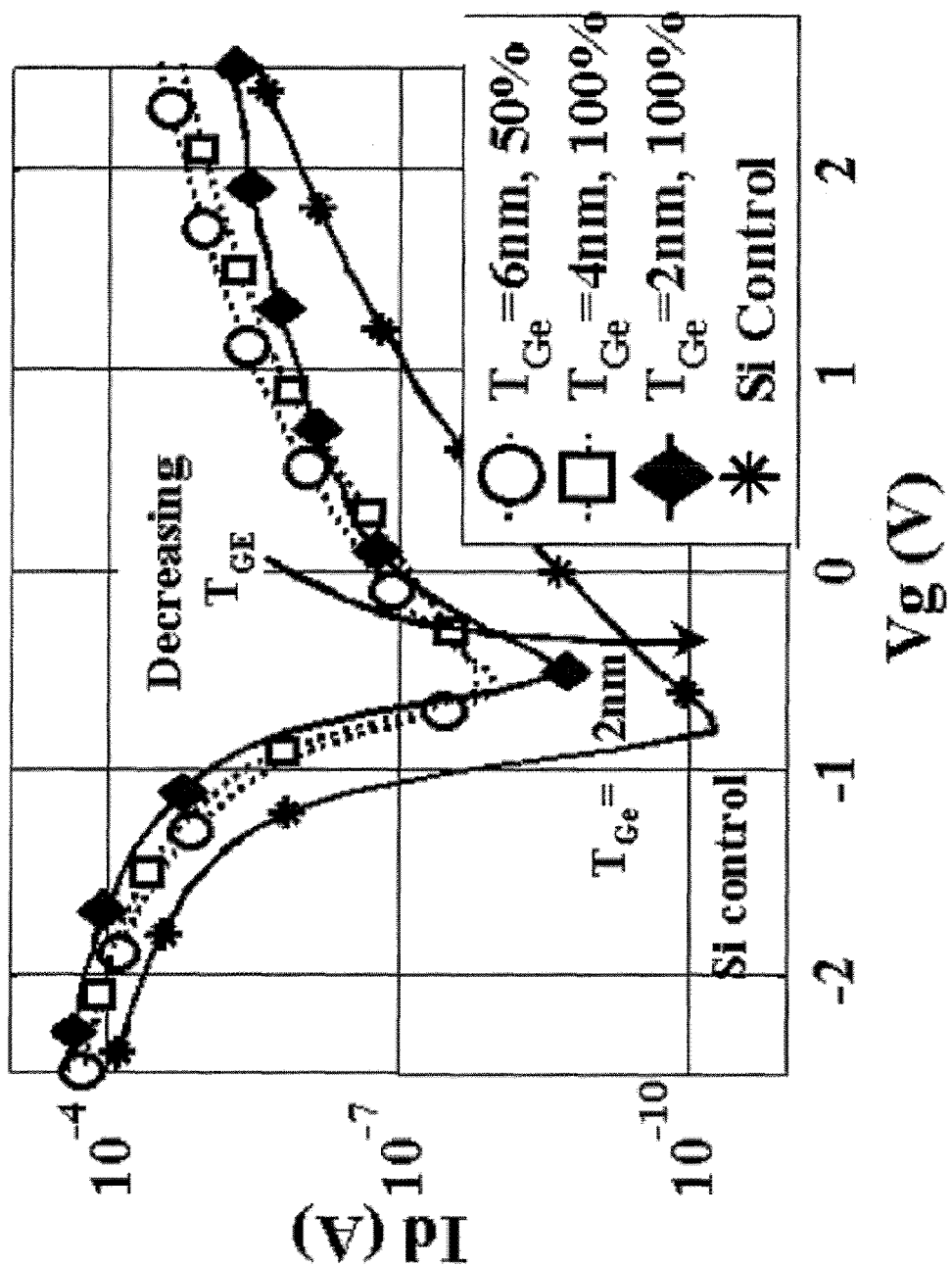
FIG. 10 shows BTBT and mobility in relation to $T_{Ge}$ according to an example embodiment of the present invention.

In another embodiment, devices #2, #5 and #6 are compared to see the effect of $T_{Ge}$ and Ge fraction on the mobility and BTBT. In connection with this example embodiment, it has been discovered that the mobility for the 2 nm Ge is much higher (e.g., about 2×) than the 4 nm and 6 nm Ge applications. The relatively smaller thickness of the 2 nm Ge mitigates the tendency of thicker Ge to partially relax, which causes defects in the channel. The peak mobility for the 2 nm case is greater than about 3.5× the peak mobility of bulk Si (shown, e.g., in FIG. 9). Also, the BTBT for the ultra-thin, 2 nm, strained-Ge is about 10× lower than thicker Ge applications (e.g., as shown in FIG. 10).

Figure 11:
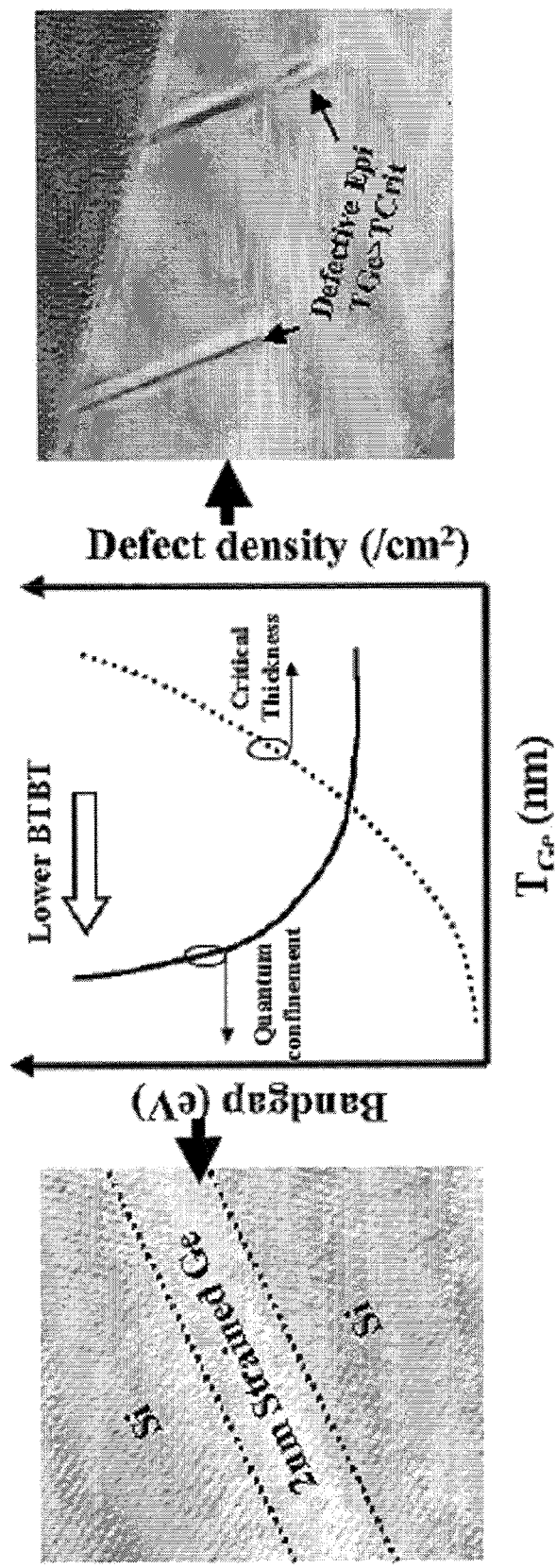
FIG. 11 shows BTBT in relation to several factors, according to an example embodiment of the present invention.
Figure 12:
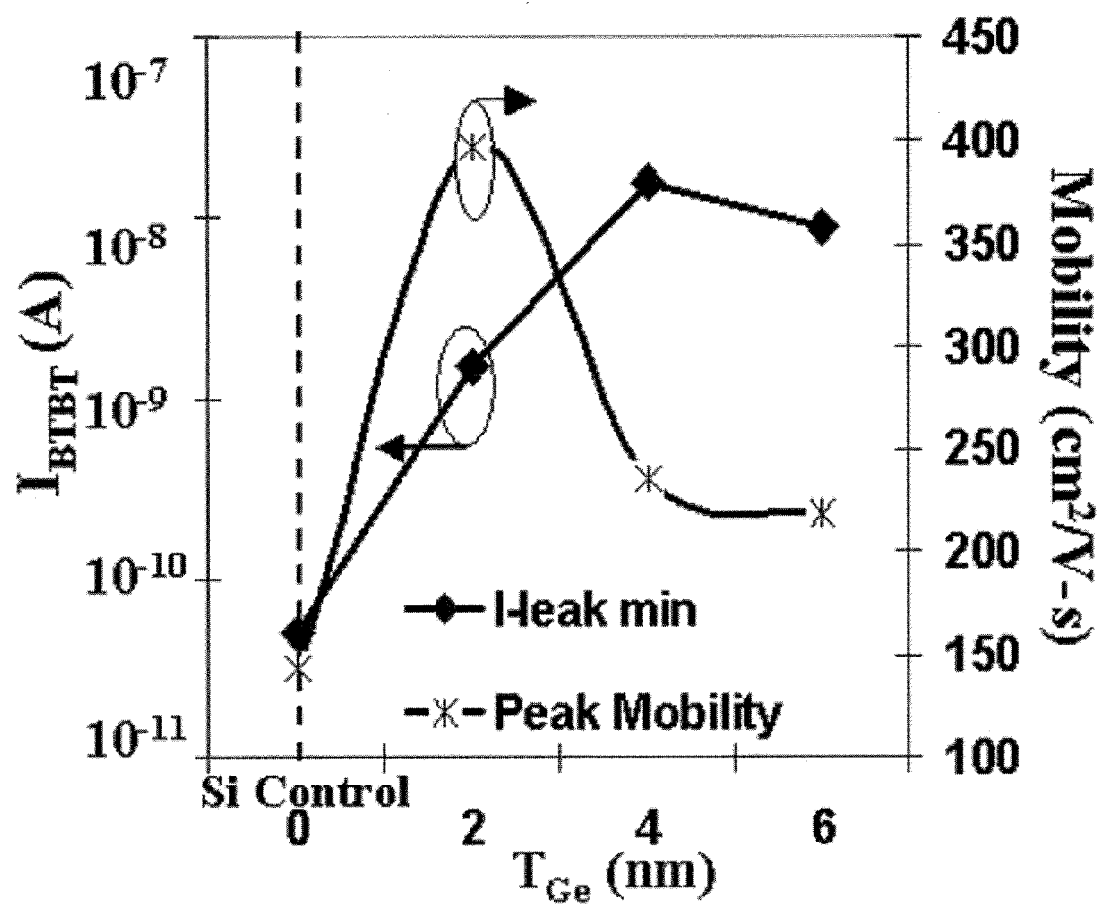
FIG. 12 shows BTBT and mobility in relation to a peak mobility of 2 nm for a $T_{Ge}$ channel, according to an example embodiment of the present invention.

Certain desirable conditions discussed in the preceding paragraph are represented in FIG. 11 and in FIG. 12, with the effective bandgap of the strained-Ge increased as $T_{Ge}$ is reduced (e.g., due to quantum mechanical confinement between the two Si barriers of underlying Silicon substrate and the Si cap). This higher effective bandgap decreases the probability for BTBT to occur and reduces the leakage. In addition, the channel region is more strongly immune to partial relaxation of the strain as $T_{Ge}$ is decreased, which can produce defects that allow trap-assisted tunneling to increase significantly.

As discussed above, various approaches are used to select and implement a strained layer with a tunneling mitigation layer of relative thickness to facilitate desirable mobility and mitigate leakage. The following discussion addresses such approaches as applicable to one or more example embodiments of the present invention.

Figure 13:
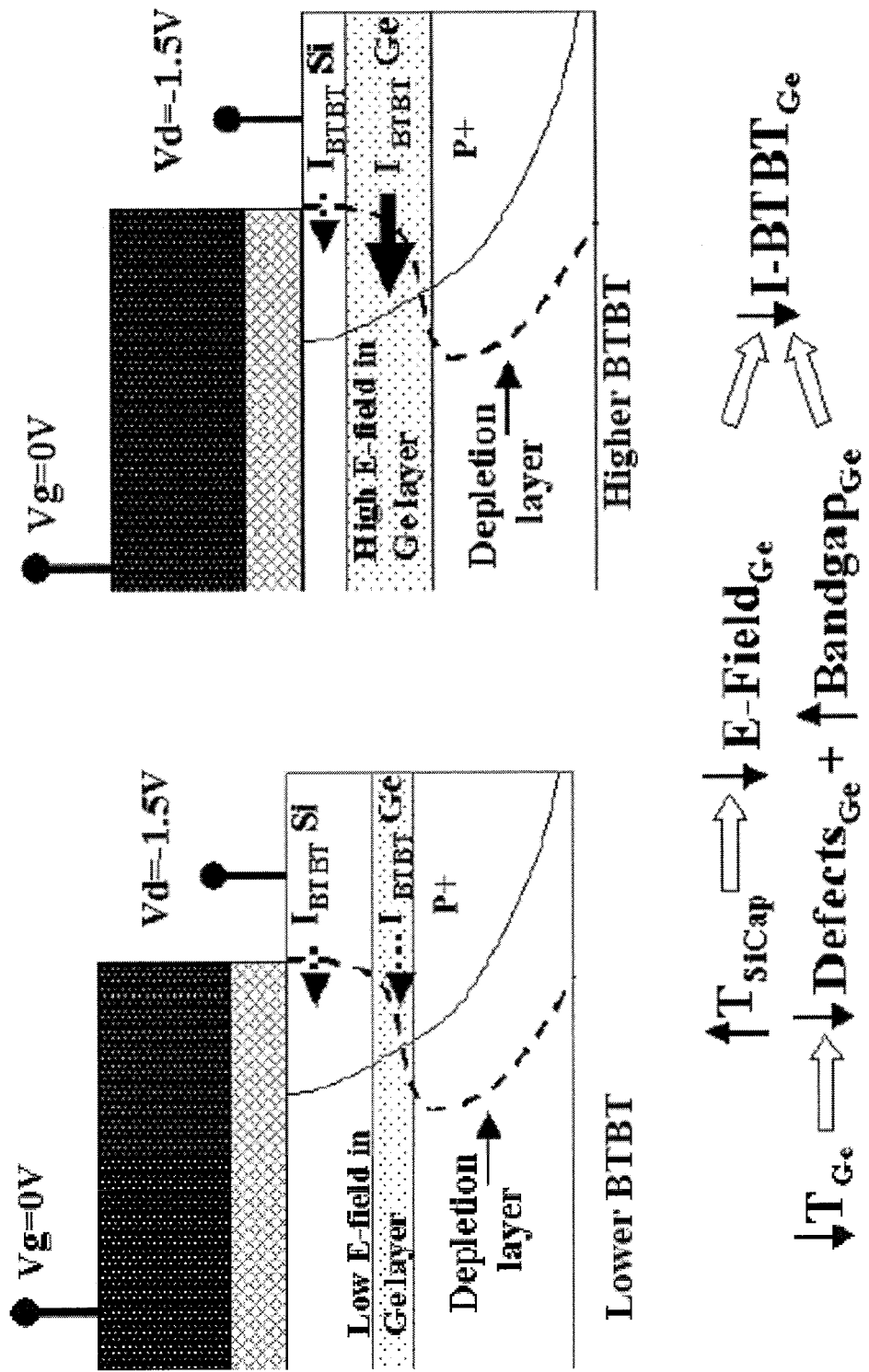
FIG. 13 shows a relationship between BTBT leakage and the E-field, according to an example embodiment of the present invention.
Figure 14:
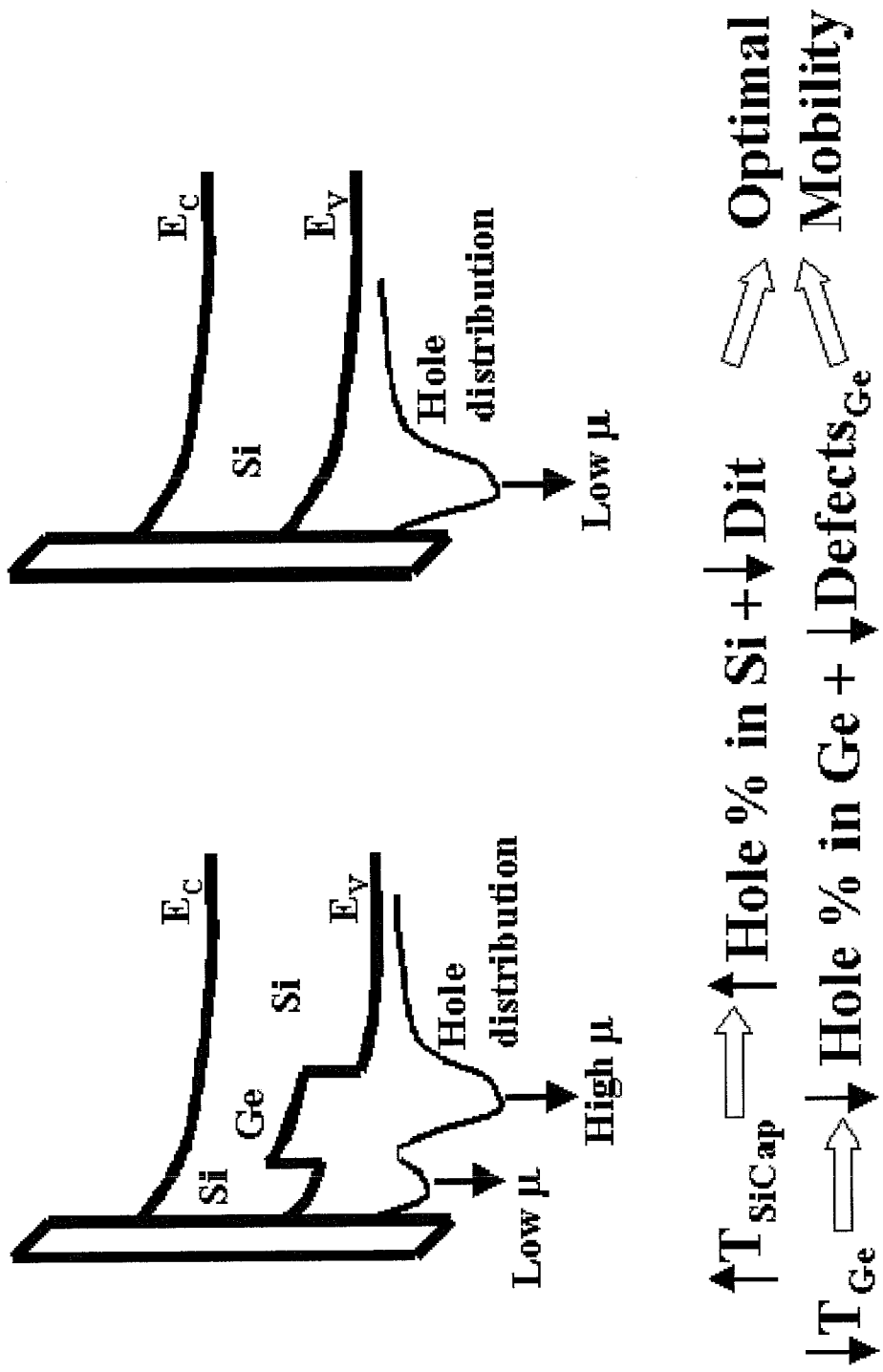
FIG. 14 shows a relationship between thickness of the $T_{Si}$ cap, $T_{Ge}$ channel thickness and mobility, according to an example embodiment of the present invention.

In one application, tradeoffs in terms of lower BTBT leakage and higher mobility are analyzed. FIG. 13 and FIG. 14 together show the parameters involved in designing a high-mobility device with low BTBT in connection with certain embodiments. A combination of a thicker Si cap and an ultra-thin high-mobility channel material is a very effective way to lower the BTBT leakage. The thicker cap lowers the E-field in the high-mobility channel; the ultra-thin channel has a lower defect density and a larger effective bandgap.

By increasing the $T_{Si}$ cap, the scattering of the channel carriers by interface states is reduced, as is the population of the carriers in the higher mobility channel. These two effects are in opposite directions (i.e., relative to goals of high-carrier mobility with low leakage) and are used to select a cap layer thickness relative to desirable mobility. Further, as ultra-thin high-mobility channels are implemented, the defects in the channel due to strain relaxation are reduced but the population of carriers in the high-mobility region also reduces. These two effects are used to select a desirable channel thickness for higher mobility.

Figure 15A:
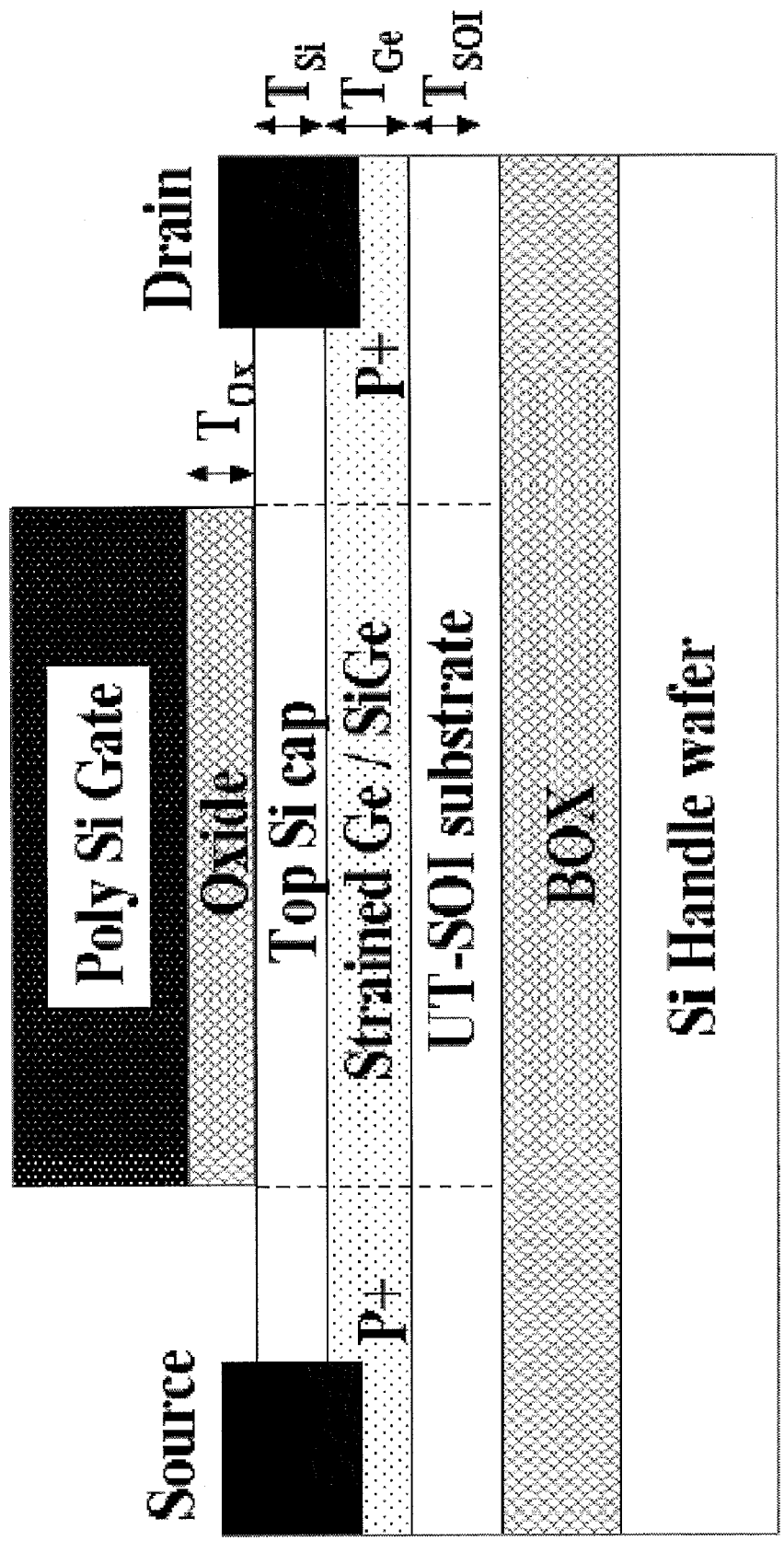
FIGS. 15(a) and (b) show a schematic of a strained-SiGe on SOI device structure that was fabricated according to an example embodiment of the present invention.
Figure 15B:
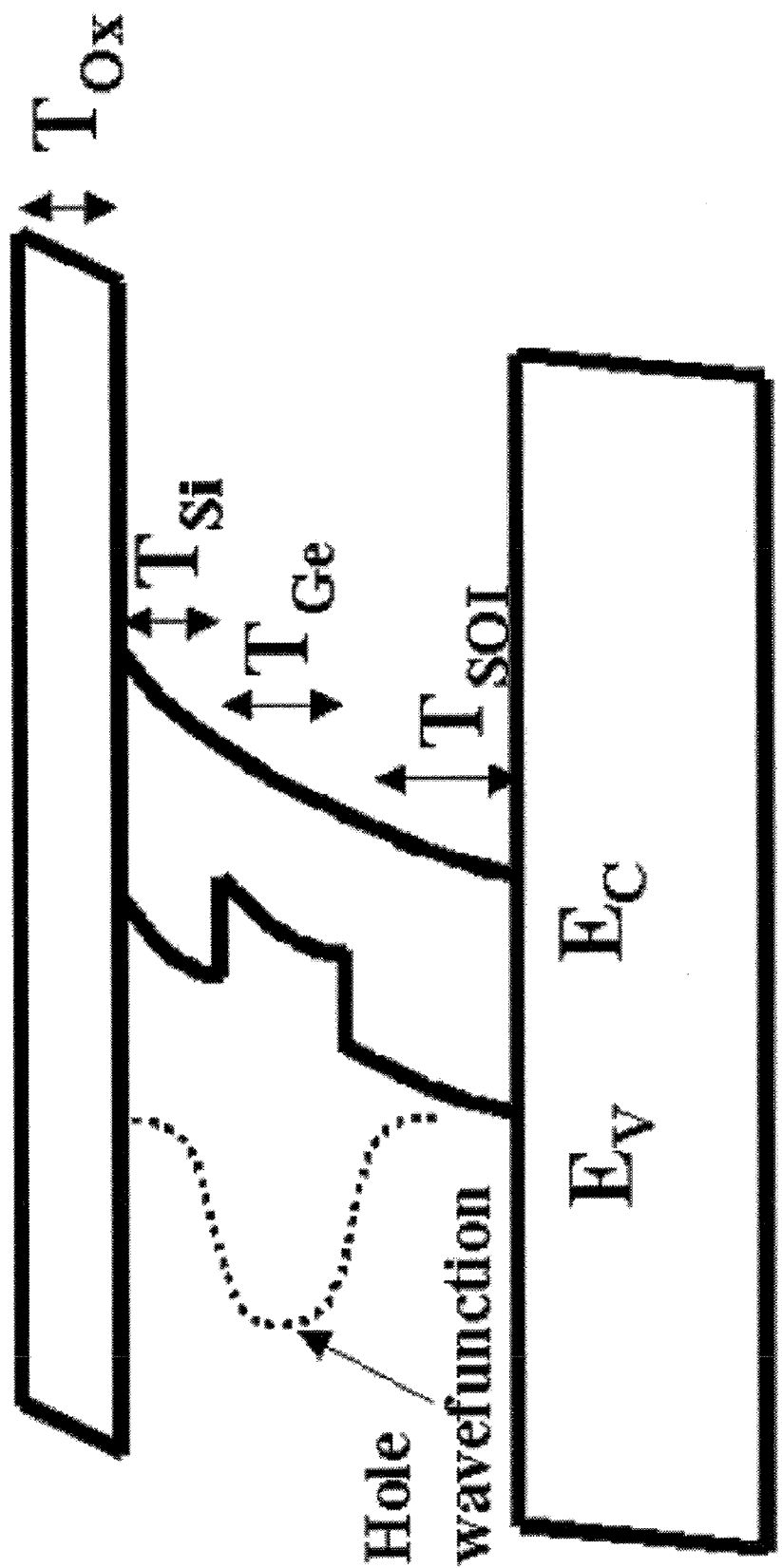
Figure 17:
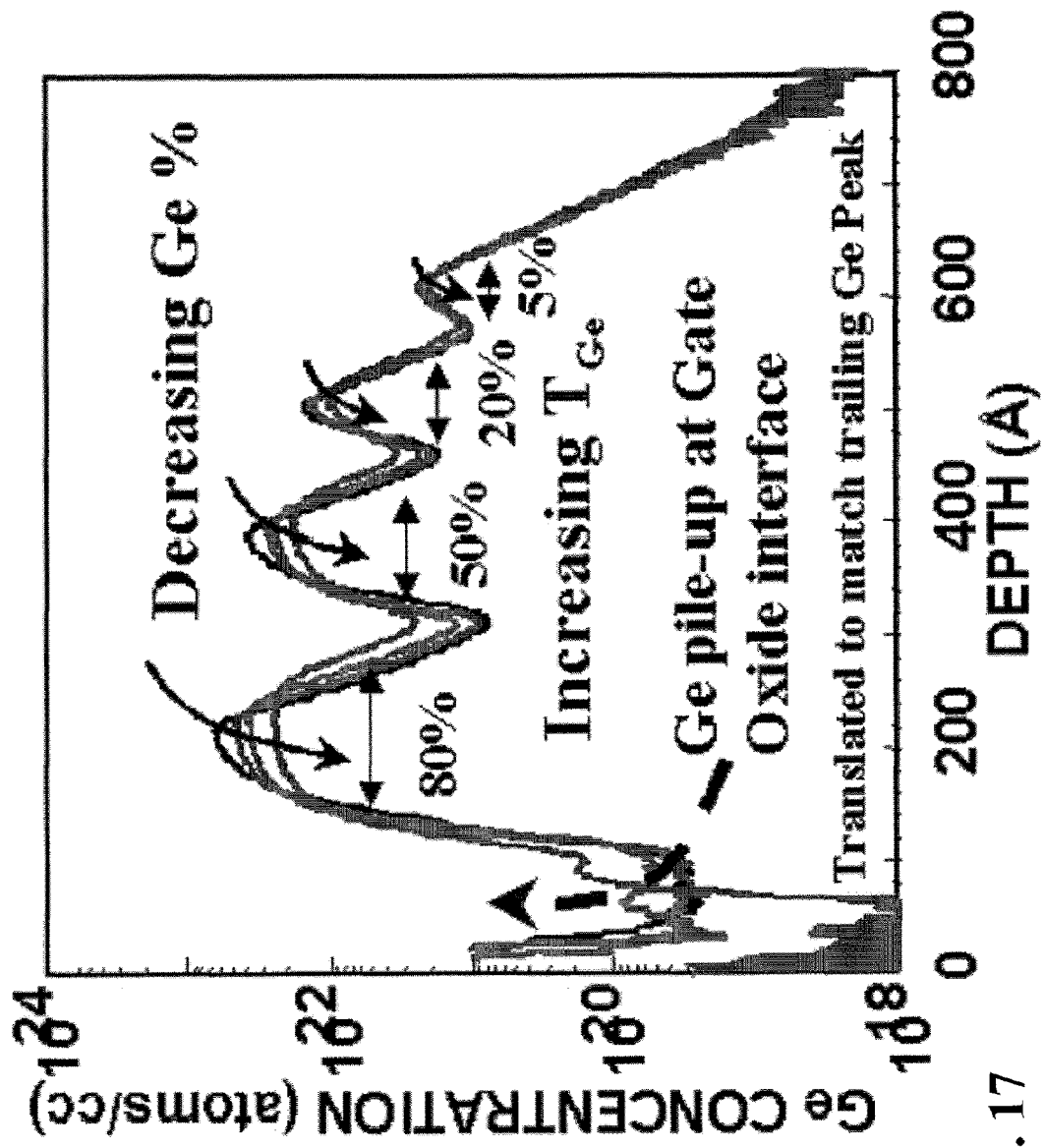
FIG. 17 shows SIMS profile of a Si/SiGe superlattice, according to an example embodiment of the present invention.

Various example embodiments are also directed to one or more of the following approaches. FIGS. 15(a) and (b) show the schematic and band structure of a strained-SiGe on SOI device structure that was fabricated, according to one embodiment of the invention. Highly strained SiGe (80%) may be epitaxially grown on 9 nm SOI wafers and capped with a thin (3 nm) Si layer. FIG. 17 shows Secondary Ion Mass Spectrometry (SIMS) data taken on a stack of Si/SiGe layers with varying Ge percentage in the SiGe layers. During gate thermal oxidation, as seen in FIG. 17, Ge can rapidly diffuse from the high Ge percentage regions into the Si, lowering the Ge percentage, increasing the Ge pile up at the SiO2 interface and creating defects due to relaxation of the film.

Figure 16:
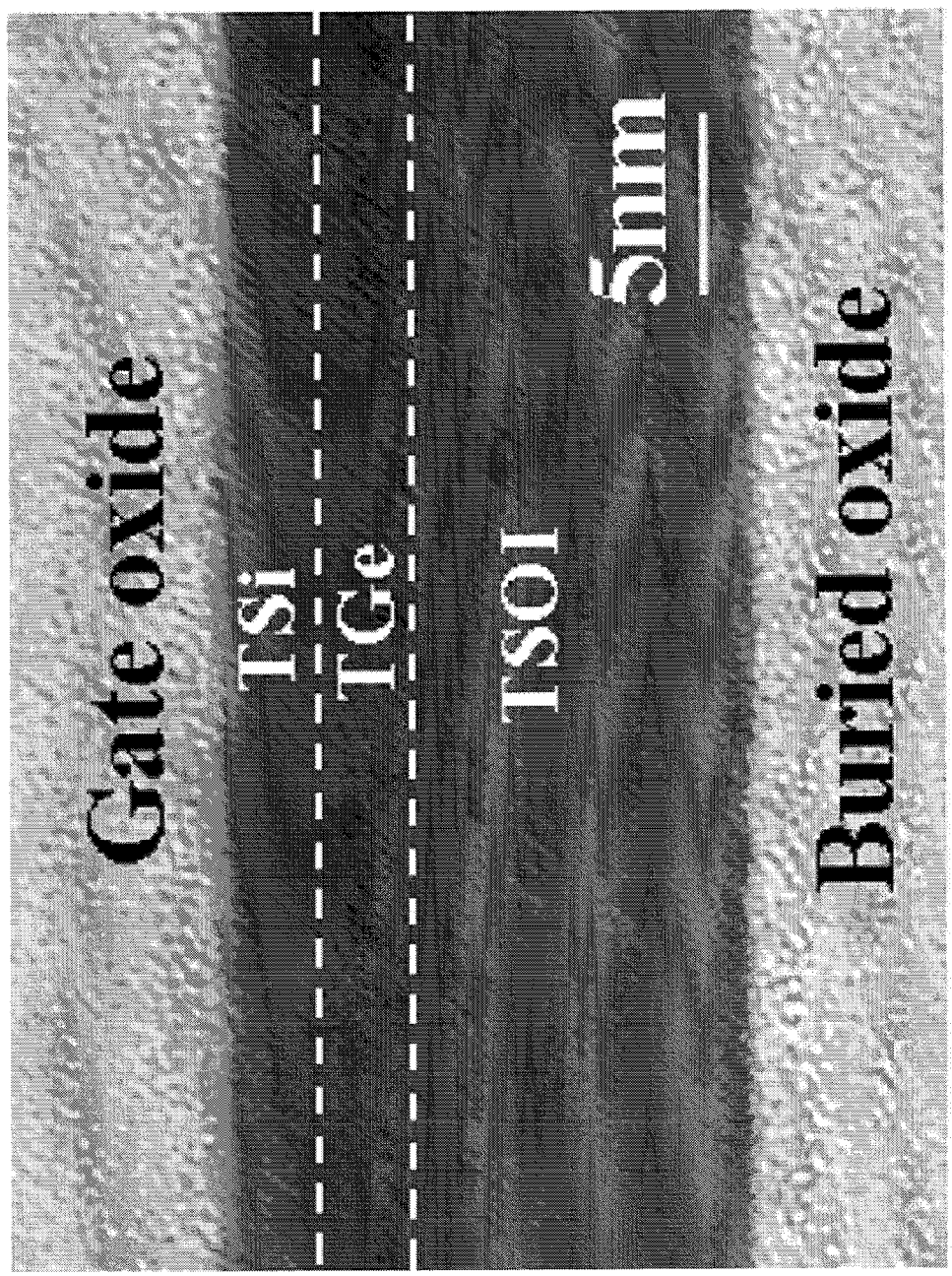
FIG. 16 shows a cross-sectional TEM of device showing $T_{Sicap}$=3 nm, $T_{Ge}$=3 nm and $T_{SOI}$=9 nm, according to an example embodiment of the present invention.
Figure 18A:
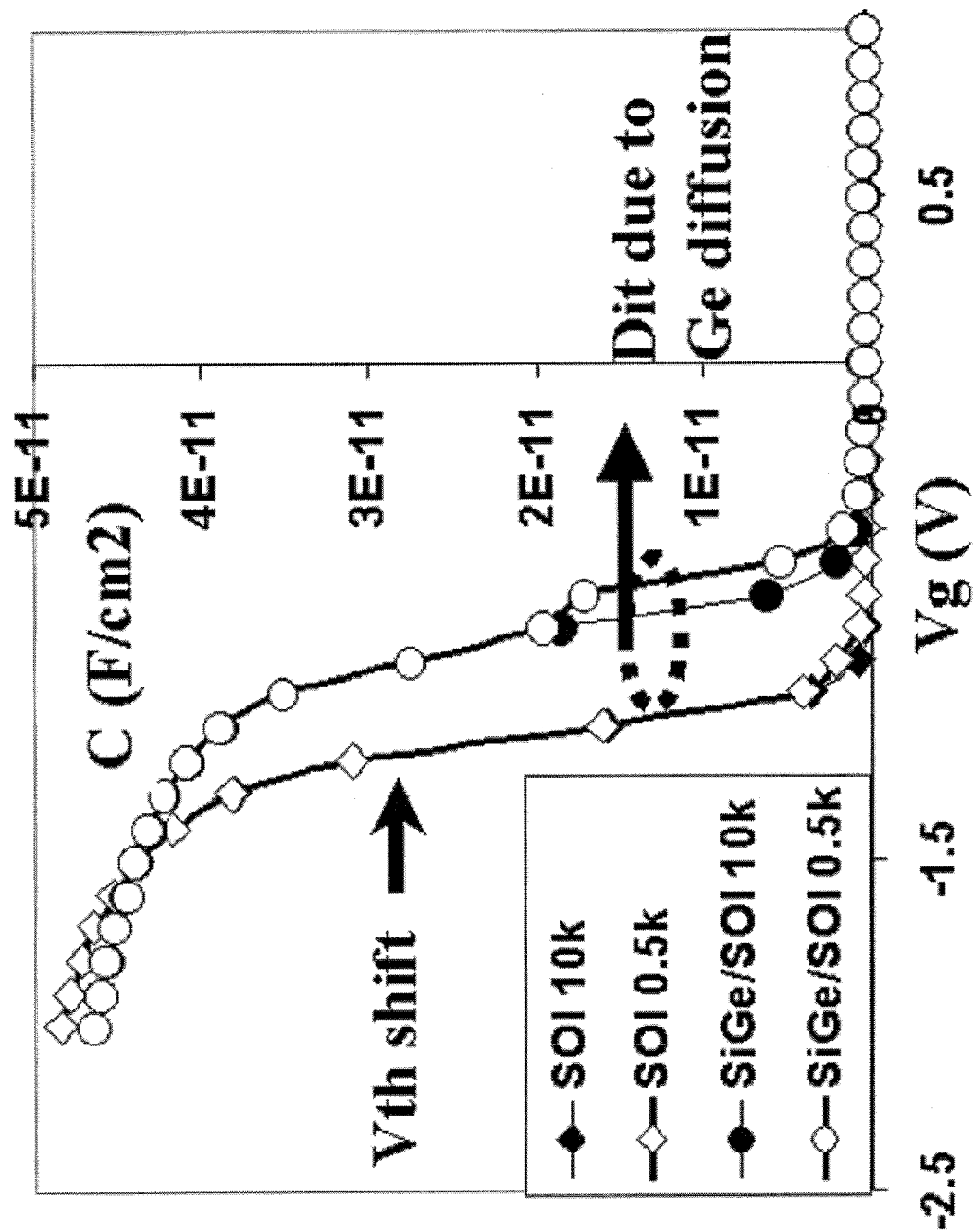
FIGS. 18 (a), (b) and (c) show interface states and defects generated as a result of Ge diffusion towards the surface as a function of the $T_{Sicap}$ for a given gate oxidation condition, according to an example embodiment of the present invention.
Figure 18B:
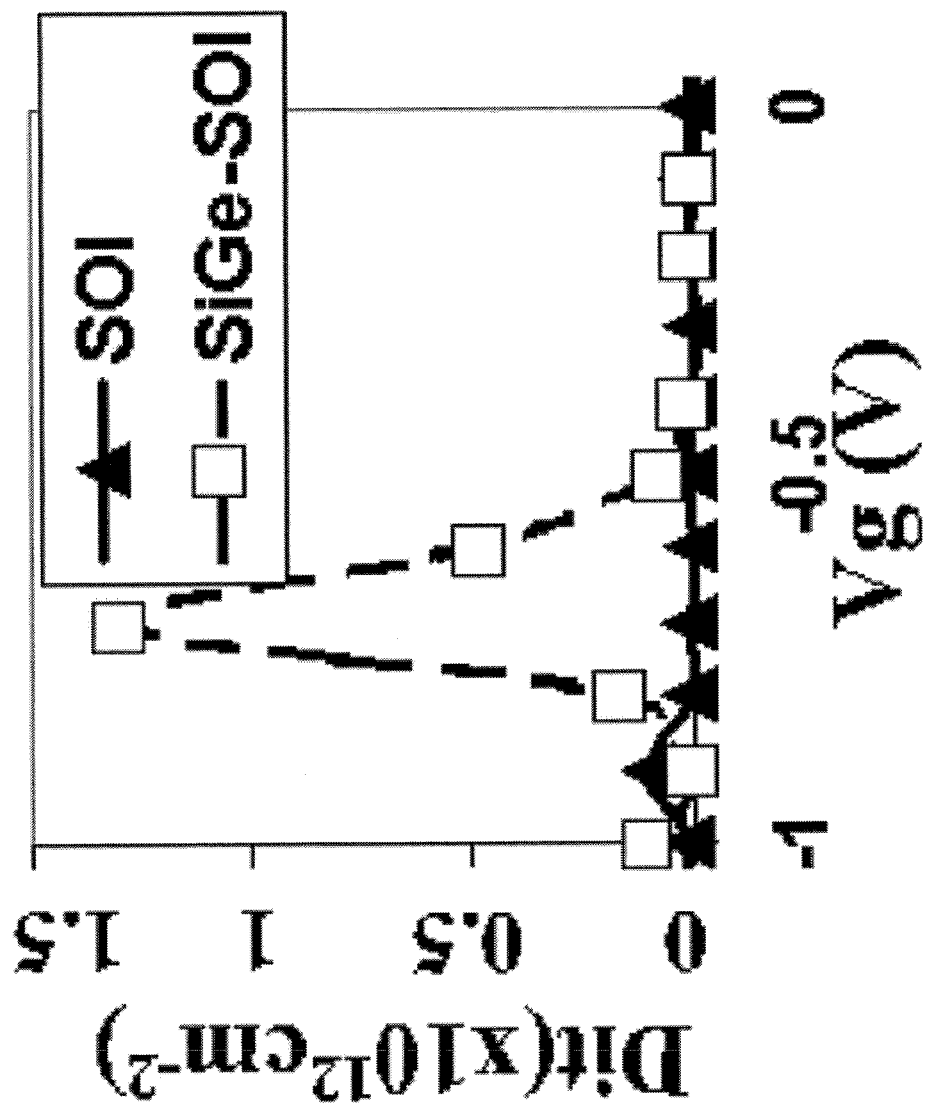
Figure 18C:
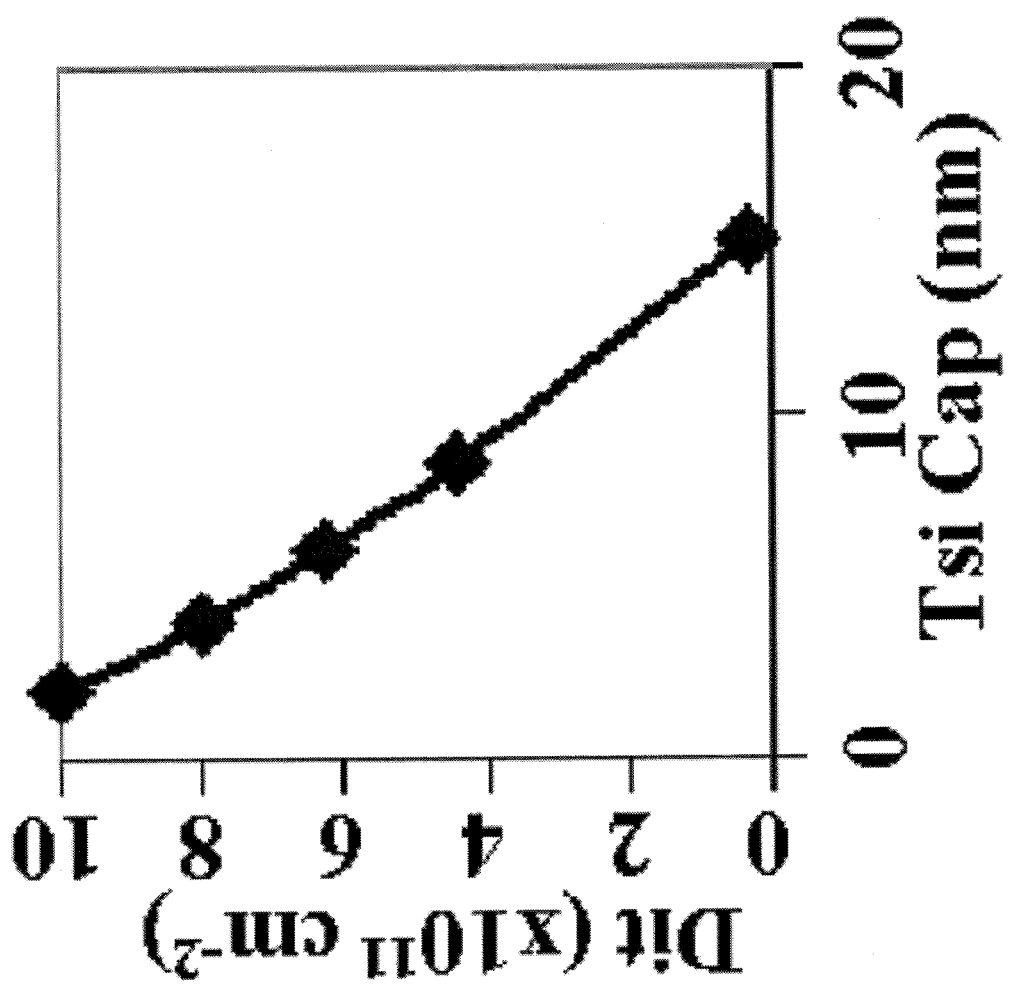

FIG. 18 (a)-(c) show that the interface state density (Dit) created by the Ge diffusion to the interface may be a strong function of Ts, cap and may adversely affect the mobility and the trap-assisted-tunneling (TAT). In this embodiment, the Si cap is oxidized at a lower temperature to prevent relaxation/diffusion of the strained SiGe film and capped with 35 nm of LTO at 400° C. The cross-sectional TEM of the fully processed device, in FIG. 16, shows the different defect-free layers. In order to study the design space thoroughly, several splits by varying the $T_{Si}$ cap, Ge percentage and the $T_{Ge}$ were fabricated. The different design splits are shown in Table 2. The $T_{Si}$ cap was varied from 0 nm-3 nm, the $T_{Ge}$ was varied from 6 nm-3 nm and two types of devices with 60% and 80%

Ge fractions were fabricated. The devices were benchmarked against bulk Si, SOI and 20% strained-silicon-directly-on-insulator (SSDOI) controls.

TABLE 2

| Device | Type | Layer specification | Ge strain | Si strain |
|---|---|---|---|---|
| 1 | SiGe on SOI | TSicap = 3 nm<br>TGe = 3 nm<br>TSOI = 9 nm | 80% | Relaxed |
| 2 | SSDOI | 9 nm Strained Si | — | 20% |
| 3 | SOI | 9 nm SOI | — | Relaxed |
| 4 | SiGe on Bulk | TSicap = 3 nm<br>TGe = 6 nm | 60% | Relaxed |
| 5 | SiGe on Bulk | Tsicap = 2 nm<br>TGe = 6 nm | 60% | Relaxed |
| 6 | SiGe on Bulk | Tsicap = 0 nm<br>TGe = 6 nm | 60% | Relaxed |
| 7 | Bulk | — | — | Relaxed |

Figure 19A:
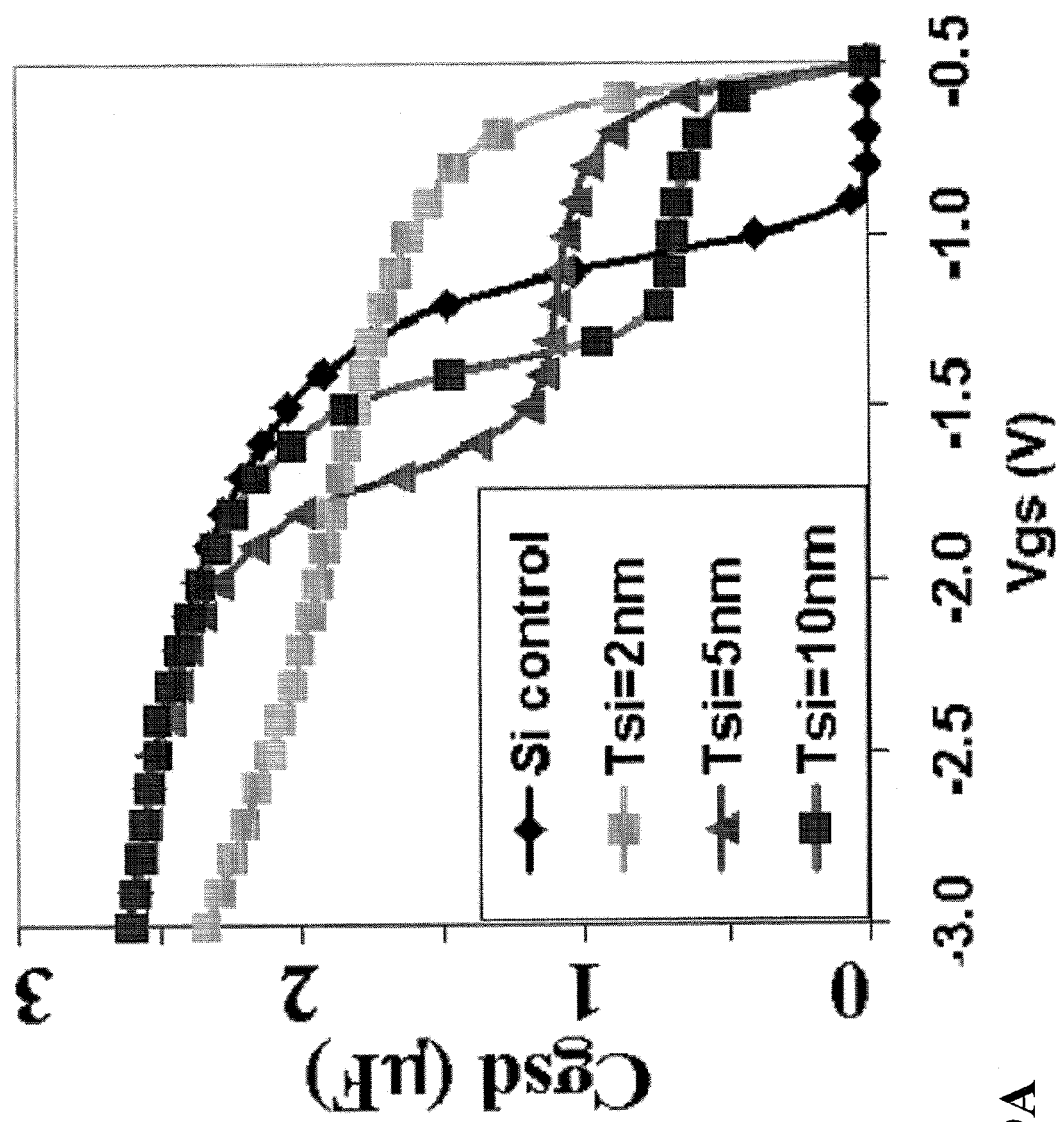
FIGS. 19 (a) and (b) represent simulation results obtained by using Luttinger-Kohn (6×6 k.p) Schrodinger solver and showing the effect of varying the $T_{Sicap}$, the $T_{Ge}$ and the percentage Ge on the C-V, according to an example embodiment of the present invention.
Figure 19B:
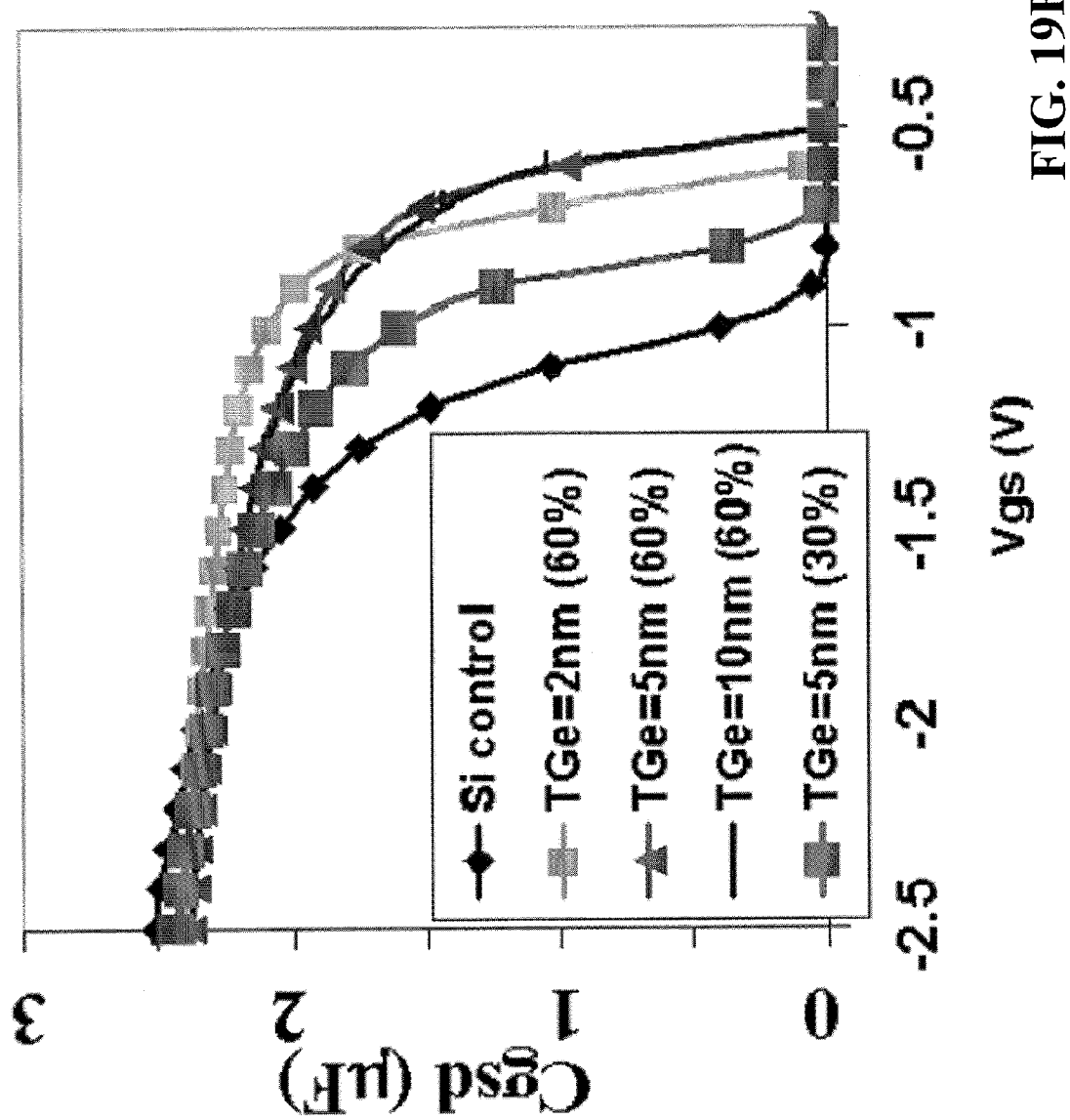
Figure 20:
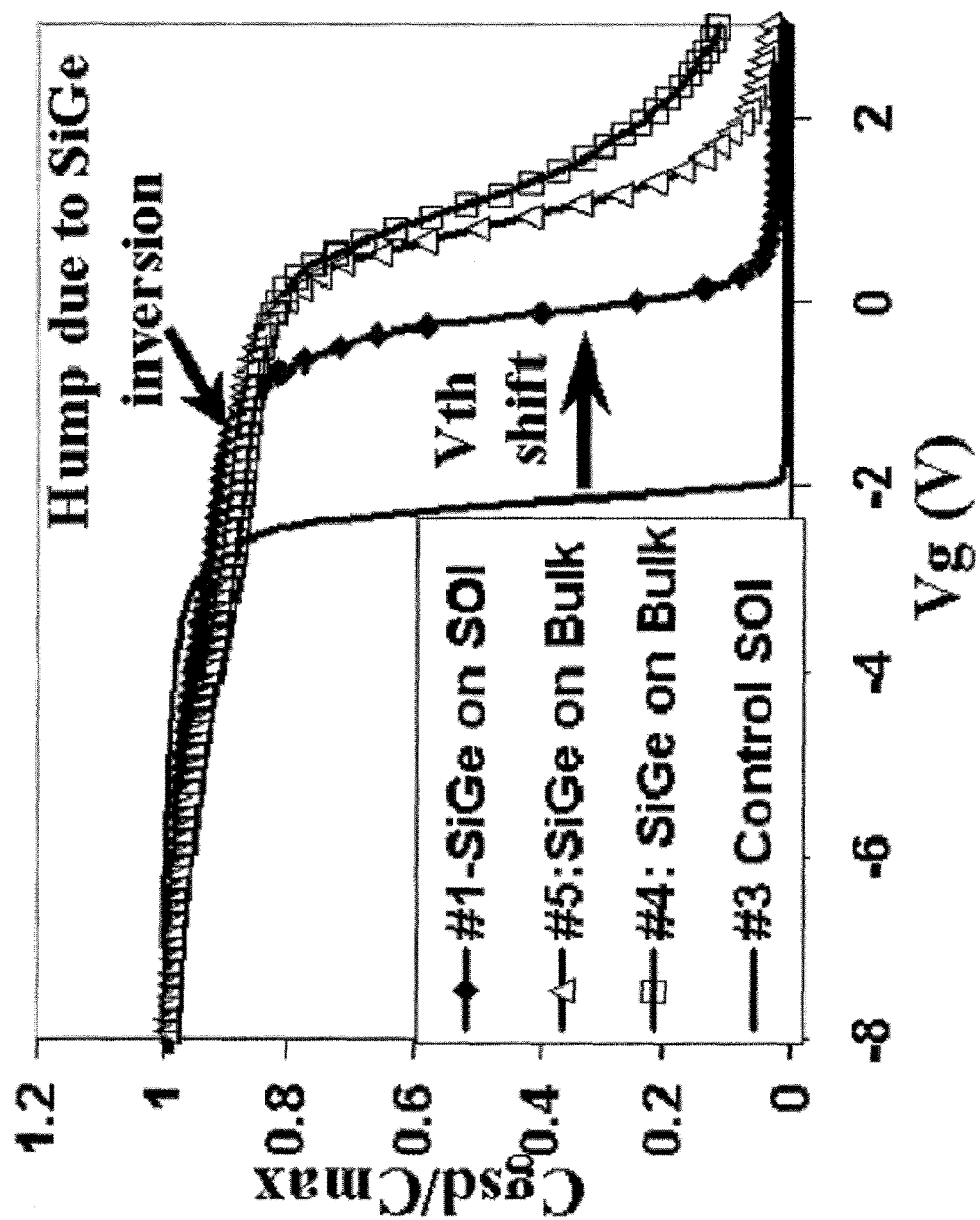
FIG. 20 shows C-V characteristics of the fabricated strained SiGe devices, according to an example embodiment of the present invention.
Figure 21:
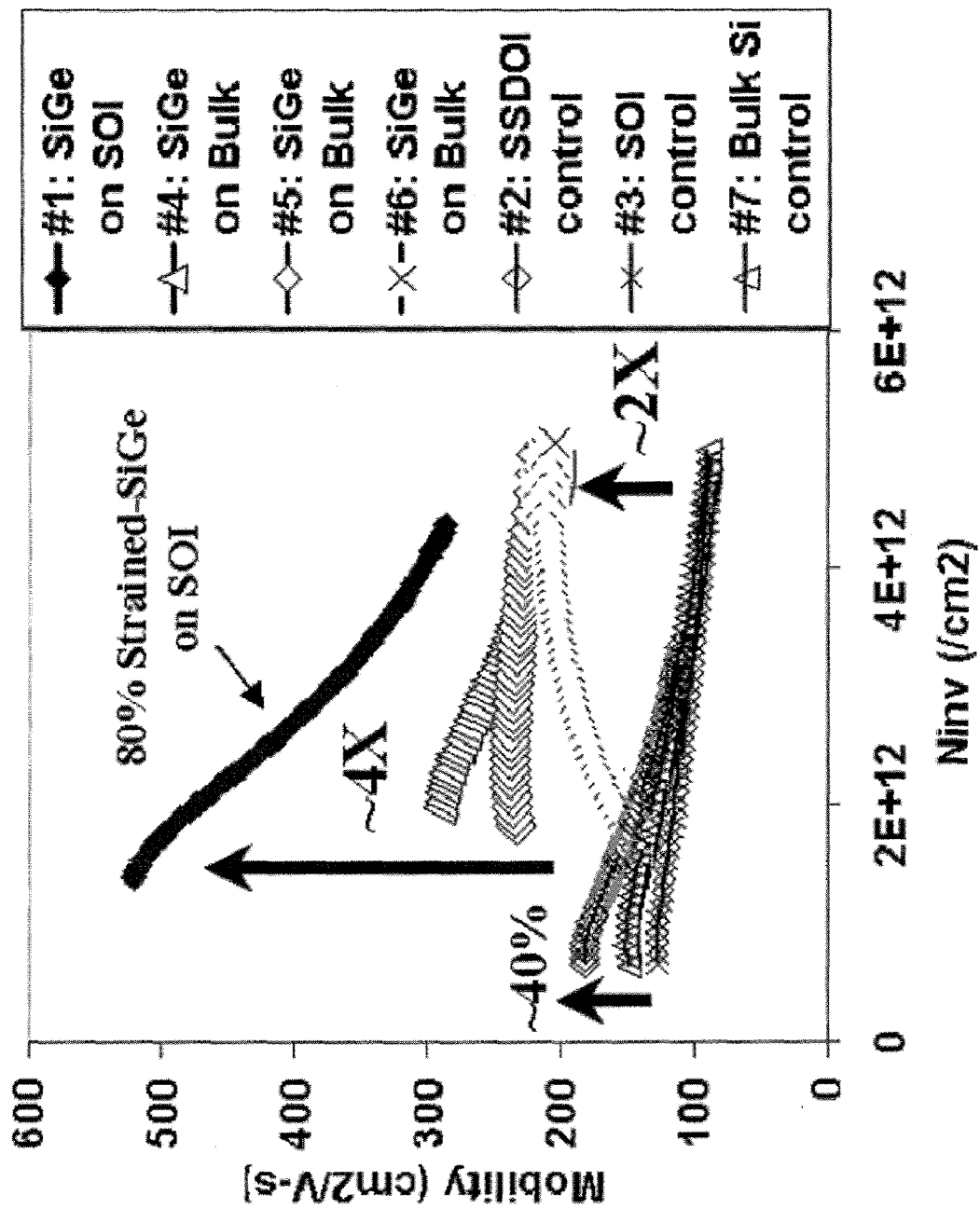
FIG. 21 shows mobility vs. according to an example embodiment of the present invention.
Figure 22A:
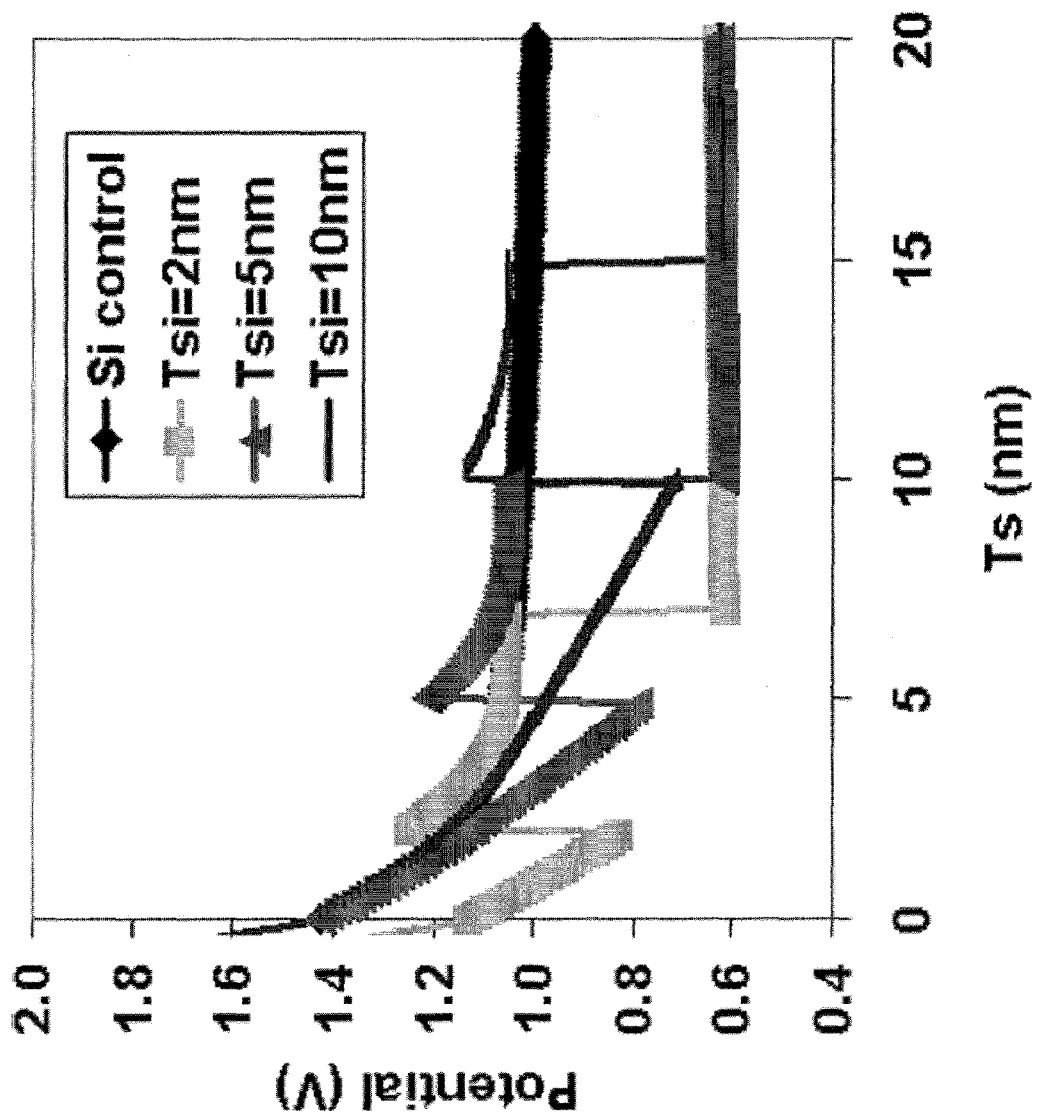
FIGS. 22(a) and (b) represent simulations results obtained by using Luttinger-Kohn (6×6 k.p) Schrodinger solver and showing the effect of varying TSicap on the valence band profile and carrier distribution in the Si and Ge layers at an $N_{inv}=10^{13}$ cm$^{-2}$, according to an example embodiment of the present invention.
Figure 22B:
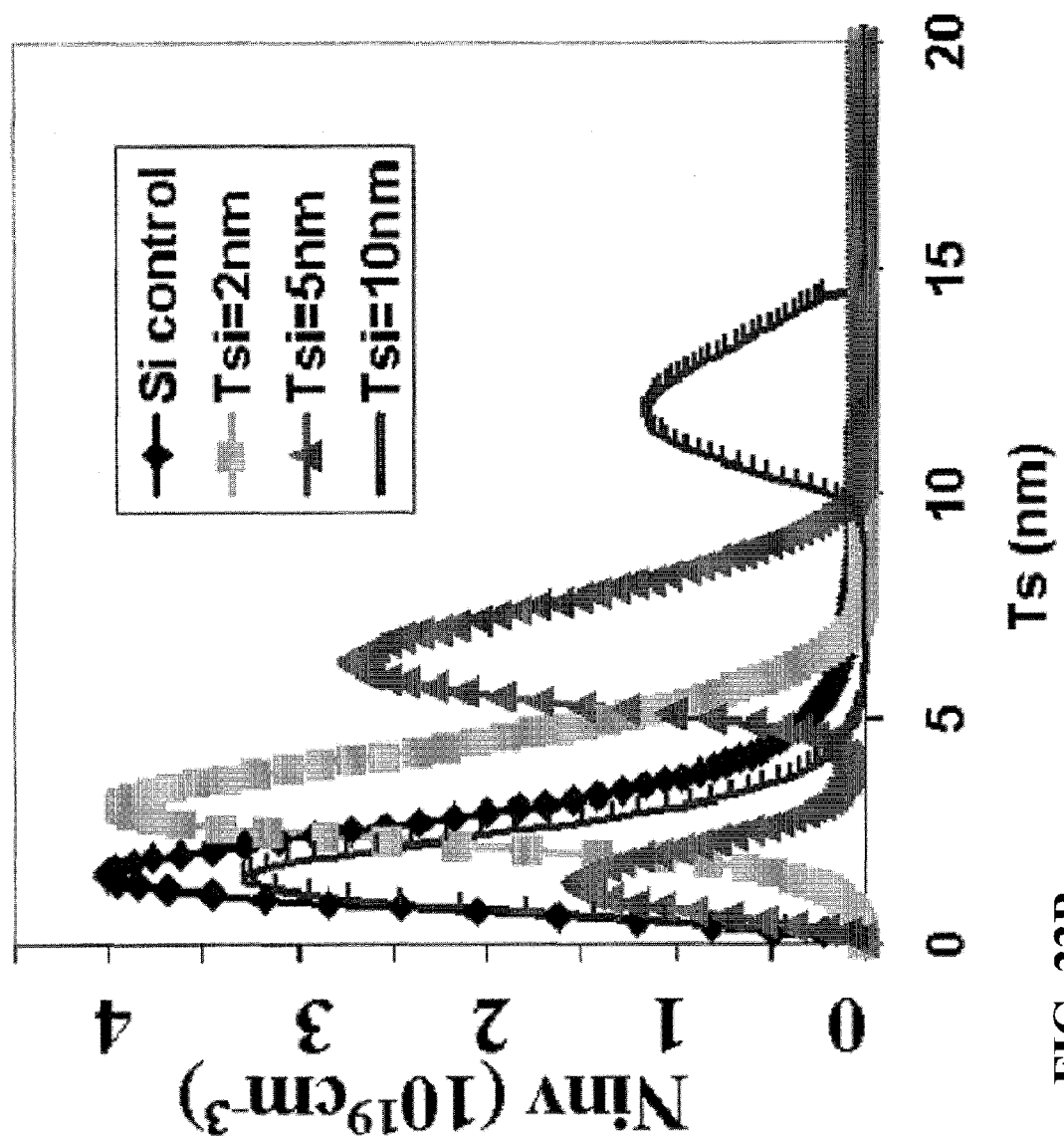

Simulations, using a Luttinger-Kohn (6×6 k.p) Schrodinger solver, illustrate the effect of the $T_{Si\,Cap}$, $T_{Ge}$ and the percentage strain in the SiGe on the CV characteristics (FIG. 19). The characteristic hump in the C-V curve in FIG. 19 (a) is caused by the sub-surface SiGe channel inverting before the top Si cap. Due to the larger band offset, FIG. 19 (b) shows that increasing the strain decreases the threshold voltage ($V_{th}$). However, as the strained SiGe thickness decreases, due to quantum confinement, the $V_{th}$ increases. The C-Vs of some example fabricated devices are shown in FIG. 20. The hole mobilities for the different devices are shown in FIG. 21. The 3 nm, 80% strained SiGe on SOI device exhibits a very high mobility of >4× compared to the Si controls and >2.5× higher than the control 20% SSDOI wafer. The SSDOI itself exhibits 40% higher mobility compared to the Si controls, but only at low E-field. The 60% strained-SiGe on bulk devices also show high-mobility enhancements (~2×) even at high Ninv. By going to a thinner $T_{Si\,cap}$, the mobility in the 60% bulk devices shows a reduction at low E-fields, due to the increasing number of Dit. However, at higher E-fields, there is a cross-over in the mobility because the coulombic scattering sites are screened and more carriers populate the high-mobility strained-SiGe layer for a thin $T_{Si\,cap}$. Since the 60%, 6 nm strained-SiGe layer is close to the critical thickness, it may partially relax during thermal processing, leading to defect formation in the Ge channel and Si cap. The effect of the $T_{Si\,cap}$ on the confining band potential and consequently, the carrier distribution between the strained SiGe and the Si cap are shown in FIGS. 22 (a) and (b). The mobility advantage is retained for the strained-SiGe device even at high $N_{inv}$ because even for $T_{Si\,cap}$=5 nm, the valence band offset between the strained-SiGe and Si causes most of the carriers to populate and flow in the high-mobility strained-SiGe layer.

Figure 23:
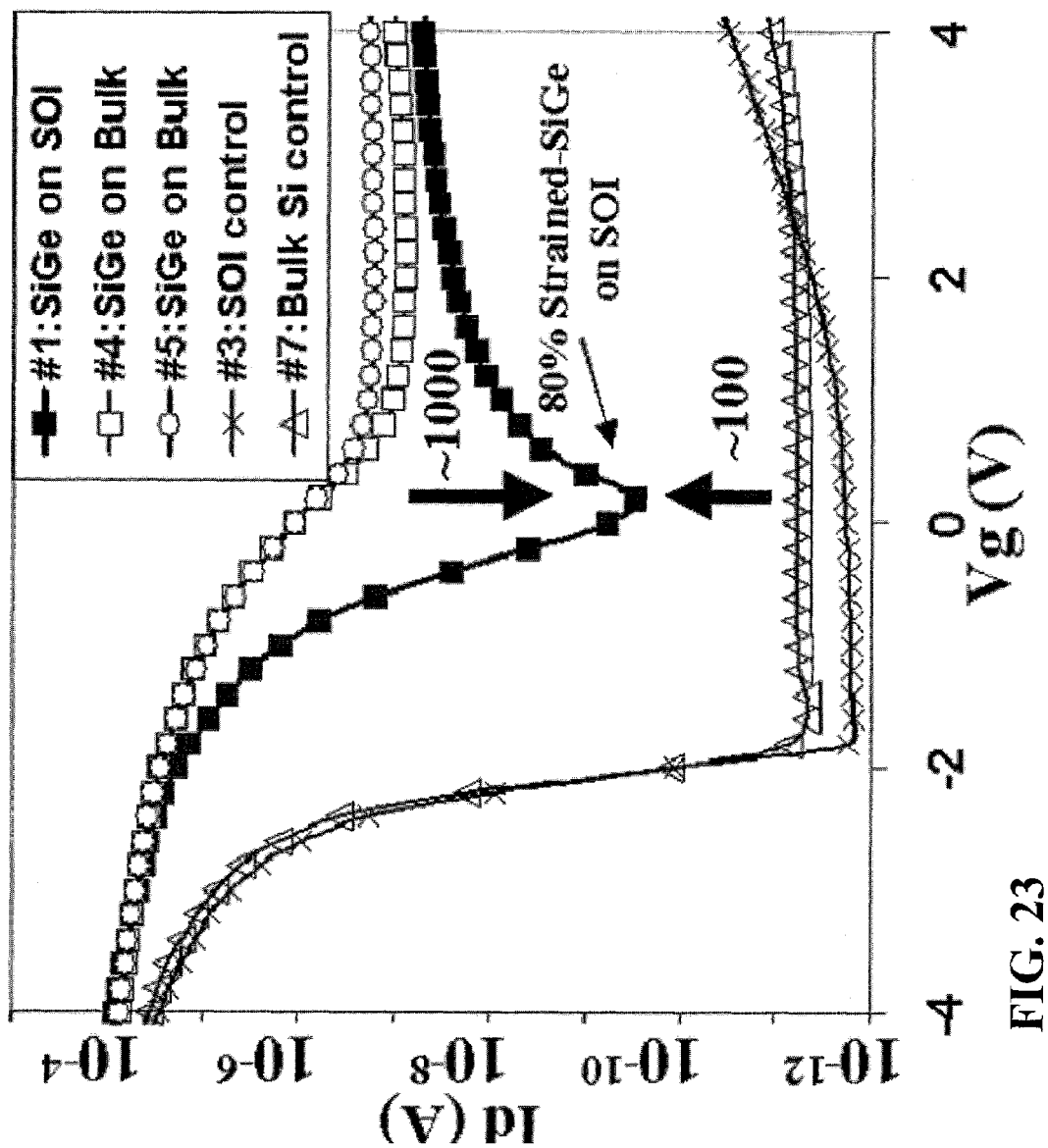
FIG. 23 shows Id-Vg characteristics at Vd=–1V, according to an example embodiment of the present invention.
Figure 24:
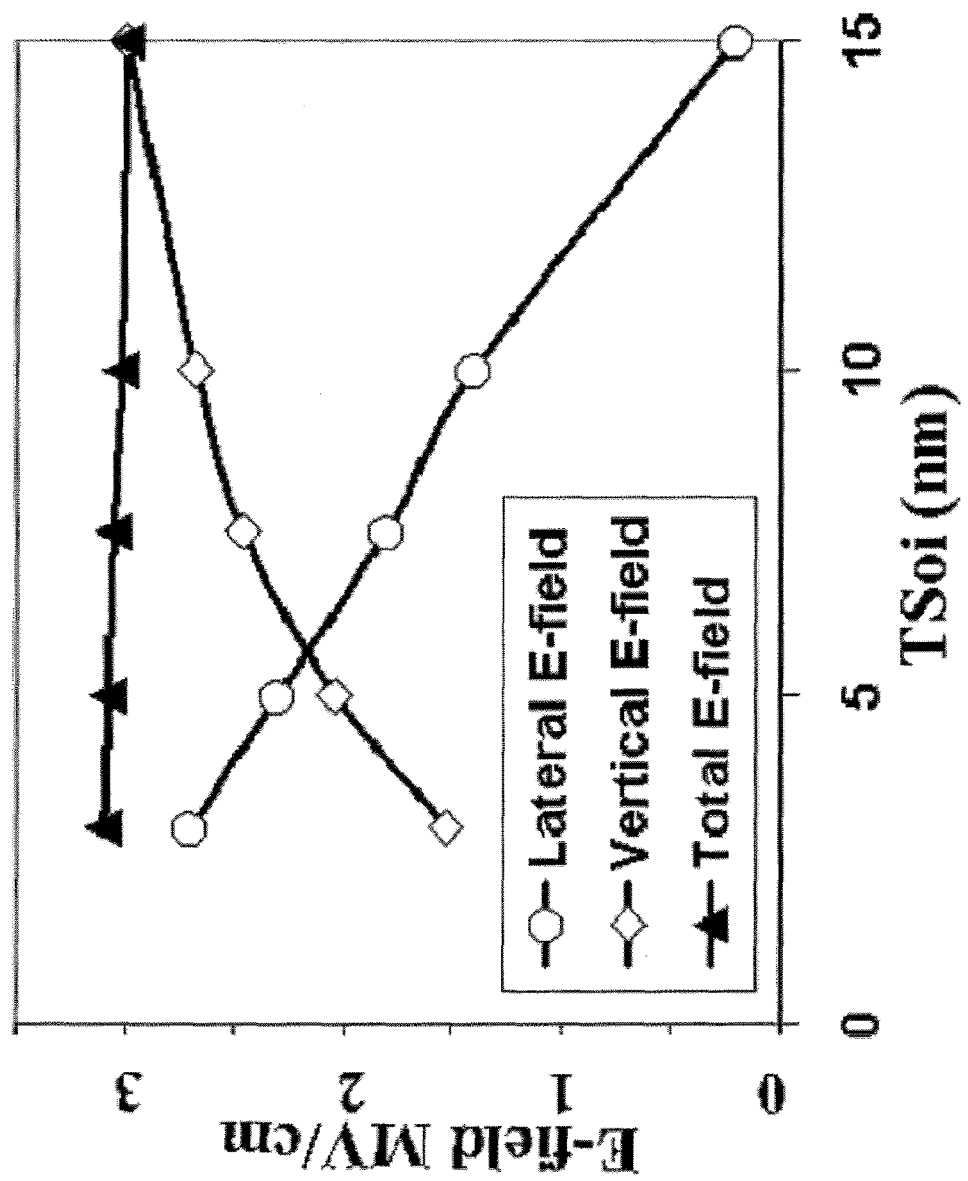
FIG. 24 shows electric field components in UT SOI devices, according to an example embodiment of the present invention.

The Id-Vg curves are shown in FIG. 23. The different leakage mechanisms in the Strained-SiGe on SOI device may contribute to the device performance. A thicker $T_{Si\,cap}$ reduces the peak vertical E-field in the strained-SiGe (smaller $E_g$) region at the expense of a marginal increase in the E-field at the Si surface (larger $E_g$) (FIG. 7). This enables effective use of $T_{Si\,cap}$ as a knob to lower the BTBT leakage. However, the effect of the lateral field may be large in the case of SOI or Double-Gate FETs. Going to ultra-thin SOI decreases the vertical E-field at the expense of a growing lateral field (FIG. 24). The total field remains roughly the same.

Figure 25:
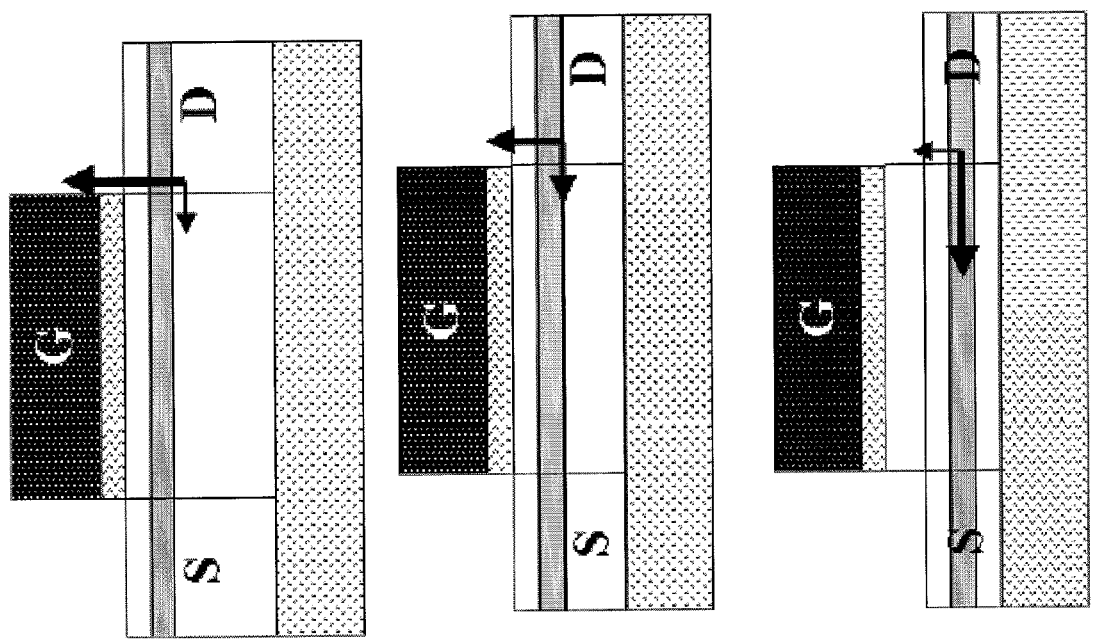
FIG. 25 is a schematic showing the relationship between the lateral E-field and tunneling currents in Ultra-Thin strained SiGe on SOI devices, according to an example embodiment of the present invention.
Figure 26A:
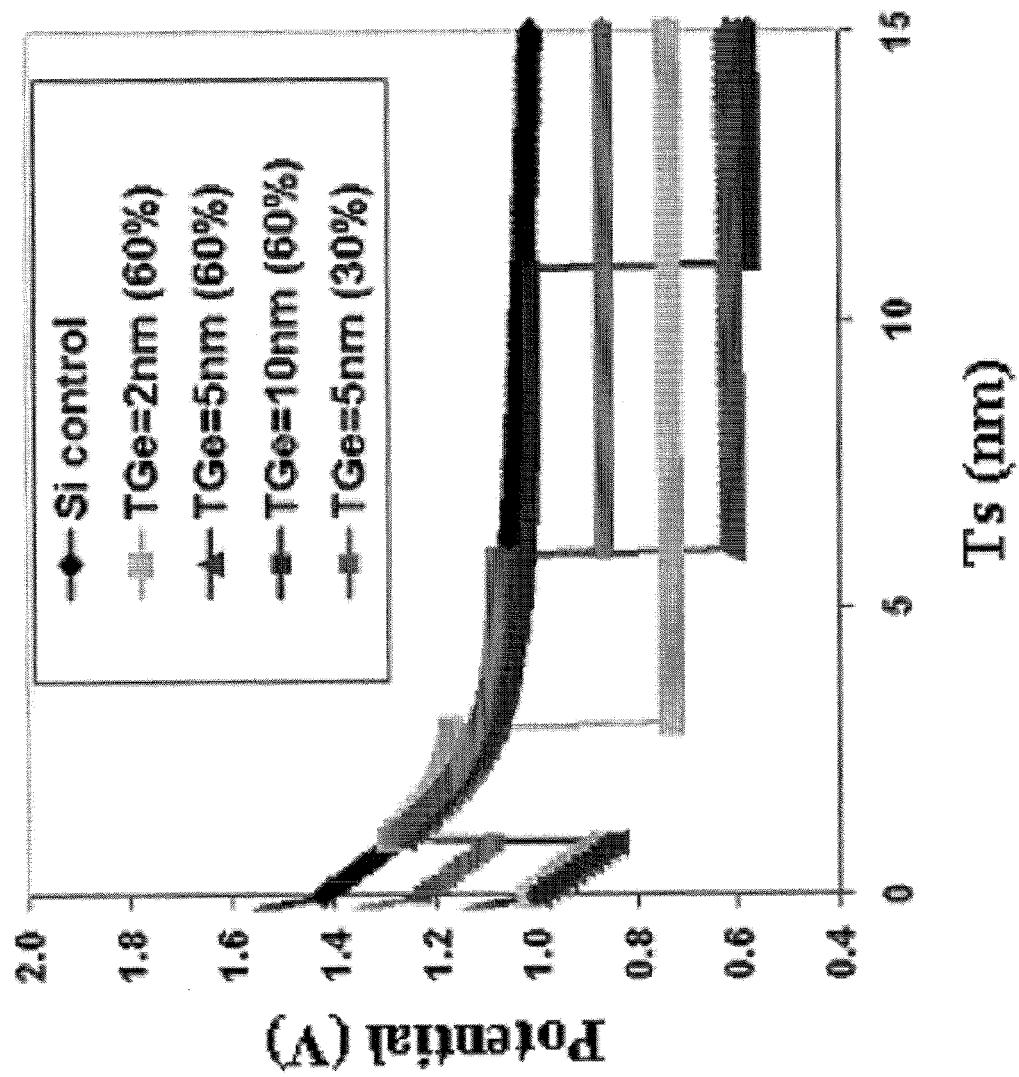
FIGS. 26 (a) and (b) represent simulations results obtained using Luttinger-Kohn (6×6 k.p) and showing the effect of varying the $T_{Ge}$ and the percentage Ge on the band profile and carrier distribution in the Si and Ge layers at an $N_{inv}=10^{13}$ cm$^{-2}$, according to an example embodiment of the present invention.
Figure 26B:
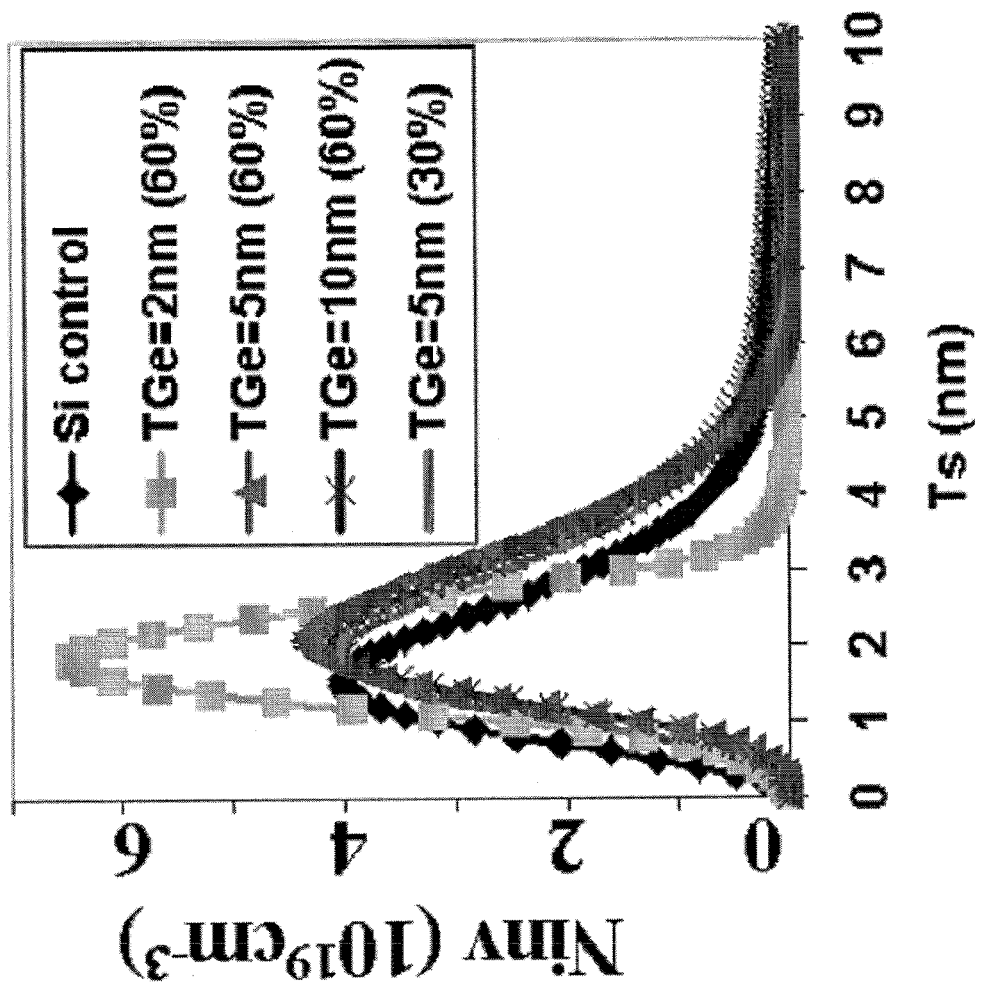
Figure 27:
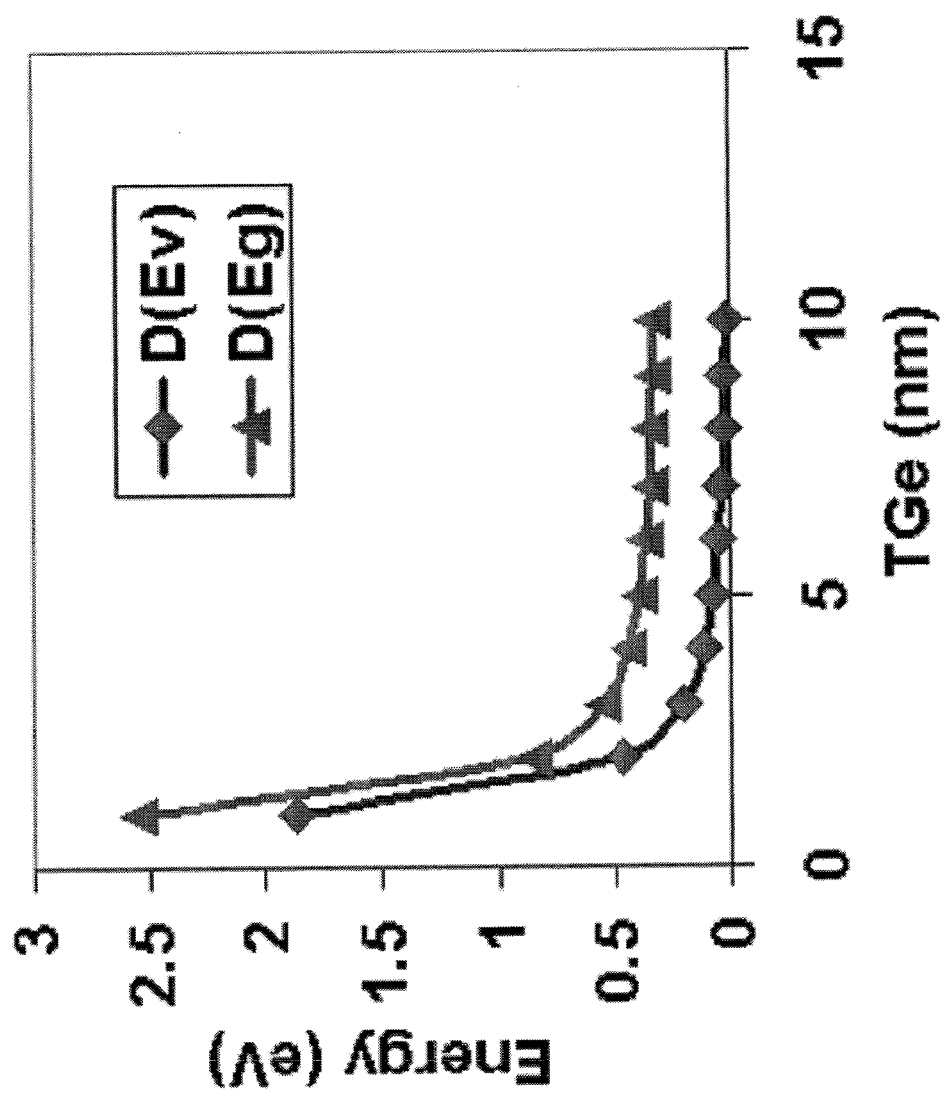
FIG. 27 shows effective bandgap increase as a function of The due to energy level quantization, according to an example embodiment of the present invention.
Figure 28:
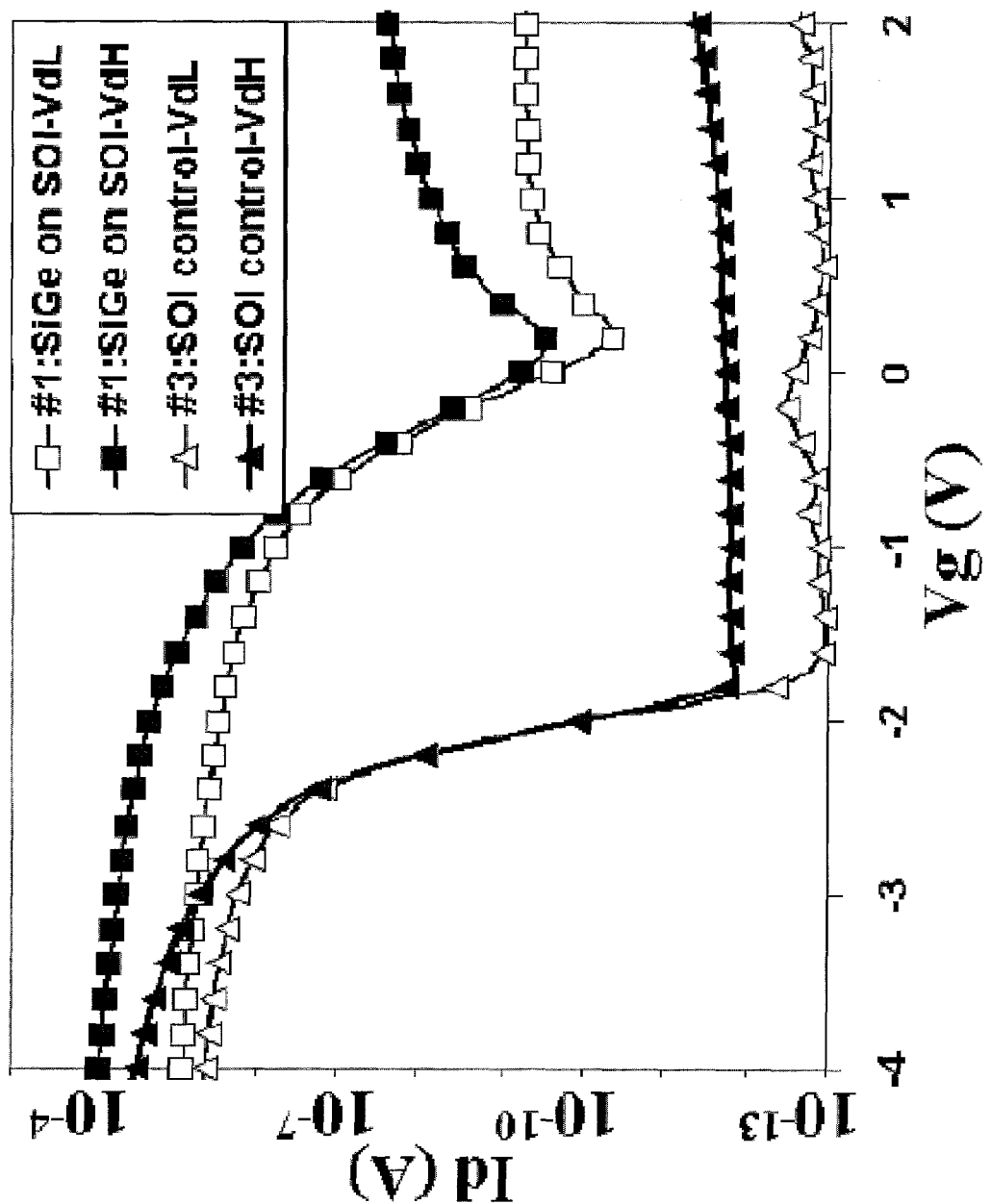
FIG. 28 shows Id-Vg characteristics of the SiGe SOI device, according to an example embodiment of the present invention.
Figure 29:
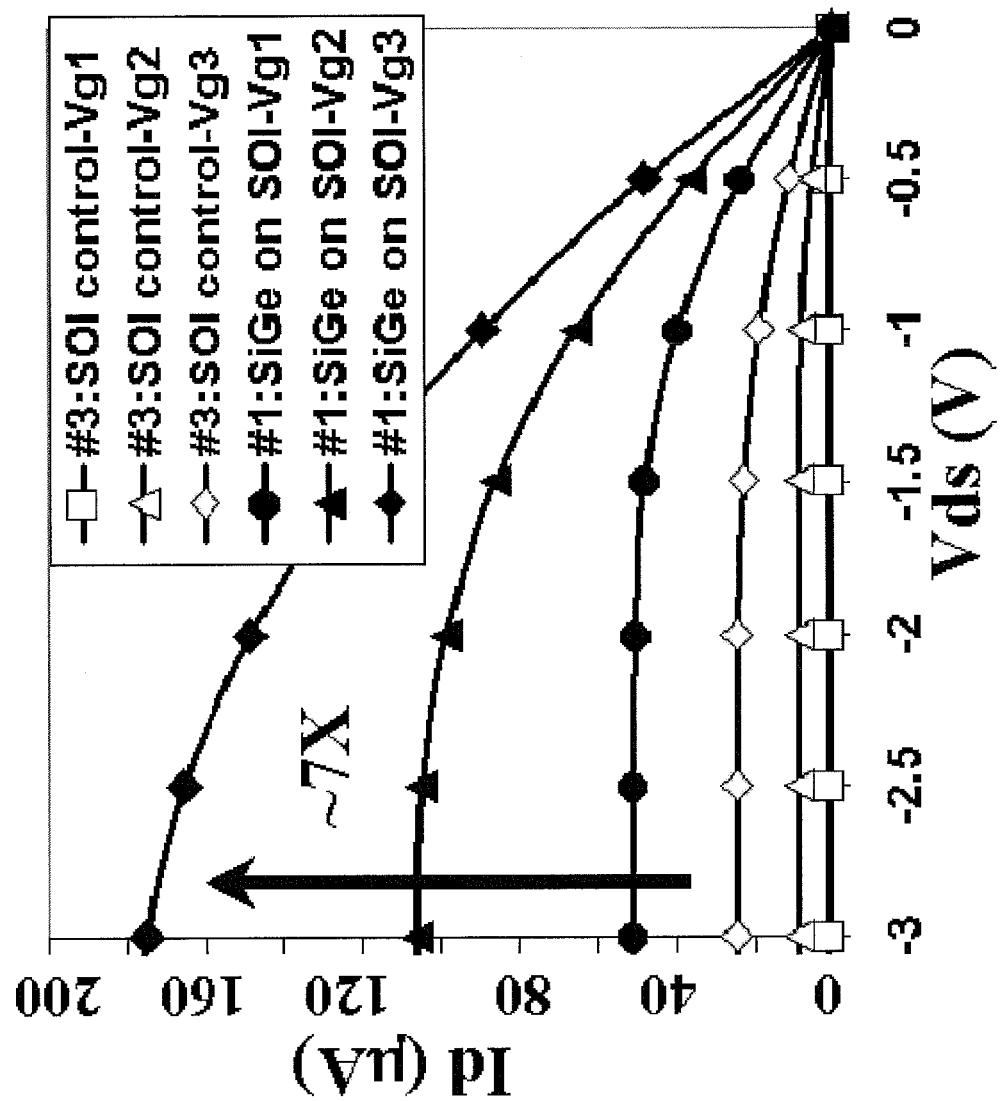
FIG. 29 shows Id-Vd characteristics of the SiGe SOI device, according to an example embodiment of the present invention.

Thus, the E-field vector rotates from a dominant vertical vector in thicker SOI or bulk, to a dominant lateral vector for UT-SOI (FIG. 25), which may lead to increased susceptibility to tunneling leakage through the strained-SiGe channel. FIGS. 26 (a) and (b) show the band profile and carrier population with respect to changes in $T_{Ge}$ and Ge percentages. Increasing Ge percentages creates a stronger confining field for the holes and decreasing the $T_{Ge}$ squeezes the wavefunction, raising the lowest energy level. FIG. 27 shows a change in the "effective bandgap ($E_{g,eff}$)" energy due to quantum confinement of the holes as $T_{Ge}$ is reduced. Much of the energy change occurs in the valence band. Having a larger $E_{g,eff}$ may significantly reduce the BTBT probability and lead to lower leakage. A thin $T_{Ge}$ (lower than the critical thickness) may also lead to a defect-free layer, which further reduces the TAT and G-R currents. The leakage, sub-threshold slope (SS) and electrostatic control for the ultra-thin (3 nm) strained-SiGe on SOI device may be significantly better than the bulk strained-SiGe FETs but still be slightly worse than the control Si FETs. This may be due to the interface states caused by some Ge diffusion to the $SiO_2$ interface during thermal processing. The Id-Vg and Id-Vd characteristics for the strained-SiGe on SOI device are shown in FIG. 28 and FIG. 29. The currents are significantly enhanced (~7×) higher compared to the bulk SOI control due to the higher mobility and reduced $V_{th}$.

Figure 30A:
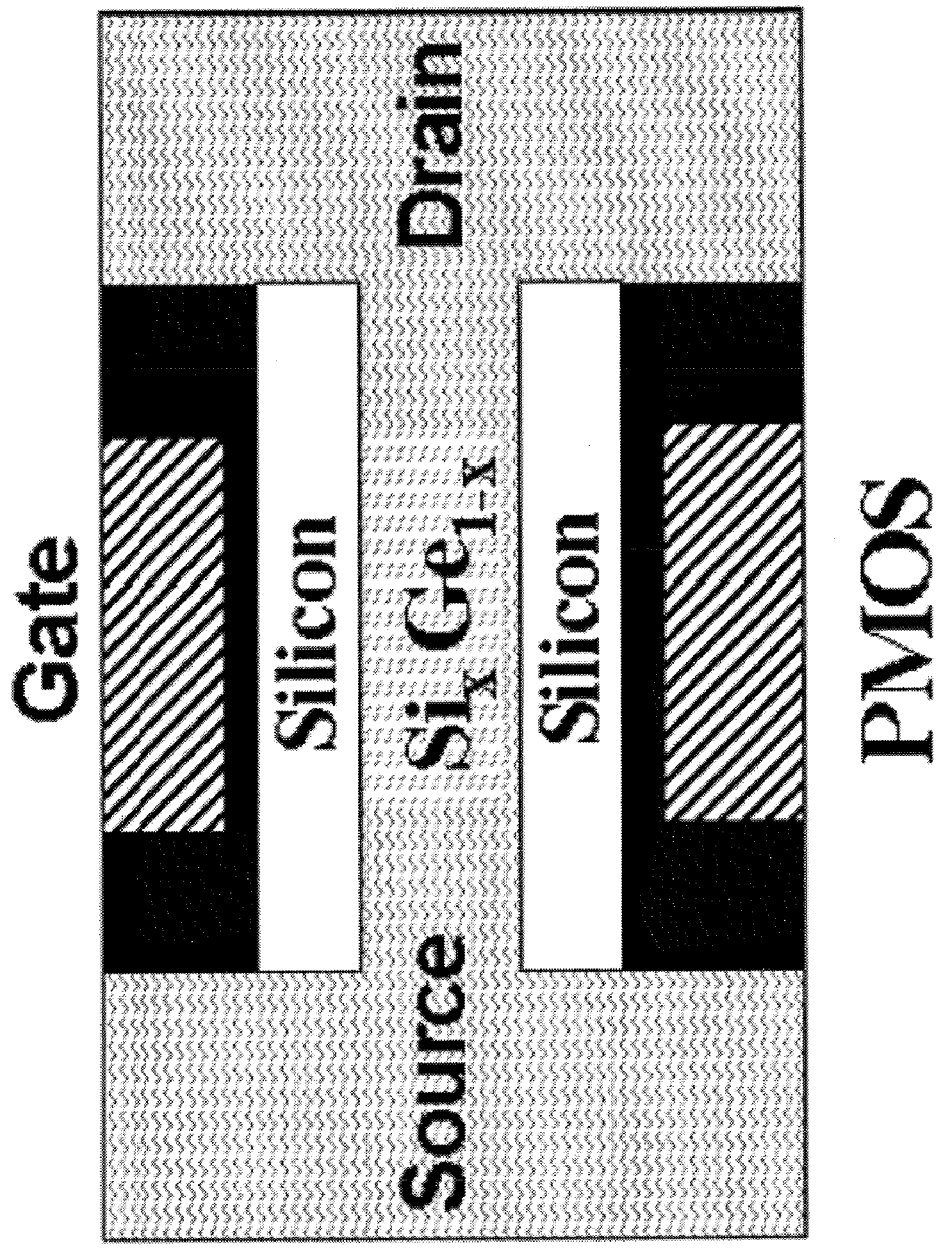
FIGS. 30 (a), (b) and (c) show cross-section and band diagrams of the DG heterostructure PMOSFET, according to an example embodiment of the present invention.
Figure 30B:
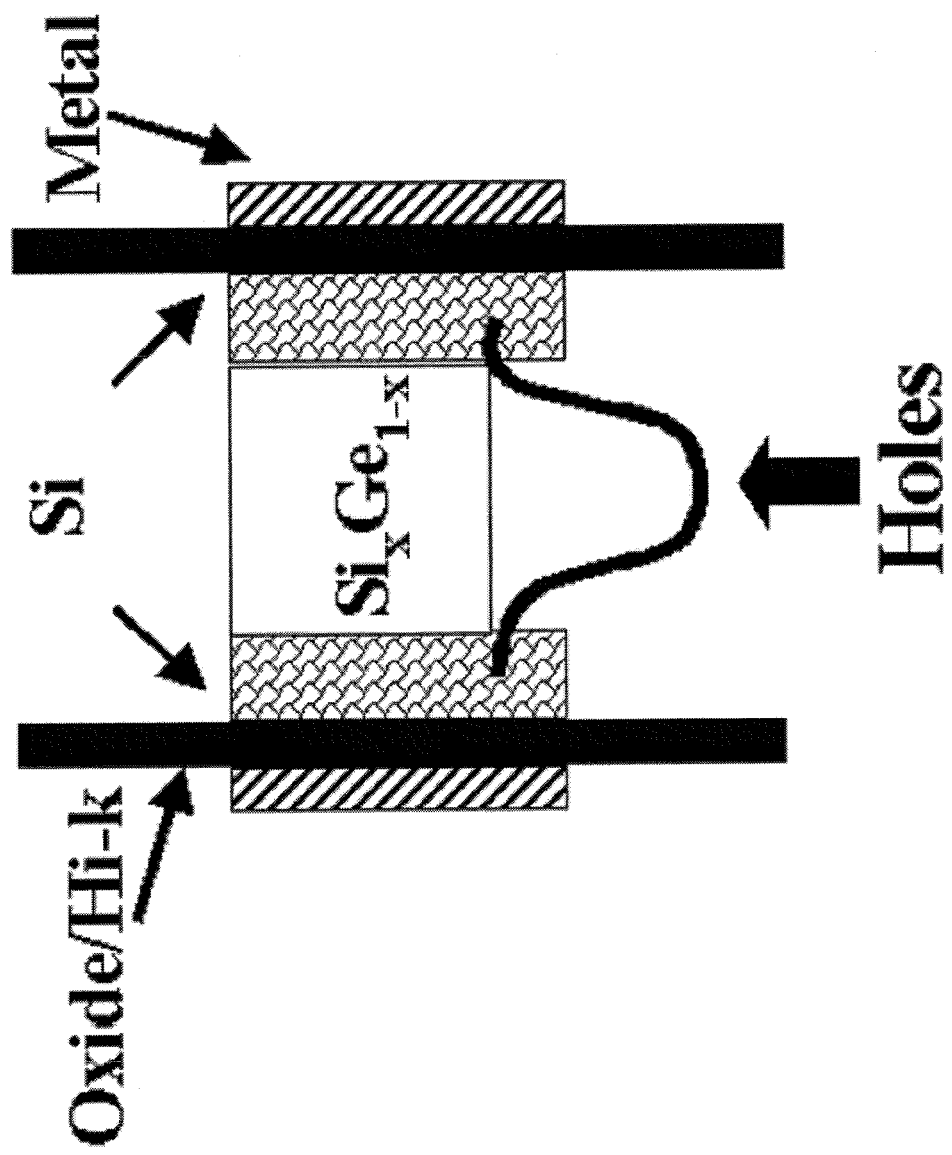
Figure 30C:
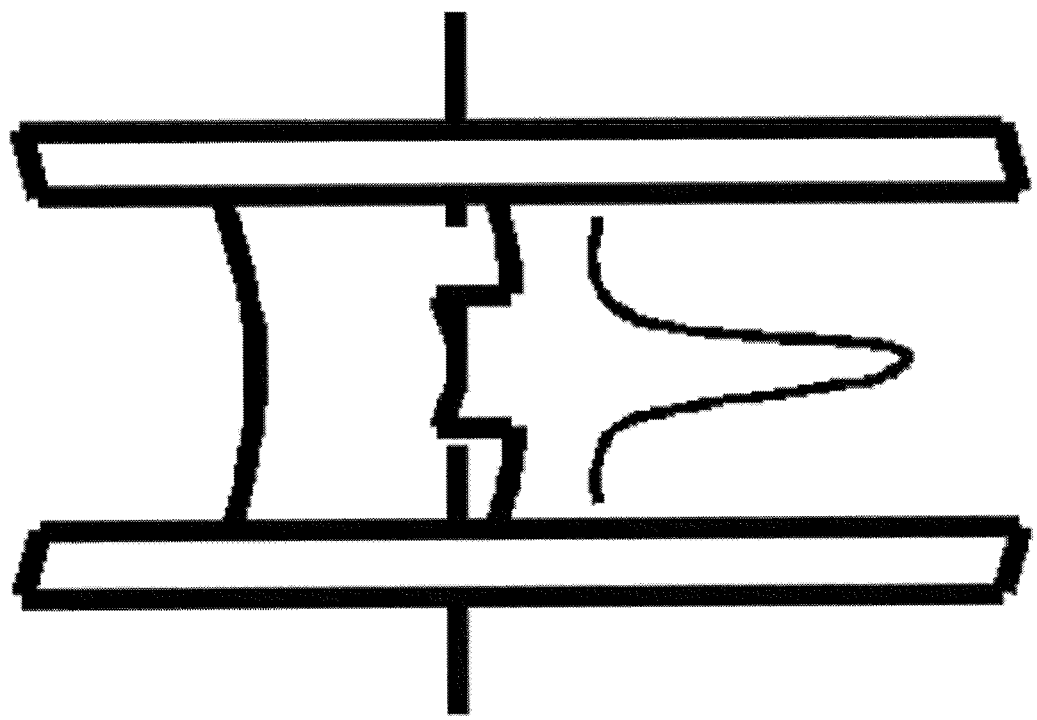

According to a particular embodiment of the present invention, double gate heterostructure FETs are implemented. The following discussion specifically analyzes the device implemented in a Si-strained Ge—Si DG PMOS configuration. The device structure, cross-section and band diagram of the DG heterostructure PMOSFET is shown in FIGS. 30 (a), 30 (b) and 30 (c). The device consists of a high hole mobility strained-SiGe layer sandwiched between two Si caps. The large valence band offset between strained-SiGe and Si creates a quantum well, which confines the holes towards the center of the device away from the dielectric interface. As the Ge concentration in the Six Ge(1−x) layer is increased, the valence band offset becomes larger and the effective mass drops, leading to stronger carrier confinement and a higher mobility channel. Parameters used to determine the device performance in the heterostructure DGFET include, but are not limited to, the Si cap thickness (TSi), the percentage (X) of the Ge in the strained SiGe and the Ge layer thickness (TGe). The total semiconductor thickness is denoted as TS. Quantum mechanical simulations were performed using a Luttinger-Kohn (6×6 k.p) Schrodinger solver to understand the basic device working and to illustrate the role of each of these parameters (TGe, TSi and X).

Figure 31:
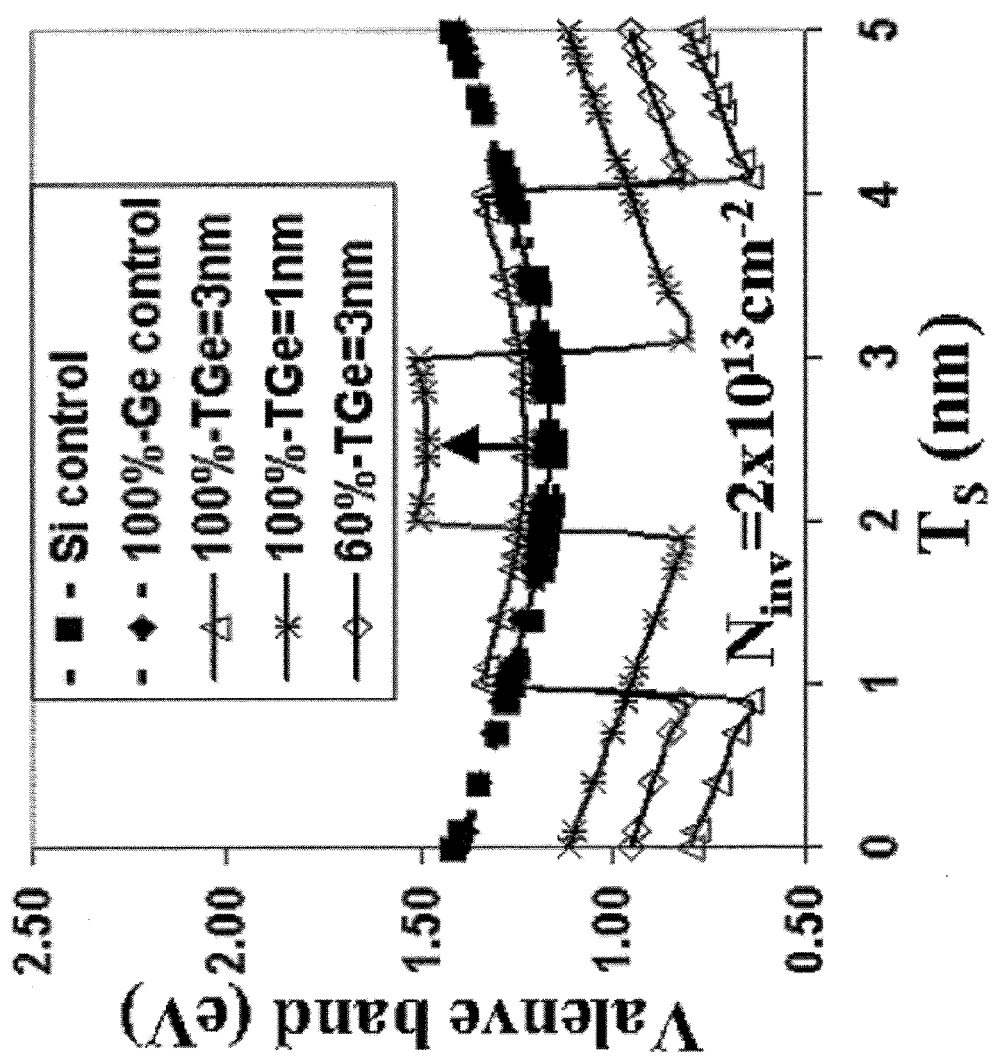
FIG. 31 shows the cross-sectional valence band profiles for three different DG heterostructure FETs in the ON state (NINV=2×10$^{13}$ cm$^{-2}$) compared with a control surface channel Si and surface channel strained Six Ge(1–x) with X=100%, according to an example embodiment of the present invention.
Figure 32:
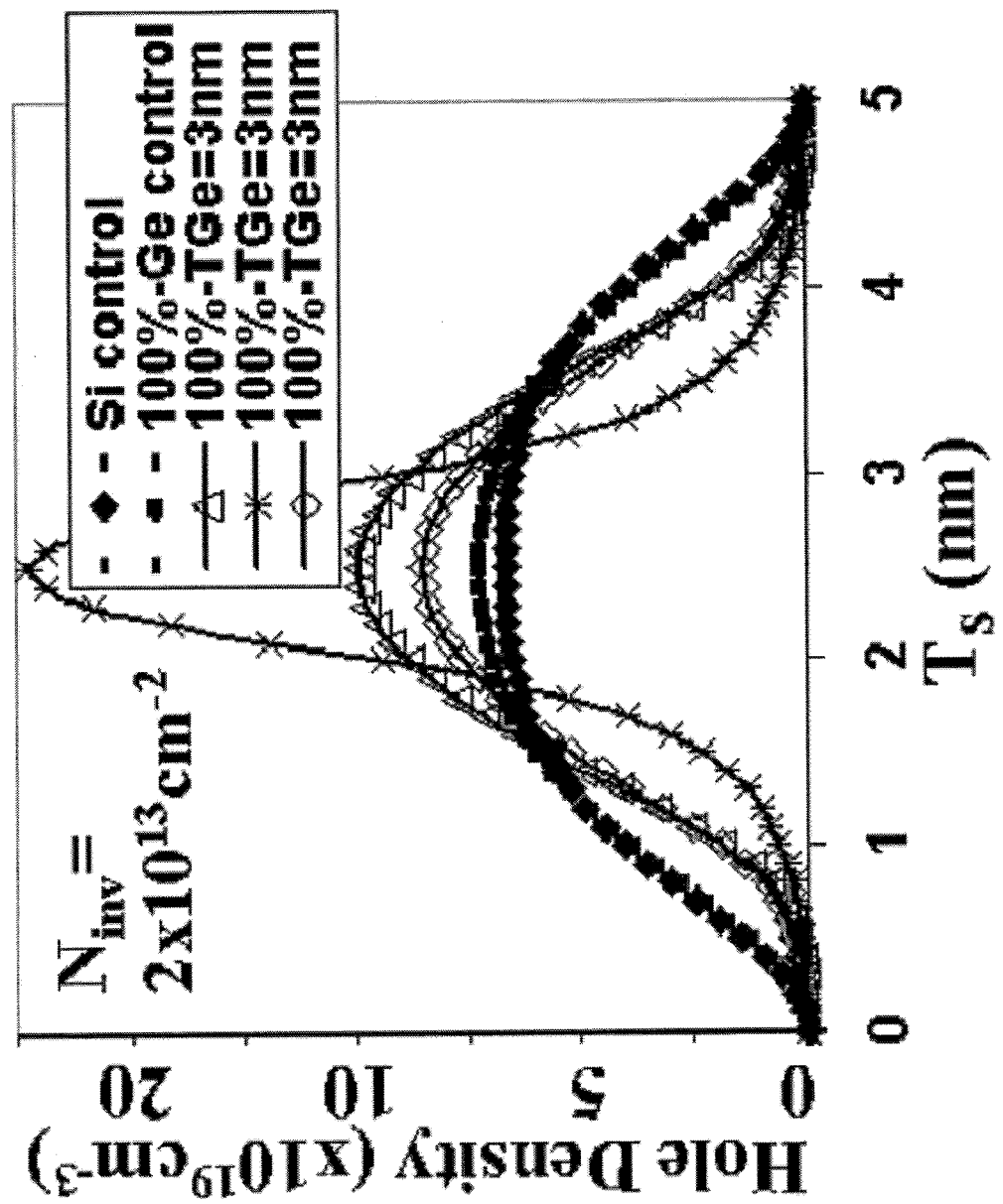
FIG. 32 shows the hole density in the ON state of a device, according to an example embodiment of the present invention.
Figure 33:
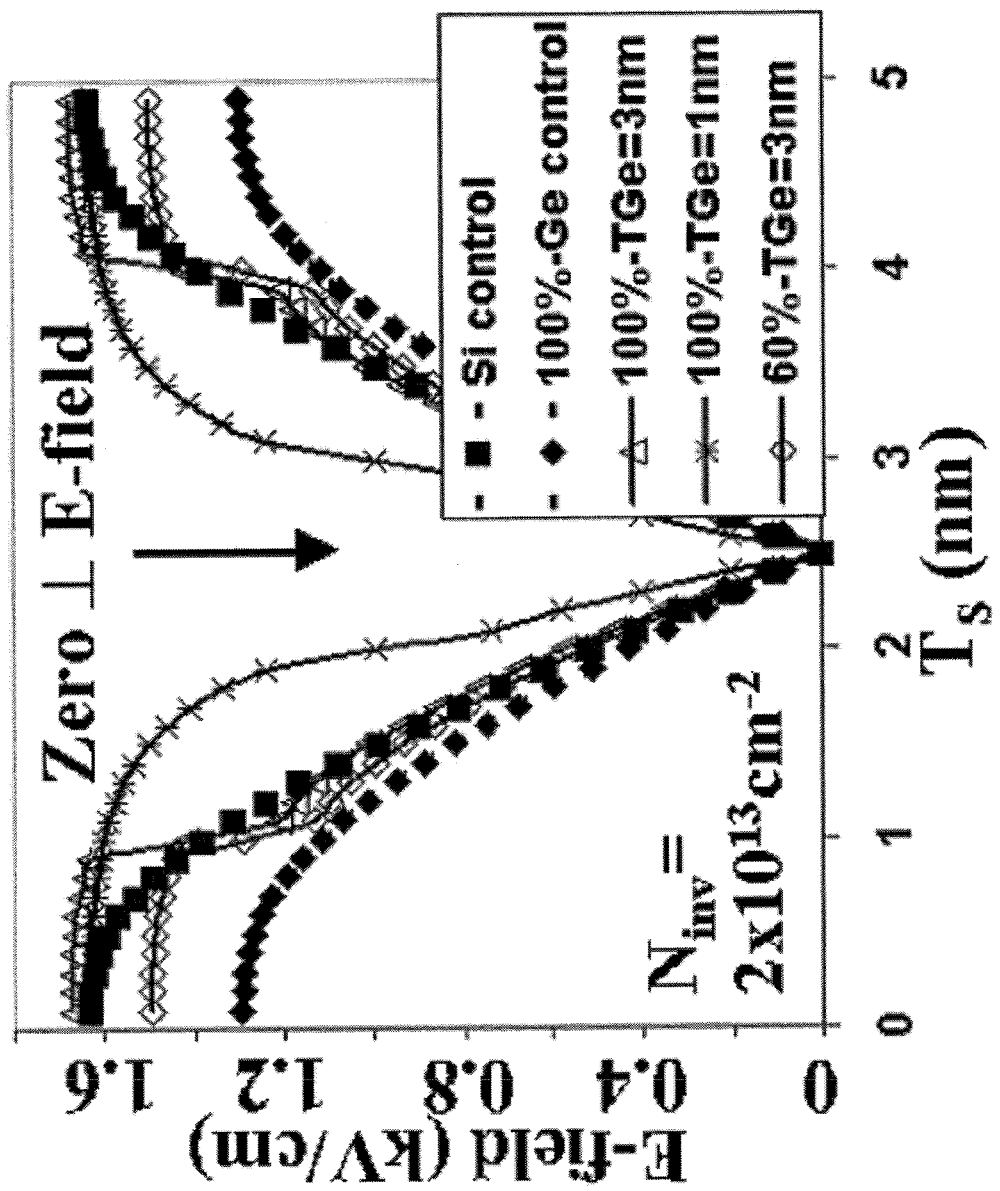
FIG. 33 shows the E-field through the perpendicular cross section of the device, according to an example embodiment of the present invention.

FIG. 31 shows the cross-sectional valence band profiles for three different DG heterostructure FETs in the ON state (NINV=2×10$^{13}$ cm$^{-2}$) compared with a control surface channel Si and surface channel strained Six Ge(1−x) with X=100%. The highest point in each of the valence bands are all nearly aligned to the Si due to the fact that all the charge is supplied by the Ge layer. In the case of the ultra-thin (UT) $T_{Ge}$=1 nm layer, the valence band is higher due to strong quantum confinement, which raises the lowest allowed energy level. The hole density in the ON state (NINV=2×10$^{13}$ cm$^{-2}$) is shown in FIG. 32. As seen from FIG. 32, because of the thin body (TS=5 nm) and lower E-fields in the DG FET, most of the carriers are confined towards the center of the device. However, in the case of the heterostructure, the confinement is greater and the effect grows stronger as the Ge percentage in the SiGe is increased and as the TGe is decreased. The E-field through the perpendicular cross section of the device is shown in FIG. 33. Due to the symmetry of the DG structure, the E-field rapidly falls-off to zero in the center of the channel. As the Ge concentration is increased and TGe is decreased, the carriers are strongly confined in the center of the channel where the E-field is close to zero.

Figure 34:
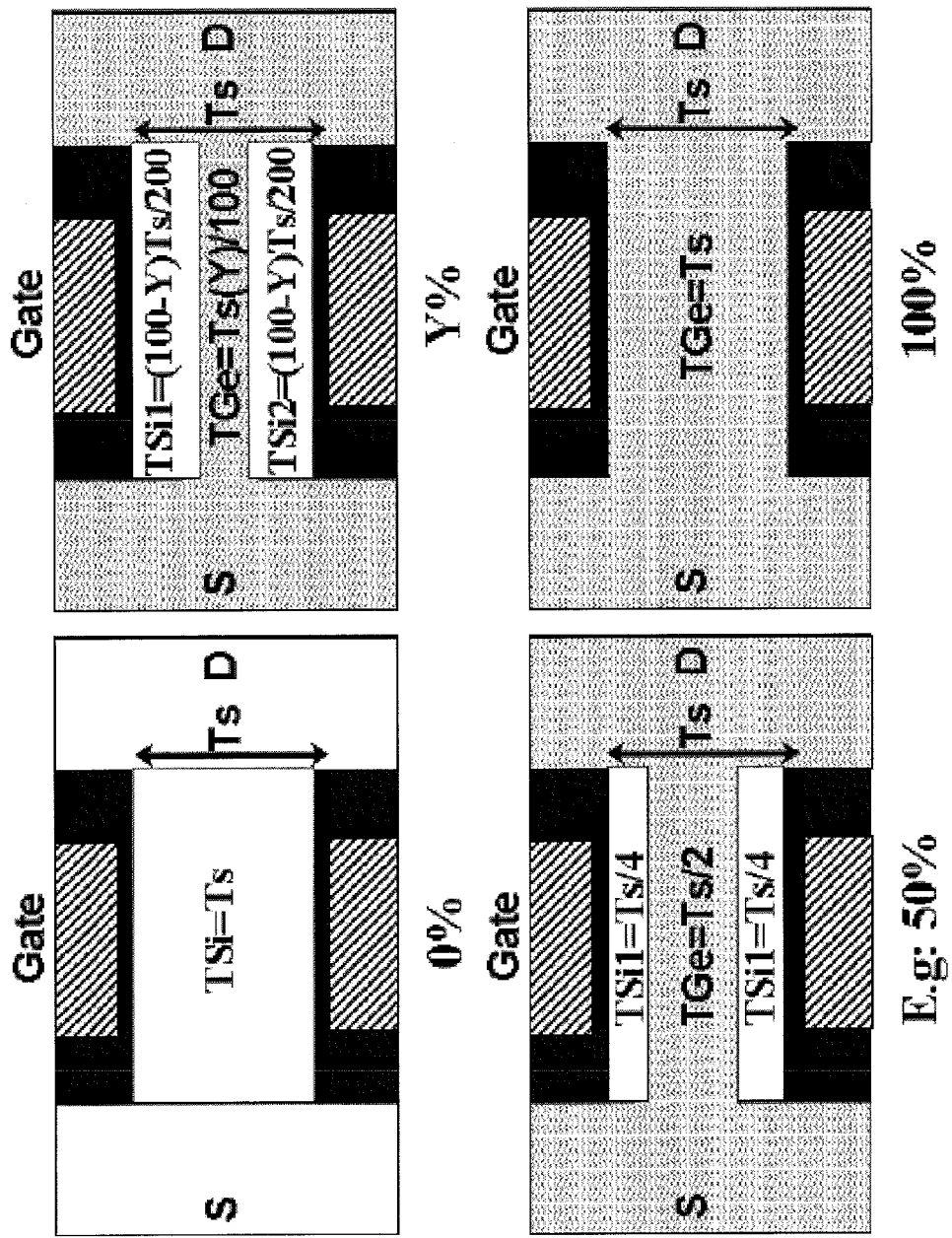
FIG. 34 represents simulations results, for a given $T_S$ and $L_G$, where $T_{Ge}/T_S$ goes from 0% (surface channel Si) to 100% (surface channel Ge), according to an example embodiment of the present invention.

A possible concern with heterostructure FETs is the reduced electrostatic control due to the channel being farther away from the gate insulator interface. Short channel effects affect the device performance and may be evaluated accurately. To accurately capture and benchmark the short channel effects for the heterostructure DG FET, simulations were performed varying $T_{Si}$, $T_{Ge}$, $L_G$ and $T_S$. The simulation space can be understood from FIG. 34. As shown in the FIG. 34, for a given $T_S$ and $L_G$, several sets of simulations were performed, where $T_{Ge}/T_S$ goes from 0% (surface channel Si) to 100% (surface channel Ge). Using $T_S$ and $L_G$ as parameters, the Drain Induced Barrier Lowering (DIBL) is plotted in FIGS. 35 (a) and 35 (b) and Subthreshold Slope (SS) is plotted in FIGS. 36 (a) and 36 (b).

Figure 35A:
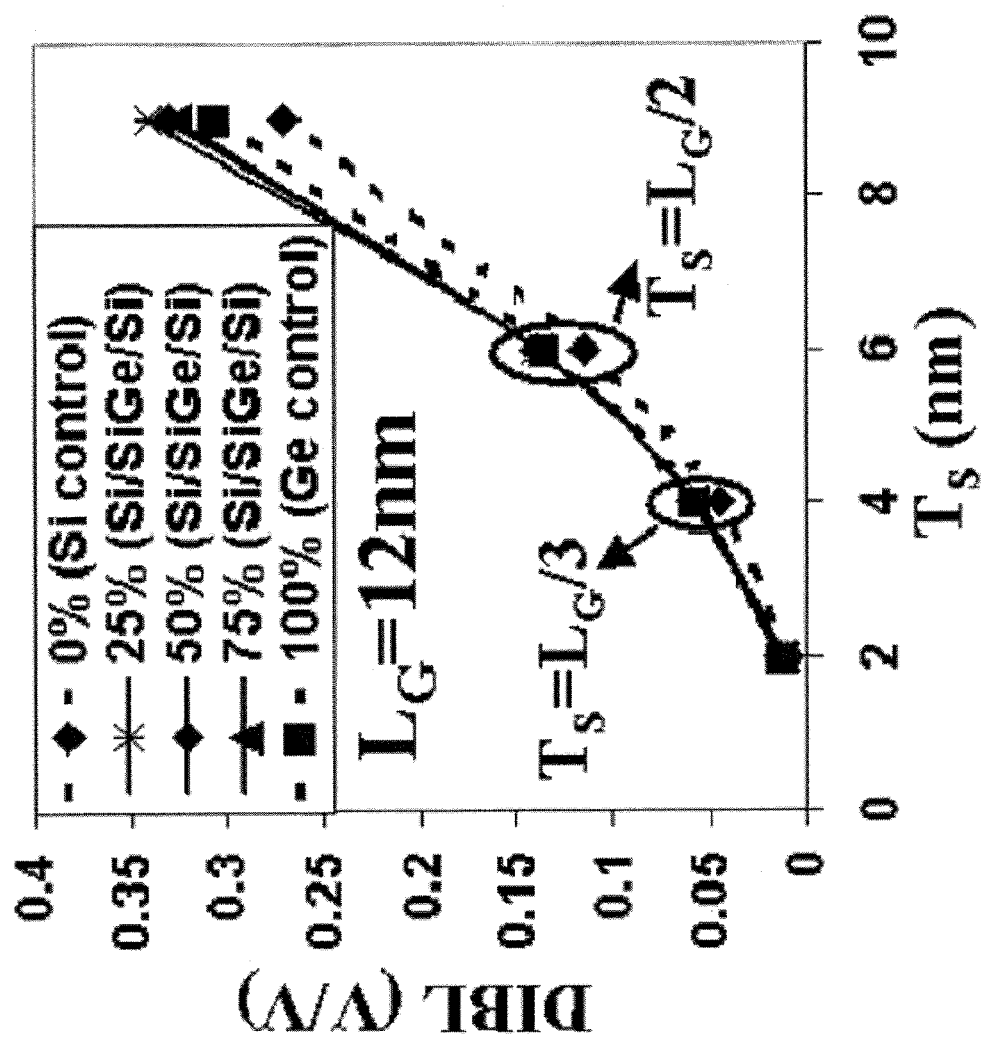
FIGS. 35 (a) and (b) are plots, using $T_S$ and $L_G$ as parameters, of the Drain Induced Barrier Lowering (DIBL), according to an example embodiment of the present invention.
Figure 35B:
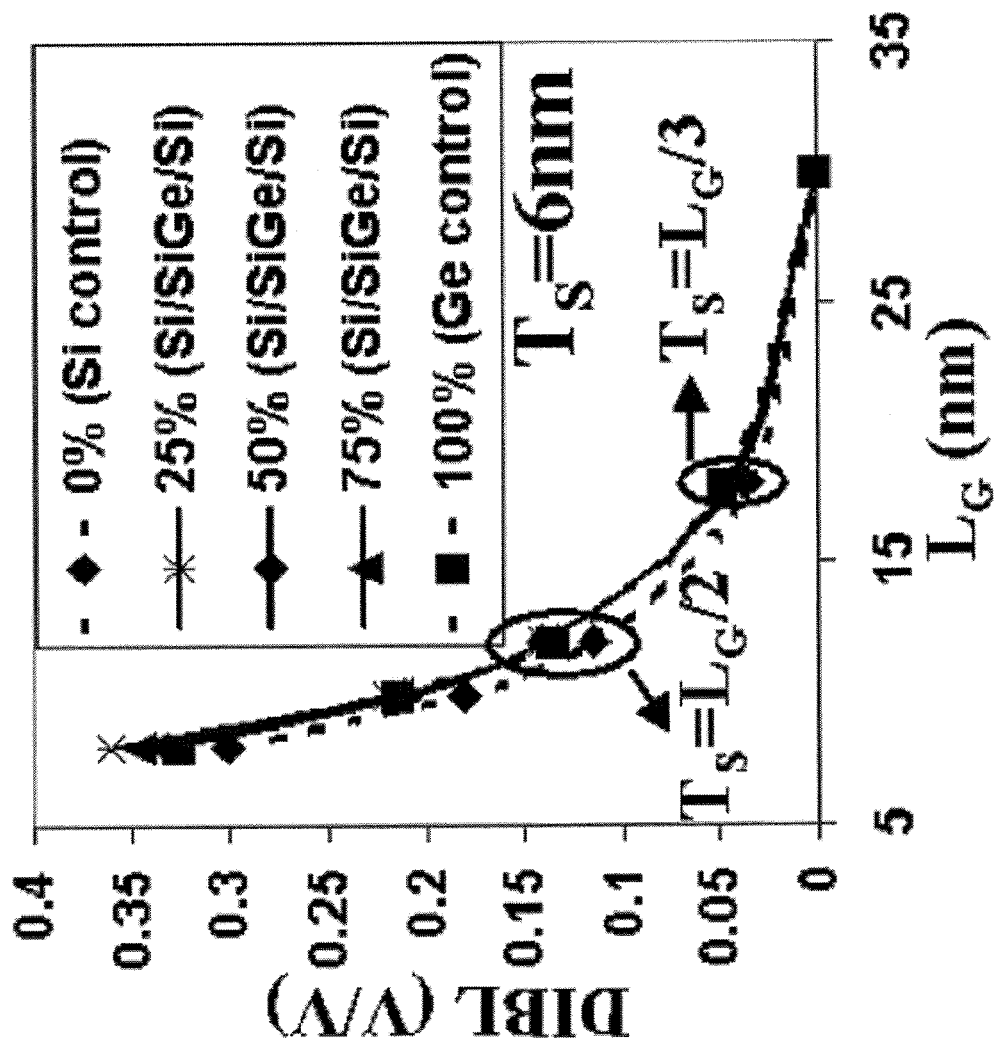
Figure 36A:
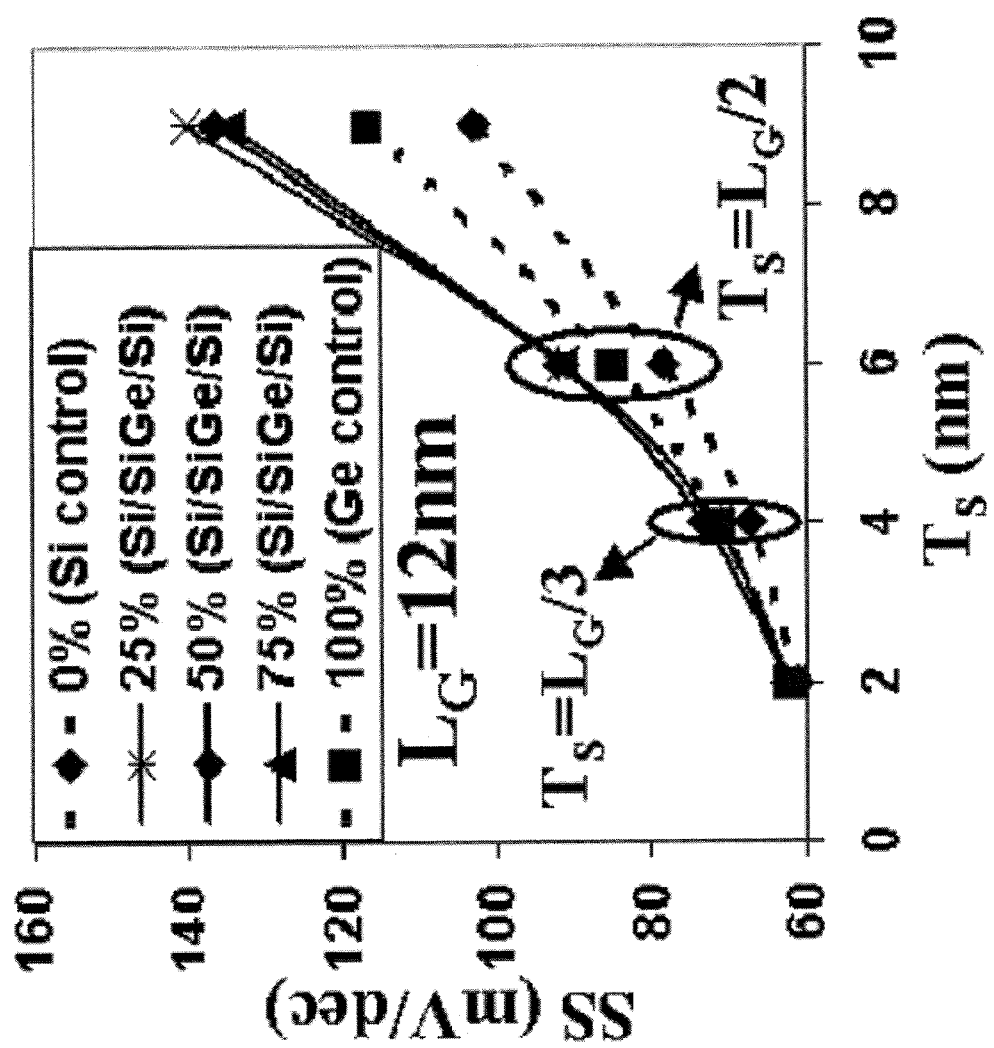
FIGS. 36(a) and (b) are plots of the Subthreshold Slope (SS), according to an example embodiment of the present invention.
Figure 36B:
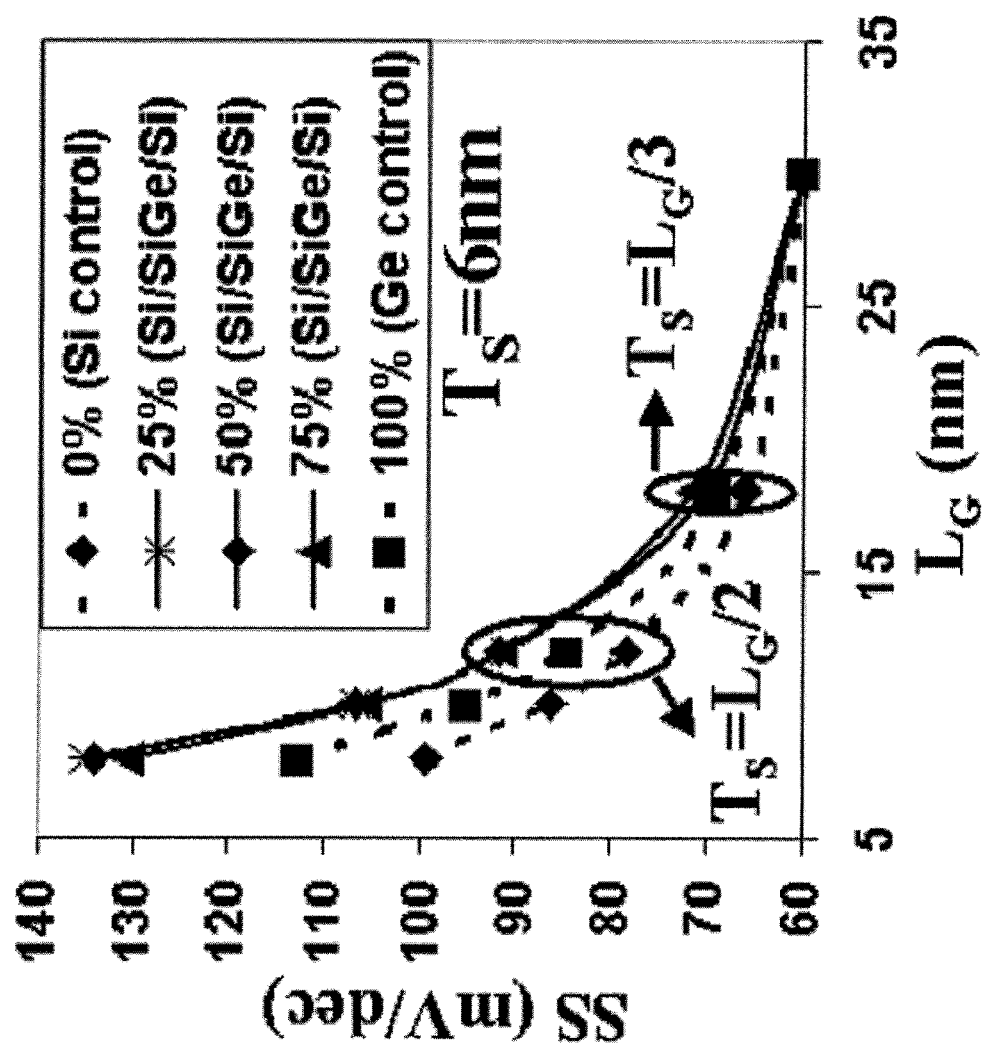

As seen from FIGS. 35 (a) and 35 (b), the DIBL is the best for the surface channel Si (0%). The surface channel Ge (100%) shows slightly worse DIBL due to its higher dielectric constant and the worst DIBL occurs in the device where $T_{Ge}/T_S$=25%, as the channel is the farthest from the gate for this device. However, the DIBL values for all the devices are excellent and comparable. Around the nominal operating point of $L_G$=$T_S$/2 to $T_S$/3, the DIBL is <20 mV higher than the surface channel Si and <10 mV compared to the surface channel Ge. The DIBL is around 5% worse for the worst case ($T_{Ge}$ 25%) device, meaning that its $L_G$ would have to be ~5% longer or $T_S$ 5% thinner to achieve the same electrostatic control as compared to the Ge surface channel (and 10% compared to the Si surface channel). From FIGS. 36 (a) and 36 (b), we find that the subthreshold slopes (SS) are also excellent. Around the operating point, for the worst case ($T_{Ge}$=25%) device, the SS is <15 mV higher than the Si surface channel and <10 mV compared to the Ge surface channel. Again the SS looks ~10% worse compared to the Si surface channel and only 5% worse compared to the Ge surface channel.

Figure 37:
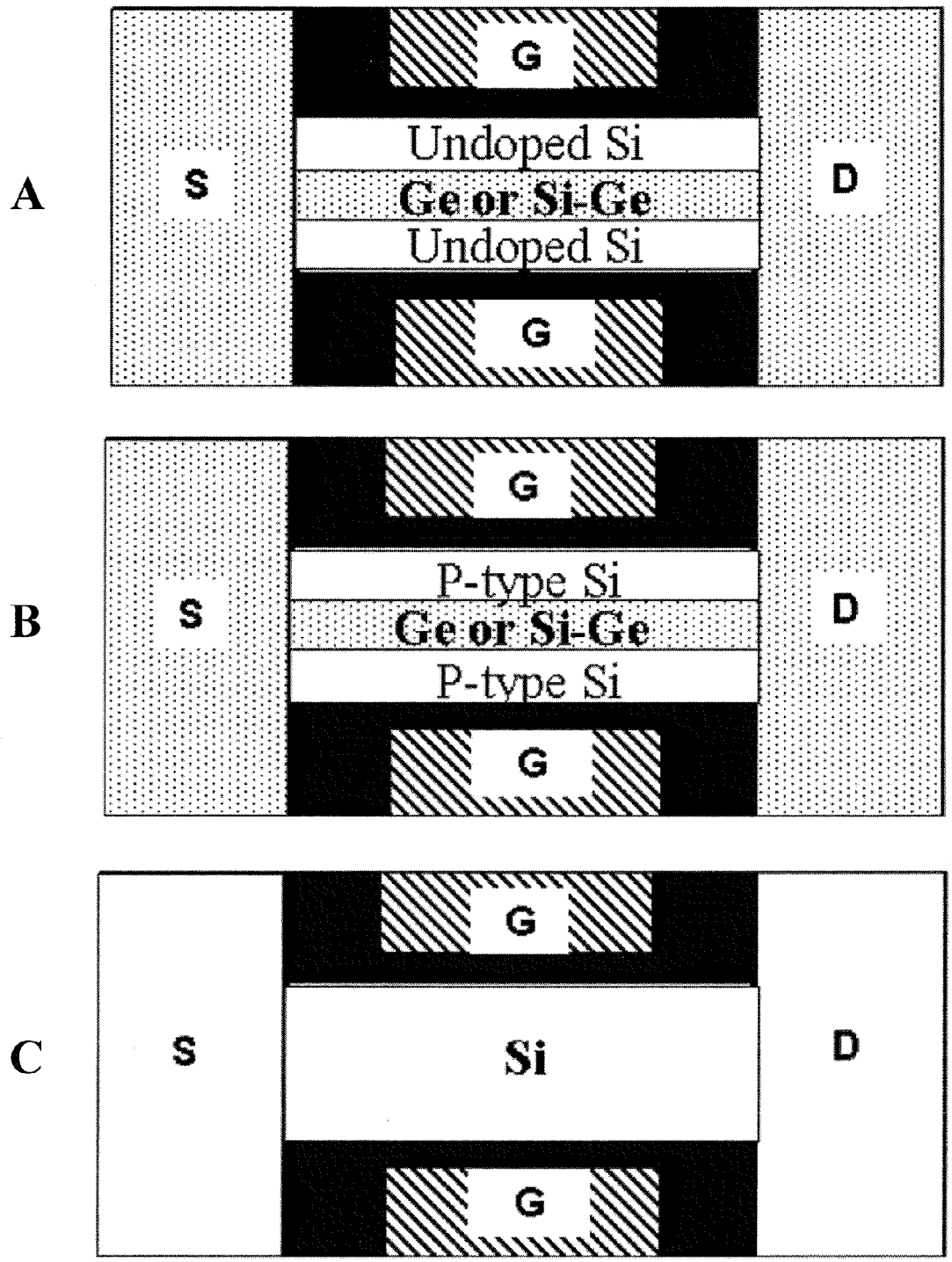
FIG. 37 shows device structures used in the simulations, according to an example embodiment of the present invention.
Figure 38:
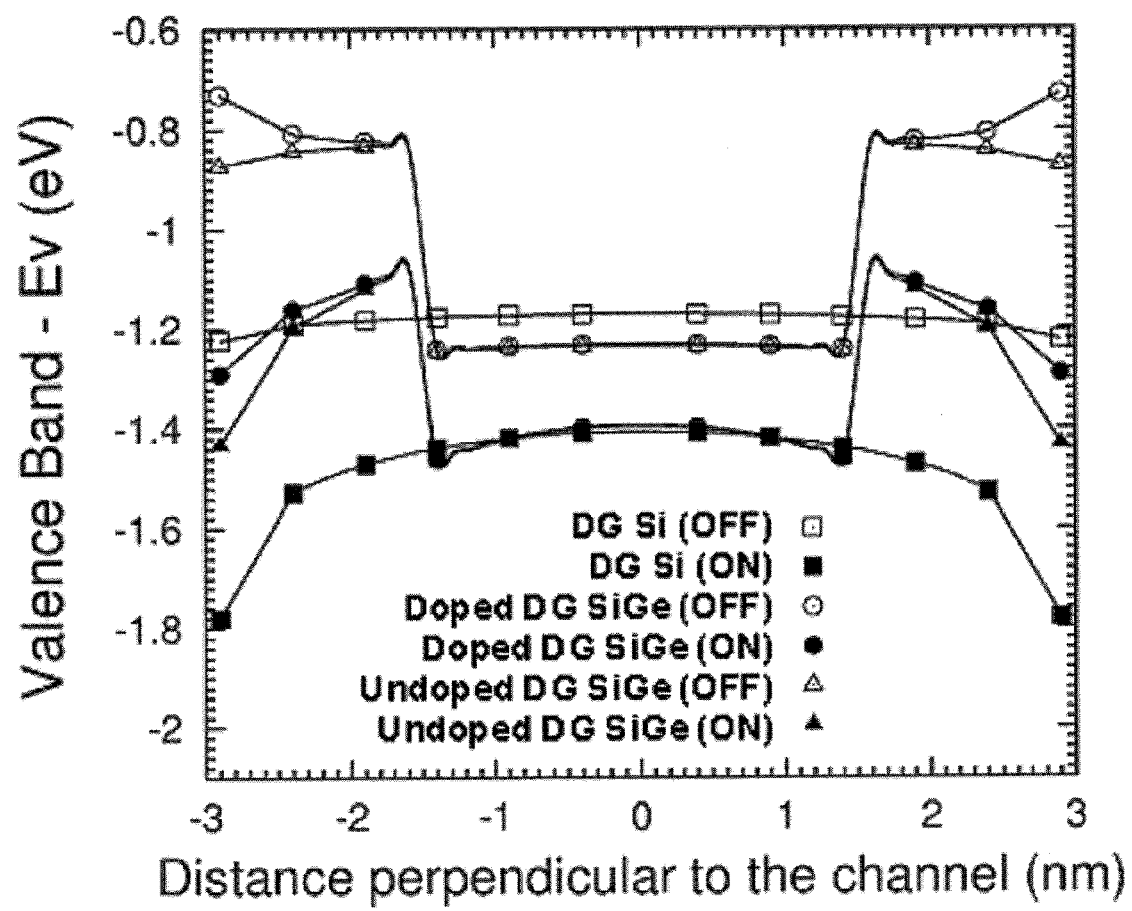
FIG. 38 shows the cross-sectional valence band profile of the device at OFF and ON, according to an example embodiment of the present invention.
Figure 39:
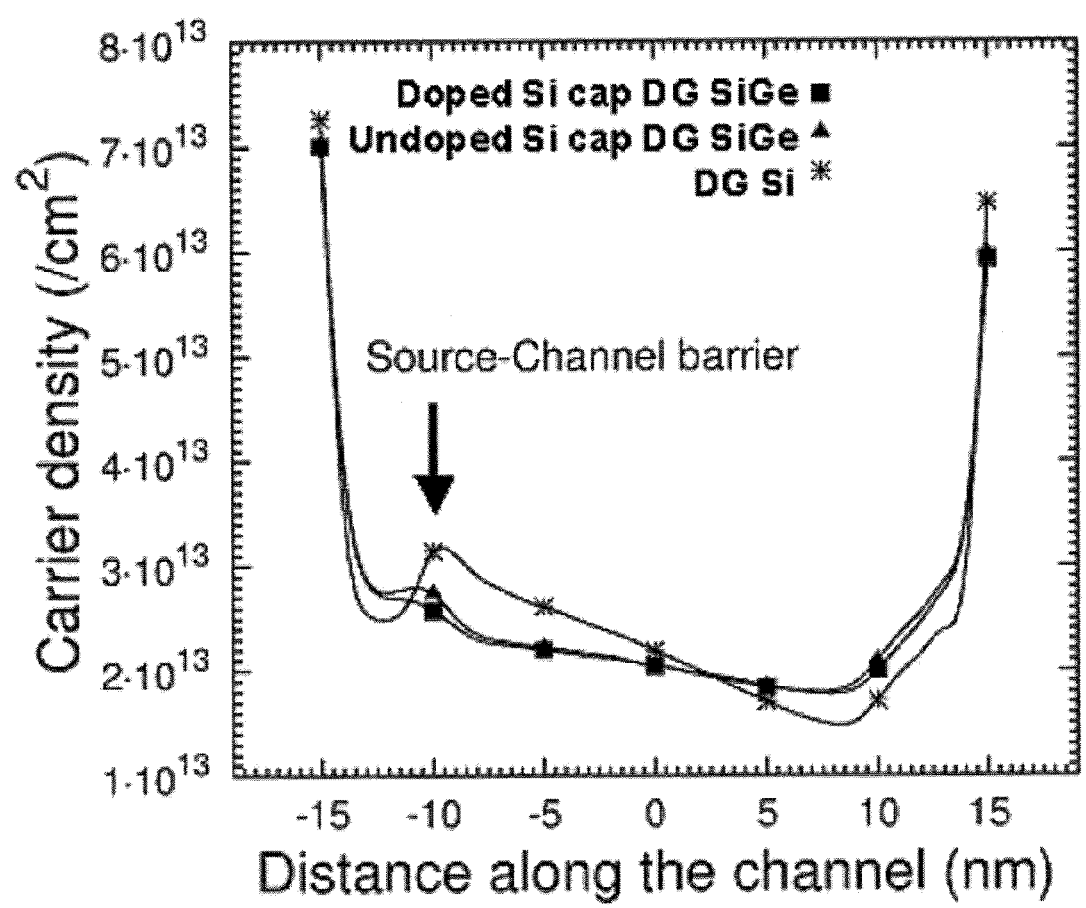
FIG. 39 shows carrier density with respect to the distance along the channel, according to an example embodiment of the present invention.
Figure 40:
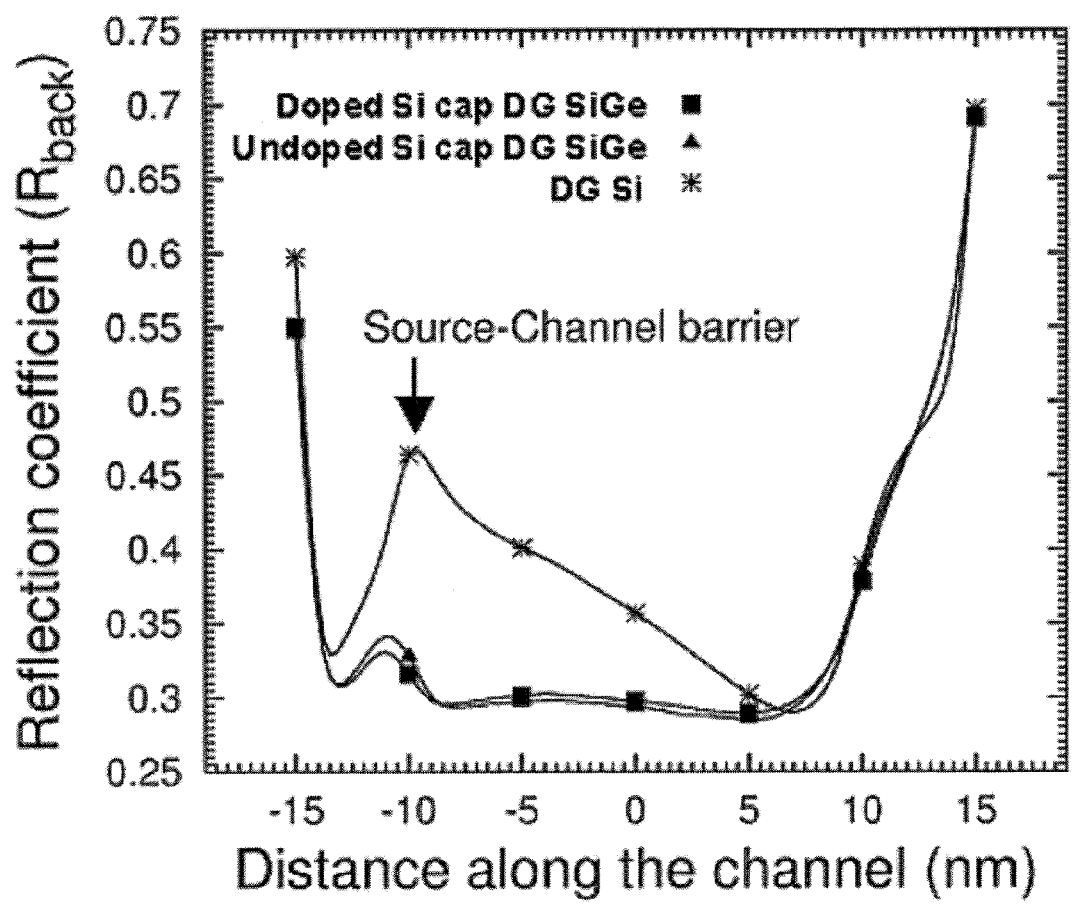
FIG. 40 shows the reflection coefficient or backscattering coefficient (RBACK) for the carriers with respect to the distance along the channel, according to an example embodiment of the present invention.
Figure 41:
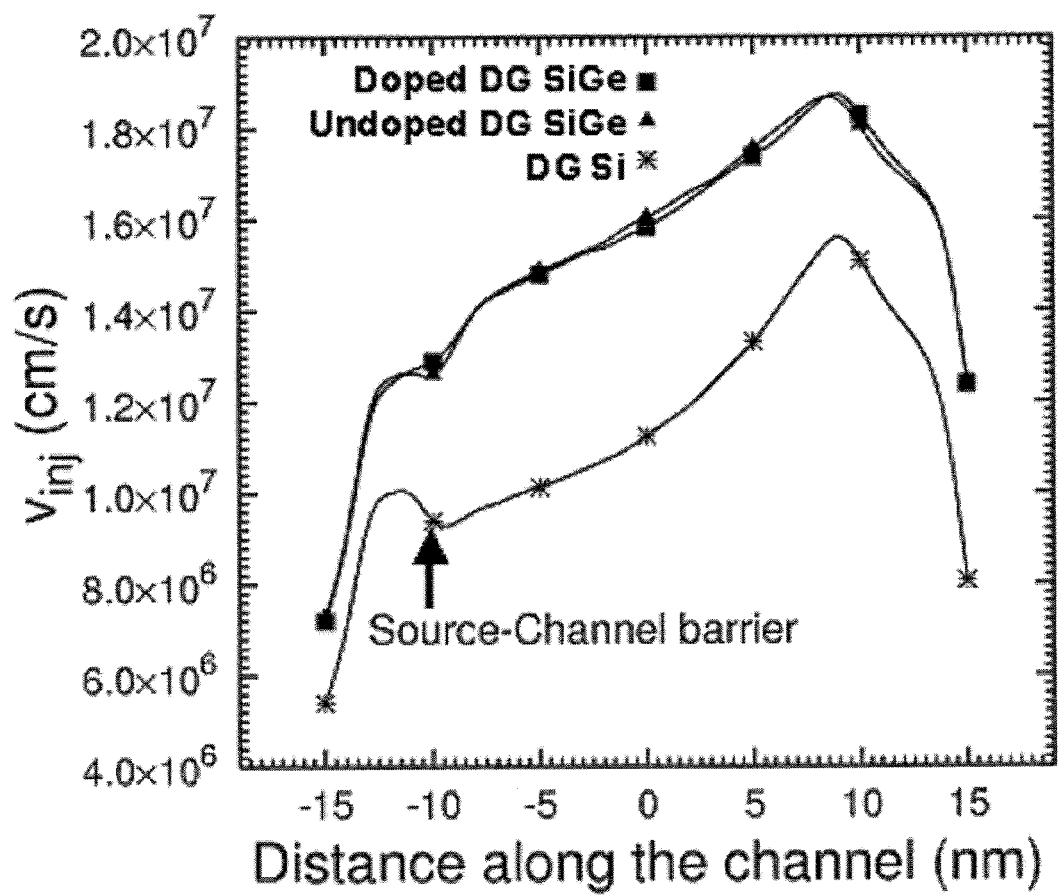
FIG. 41 shows the injection velocity for the heterostructure DGFETs with respect to the distance along the channel, according to an example embodiment of the present invention.
Figure 42:
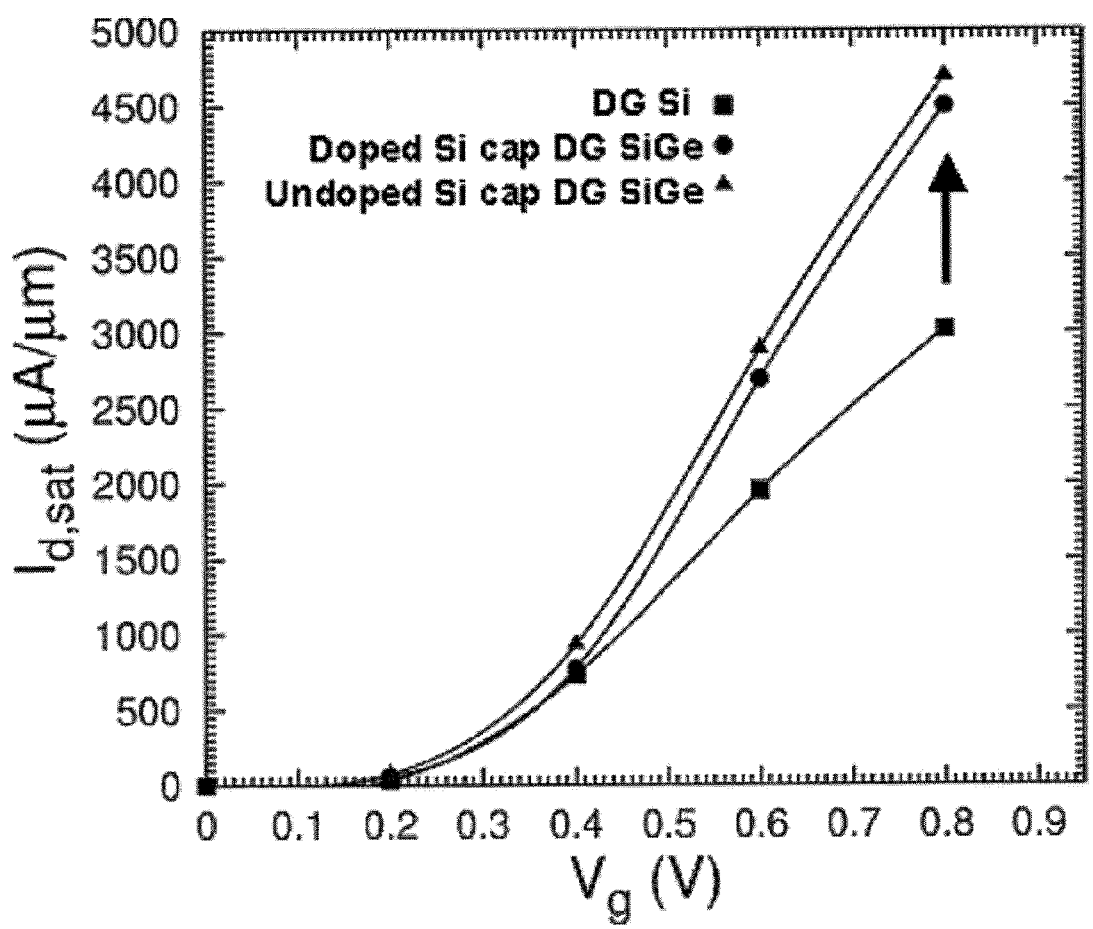
FIG. 42 shows drive currents relative to the gate voltage, according to an example embodiment of the present invention.
Figure 43:
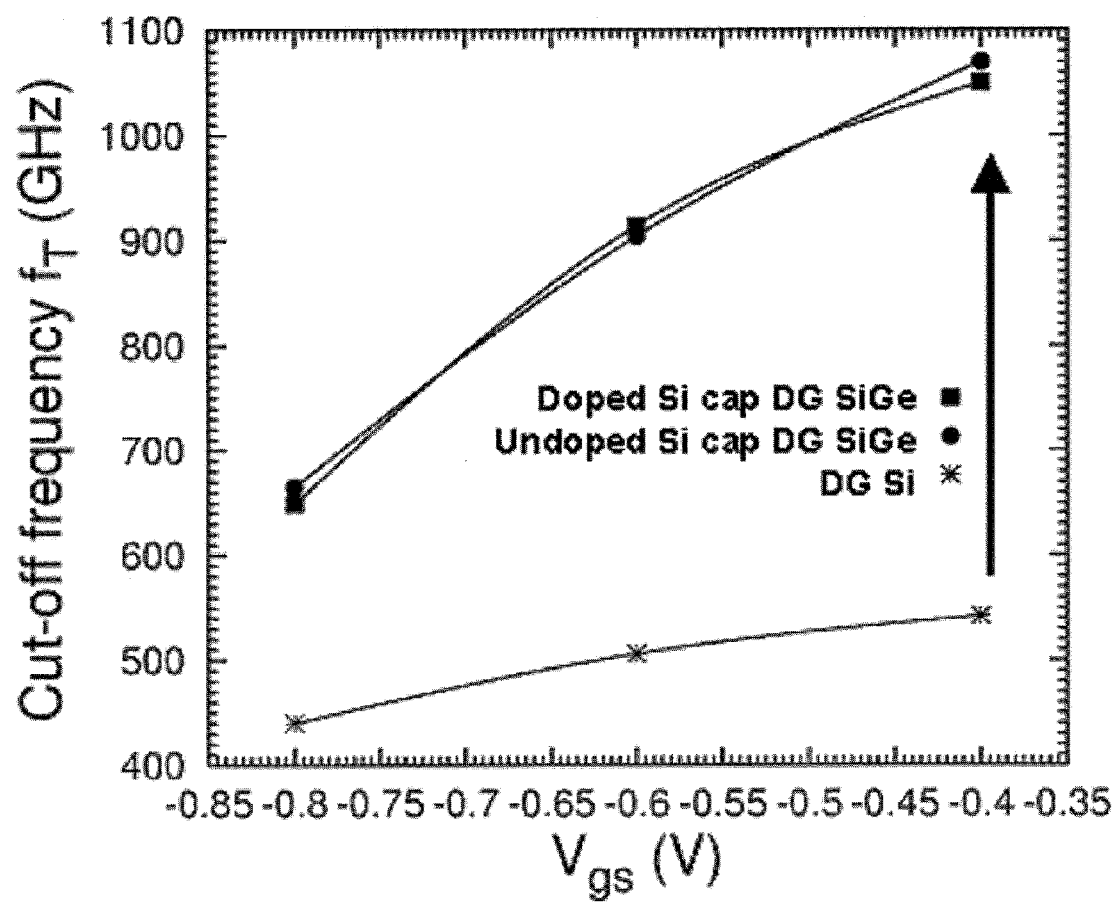
FIG. 43 shows cut-off frequencies relative to gate-source voltage, according to an example embodiment of the present invention.

Unlike a long channel device, in extremely scaled short channel devices the effectiveness of mobility in boosting the drive current drops. Full-Band Monte-Carlo simulations were used to accurately evaluate the transport properties of the heterostructure strained SiGe FET. The device structures used in the simulations are shown in FIGS. 37 (a), 37 (b) and 37 (c). Two types of heterostructure FETs were simulated. The first heterostructure had an undoped Si cap and the other had a cap doping of $5\times10^{19}$ cm$^{-3}$. Doping the Si cap makes the device function similar to a MOS gated HEMT, where the Si cap now supplies the inversion carriers. This results in the band bending in the Si being small and helps to confine the carriers into the high-mobility Ge layer. With the undoped FET it is possible that the carriers spill into the Si cap at high gate bias. To verify that the undoped FET does not suffer from this issue, the device is compared with the heterostructure FET and with the doped Si cap. FIG. 38 shows the cross-sectional valence band profile of the device at OFF and ON. As seen from the FIG. 38, the confinement due to the valence band offset is still stronger than the field by the gate, causing most of the carriers to remain in the high-mobility strained SiGe layer. As shown in FIG. 39, due to the fact that the carriers are farther away from the interface, the carrier density is lower in the DG heterostructure FETs than in the case of the surface channel FET. This also leads to a ~15% lower capacitance in the DG heterostructure FETs compared to the surface channel FET. FIG. 40 shows the reflection coefficient or backscattering coefficient (RBACK) for the carriers. As seen in the figure, due to its lower mobility and higher effective mass, the backscattering coefficient is 40% higher for the Si DGFET compared to the DG heterostructure FETs. FIG. 41 shows that the injection velocity for the heterostructure DGFETs is ~50% higher compared to the Si DGFET. Accordingly, the drive currents are nearly 50% higher for the heterostructure FETs than in the case of the conventional Si DGFET (FIG. 42). The lower capacitance can also result in lower dynamic power dissipation at higher switching speeds. Moreover, the higher transconductance combined with the lower capacitance may lead to a significantly higher cut-off frequency (fT) of nearly 1000 GHz compared to the Si device (FIG. 43).

While the present invention has been described above and in the claims that follow, those skilled in the art will recognize that many changes may be made thereto without departing from the spirit and scope of the present invention. Such changes may include, for example, interchanging materials, such as replacing Germanium or Silicon as discussed above with other materials and/or combining materials with the Germanium or Silicon. In addition, the channel regions and approaches described herein are selectively implemented with one or more of a variety of devices and/or systems, such as MOS-type devices or other electronic devices. Moreover, various approaches to manufacturing the devices and arrangements described herein are selectively implemented with common CMOS-type manufacturing approaches, as facilitated, for example, by a Silicon-tunneling mitigation layer. These and other approaches as described in the contemplated claims below characterize aspects of the present invention.

What is claimed is:

1. A semiconductor device exhibiting high channel mobility and low leakage, the device comprising:
   a channel region including
      a high-mobility strained-material layer, and
      a tunneling mitigation layer on the strained-material layer to mitigate tunnel leakage, the strained material layer having a lattice structure that is strained to match the lattice structure of the tunneling mitigation layer;
   an insulator layer on the tunneling mitigation layer;
   an electrode over the insulator to switch the device between conductive and nonconductive states; and
   wherein current transport in the ON state is predominantly a function of the mobility of the strained material layer, and wherein tunneling current in the OFF state is mitigated by the tunneling mitigation layer.

2. The device of claim 1, wherein the conductive state corresponds to an ON state of the device and the nonconductive state corresponds to an OFF state.

3. The device of claim 1, wherein the tunneling mitigation layer is Silicon and wherein the strained material is strained Germanium having an atomic spacing that matches the atomic spacing of the Silicon layer.

4. The device of claim 1, wherein the tunneling mitigation layer is a Silicon layer having a thickness of between about 4-6 nm, and wherein the strained material layer is a strained Germanium layer having a thickness of about 2 nm.

5. The device of claim 1, wherein the strained material layer is on a relaxed Silicon substrate.

6. The device of claim 1, wherein the tunneling mitigation layer mitigates tunneling current in the strained material layer by lowering the E-field in the strained material layer.

7. The device of claim 1, wherein the tunneling mitigation layer has a thickness sufficiently large to mitigate tunneling current in the strained material layer and sufficiently small such that it does not substantially affect carrier mobility in the strained material layer.

8. The device of claim 1, wherein the strained material layer has a thickness sufficiently large to facilitate a desirable carrier mobility and sufficiently small to mitigate the formation of defects therein.

9. A CMOS-compatible MOSFET exhibiting high channel mobility and low leakage, the MOSFET comprising:
- an active channel region having strained Germanium with a lattice structure that matches the lattice structure of Silicon;
- a thin Silicon layer on the strained semiconductor active region to mitigate leakage current;
- an insulator layer on the thin Silicon substrate layer;
- source and drain electrodes coupled via the channel regions; and
- a gate electrode on the insulator and adapted to apply a voltage bias to the active region to switch the device between ON and OFF states to flow current between the source and drain electrodes.

10. A semiconductor device comprising:
- a channel region including a buffer layer on a high-mobility layer, the buffer layer having a different composition than the high-mobility layer, the lattice structures of the buffer layer and the high-mobility layer being matched;
- an insulator layer on the buffer layer; and
- an electrode over the insulator and adapted to apply a voltage bias to the channel region to switch the device between conductive and nonconductive states.

11. The device of claim 10, wherein the conductive state corresponds to an ON state of the device and the nonconductive state corresponds to an OFF state.

12. The device of claim 10, wherein at least one of the high-mobility layer and the buffer layer is strained to match the lattice structure of the other one of the high-mobility layer and the buffer layer.

13. The device of claim 10, wherein both of the high-mobility layer and the buffer layer are strained to exhibit matching lattice structures.

14. The device of claim 10, wherein the buffer layer mitigates carrier scattering in the high-mobility layer by decoupling carriers from the insulator layer.

* * * * *